(12) United States Patent
Tripathi et al.

(10) Patent No.: US 10,850,974 B2
(45) Date of Patent: Dec. 1, 2020

(54) MICROELECTROMECHANICAL SYSTEMS (MEMS) AND METHODS

(71) Applicant: The University of Western Australia, Crawley (AU)

(72) Inventors: Dhirendra Tripathi, Crawley (AU); Dilusha Silva, Crawley (AU); Lorenzo Faraone, Crawley (AU); John Marcel Dell, Crawley (AU); Jarek Antoszewski, Crawley (AU); Mariusz Martyniuk, Crawley (AU)

(73) Assignee: THE UNIVERSITY OF WESTERN AUSTRALIA, Crawley (AU)

( * ) Notice: Subject to any disclaimer, the term of this patent is extended or adjusted under 35 U.S.C. 154(b) by 319 days.

(21) Appl. No.: 15/571,790

(22) PCT Filed: May 5, 2016

(86) PCT No.: PCT/AU2016/050326
§ 371 (c)(1),
(2) Date: Jan. 17, 2018

(87) PCT Pub. No.: WO2016/176735
PCT Pub. Date: Nov. 10, 2016

(65) Prior Publication Data
US 2018/0162724 A1    Jun. 14, 2018

(30) Foreign Application Priority Data
May 5, 2015    (AU) .................................. 2015901600

(51) Int. Cl.
*G02B 5/08*    (2006.01)
*B81C 1/00*    (2006.01)
(Continued)

(52) U.S. Cl.
CPC ............ *B81C 1/00158* (2013.01); *B81B 7/02* (2013.01); *G02B 26/001* (2013.01); *G02B 26/0833* (2013.01); *B81B 2201/047* (2013.01)

(58) Field of Classification Search
CPC .............. B81C 1/00158; G02B 26/001; G02B 26/0833; B81B 7/02; B81B 2201/047
(Continued)

(56) References Cited

U.S. PATENT DOCUMENTS 6,438,419 B1    8/2002    Tayebati et al.
7,116,463 B2    10/2006   Wu et al.
(Continued)

OTHER PUBLICATIONS

Supplementary Partial Search Report dated Nov. 16, 2018 issued in the corresponding European Patent Application No. 16788961.7, pp. 1-13.
(Continued)

*Primary Examiner* — Euncha P Cherry
(74) *Attorney, Agent, or Firm* — Polsinelli PC

(57) ABSTRACT

The present disclosure relates to a method of fabricating a reflector, the reflector being at least partially reflective and at least partially transmissive for at least a wavelength of electromagnetic radiation; the method comprising:
  forming a first material layer defining a bottom layer;
  forming a sacrificial layer on the bottom layer;
  forming a second material layer defining a top layer on the sacrificial layer and a supporting structure connected to the bottom layer; and
  removing at least part of the sacrificial layer to form a cavity between the bottom layer and the top layer such that the supporting structure supports the top layer relative to the bottom layer and no further supporting structure is provided within the cavity,
(Continued)

wherein after the at least part of the sacrificial layer is removed, at least the top layer has residual tensile stress.

14 Claims, 19 Drawing Sheets

(51) Int. Cl.
  *G02B 26/08*    (2006.01)
  *G02B 26/00*    (2006.01)
  *B81B 7/02*     (2006.01)
(58) Field of Classification Search
  USPC .......................................................... 359/848
  See application file for complete search history.

(56) References Cited

U.S. PATENT DOCUMENTS

| | | | |
|---|---|---|---|
| 2002/0008876 A1* | 1/2002 | Terui ..................... | G01S 7/4813 356/445 |
| 2002/0008922 A1* | 1/2002 | Conant ............... | B81C 1/00182 359/871 |
| 2004/0004592 A1 | 1/2004 | Ikeda et al. | |
| 2004/0222418 A1 | 11/2004 | Mochizuki | |
| 2009/0151455 A1 | 6/2009 | Wu et al. | |
| 2009/0213450 A1 | 8/2009 | Sampsell | |
| 2009/0303570 A1* | 12/2009 | Faraone ............... | G02B 26/001 359/290 |
| 2010/0046058 A1 | 2/2010 | Wang et al. | |

OTHER PUBLICATIONS

P. Hauff, "An overview of VIS-NIR-SWIR field spectroscopy as applied to precious metals exploration", Spectral International Inc., Arvada CO, 2002.
Kinoshita et al., "Strategies for soil quality assessment using visible and near-infrared reflectance spectroscopy in a Western Kenya chronosequence", Soil Science Society of America Journal, 76:1776-1788, Soil Science Society of America, Madision WI, 2012.
R. A. Crocombe, "Miniature optical spectrometers: There's plenty of room at the bottom". Spectroscopy, Iselin, NJ, 2008.
Dell et al., "Microelectromechancial systems-based microspectrometers covering wavelengths from 1500nm to 5000nm", pp. 6765OL-1-6765OL-9. SPIE, Bellingham, WA, 2007.
Milne et al., "Widely tunable MEMS—based Fabry-Perot filter". IEEE J. MEMS, 18:905-913, New Yok, 2009.
Keating et al., "Design and characterization of Fabry-Perot MEMS—based shortwave infrared microspectrometers". IEEE J. Electron. Mat, 37(12):1811-1820, New York, 2008.
Maheswaran et al., "Analysis of pull-in behavior of electrostatic MEMS actuators for optical switching applications", Journal of Applied Sciences, 12(16):1730-1733, Pakistan, 2012.
Saadany et al., "Electrostatically-tuned optical filter based on silicon bragg reflectors". pp. 1811-1820. IEEE, New York, 2006.
Ebermann et al., "Design, operation and performance of a Fabry-Perot based MWIR microspectrometer", IEEE, New York, 2006.
E. D. Palik, editor, "Handbook of optical constants of solids". Academic Press, USA, 1998.
Germanium: Band structure and carrier concentration www.ioffe.ru/SVA/NSM/Semicond/Ge/bandstr.html.
Silicon: Band structure and carrier concentration www.ioffe.rssi.ru/SVA/NSM/Semicond/Si/bandstr.html.
C. Hamaguchi, Energy band structures of semiconductors, in "Basic Semiconductor Physics", pp. 1-27. Springer Berlin, 2010.
Datta et al., "Design of MEMS—tunable novel monolithic optical filters in InP with horizontal bragg mirrors". Solid-State Electronics, pp. 1959-1963, Elsevier Ltd, 2004.

Spisser et al., "Highly Selective and Widely Tunable 1.55-µm InP/Air-Gap Micromachined Fabry-Perot Filter for Optical Communications", IEEE Photonics Technology Letters, 10(9):1259-1261, New York, 1998.
Daleiden et al, "Tunable InP/air gap fabry perot filter for wavelength division multiplex fiber optical transmission". In 1999 Eleventh International Conference on Indium Phosphide and Related Materials, 1999, pp. 285-287, IEEE, New York, 1999.
Kusserow et al., "Micromachining of InP/InGaAs multiple membranelairgap structures for tunable optical devices", Proc. SPIE 6993, MEMS, MOEMS, and Micromachining III, vol. 6993, pp. 69930B-69930B-11. SPIE, Bellingham, WA 2008.
Riemenschneider et al., "Low-cost electrothermally tunable optical microcavities based on GaAs". IEEE Photonics Technology Letters, 14(11):1566-1568, New York, 2002.
Irmer et al., "Surface micromachined optical low-cost all-air-gap filters based on stress-optimized Si3N4 layers", Journal of Micromechanics and Microengineering, 15(4):867, IOP Publishing, UK, 2005.
Lipson et al.,"A 1-D photonic band gap tunable optical filter in (110) silicon", Journal of Microelectromechanical Systems, 16(3):521-527, IEEE, New York, 2007.
French et al., "Surface versus bulk micromachining: the contest for suitable applications" Journal of Micromechanics and Microengineering, 8(2):45, IOP Publishing, UK, 1998.
Tuohiniemi et al., "Surface-micromachined silicon air-gap bragg reflector for thermal infrared". Journal of Micromechanics and Microengineering, 21(7):075014, IOP Publishing, UK, 2011.
Tuohiniemi et al., "Optical transmission performance of a surfacemicromachined FabryPerot interferometer for thermal infrared", Journal of Micromechanics and Microengineering, 22(11):115004, IOP Publishing, UK 2012.
Bosch et al., "A general-purpose software for optical characterization of thin films: specific features for microelectronic applications", Solid-State Electronics, 45:703-709, Pergamon Press, UK, 2001.
Guckel et al., "Diagnostic microstructures for the measurement of intrinsic strain in thin films". J. Micromech. and Microeng., 2:86-95, IOP Publishing, UK, 1992.
Feng et al., "On the stoney formula for a thin film/substrate system with non-uniform substrate thickness". J. Appl. Mech., 74:1276-81, ASME, New York, 2007.
Martyniuk et al., "Stress in low-temperature plasma enhanced chemical vapour deposited silicon nitride thin film", Smart Materials and Structures, 15:529-538, IOP Publishing, UK, 2006.
Guckel et al., "Fine-grained polysilicon films with built-in tensile strain", IEEE Transactions on Electron Devices, 35 (6):800-801, IEEE, New York, 1988.
H. A. MacLeod. Thin-Film Optical Filters. McGraw-Hill,New York, 1989.
Goldberg et al., "Large-format and multispectral QWIP infrared focal plane arrays", Infrared Technology and Applications XXIX, pp. 83-94, SPIE, Bellingham, WA 2003.
Zhang et al., "Automated detection of chemical vapors by pattern recognition analysis of passive multispectral infrared remote sensing imaging data," Applied Spectrosccopy, vol. 56, No. 8, pp. 1082-1093, SAS, Frederick MD 2002.
Teggi et al., "Evaluation of SO2 emission from Mount Etna using diurnal and nocturnal multispectral IR and visible imaging spectrometer thermal IR remote sensing images and radiative transfer models", Journal of Geophysical Research, vol. 104, No. B9, pp. 20 069-20 079,American Geophysical Union, Washington D.C., 1999.
Wabomba et al., "Remote detection of volatile organic compounds by passive multispectral infrared imaging measurements," Applied. Spectroscopy., vol. 61, No. 4, pp. 349-358, SAS, Frederick MD, 2007.
Kahle et al., "Mineralogic information from a new airborne thermal infrared multispectral scanner," Science, vol. 222, No. 4619, pp. 24-27, AAAS, Washington D.C., 1983.
Vaughan et al., "Surface mineral mapping at Steamboat Springs, Nevada, USA, with multi-wavelength thermal infrared images," Remote Sensing of Environment, vol. 99, No. 12, pp. 140-158, Elsevier Ltd, 2005.

(56) References Cited

OTHER PUBLICATIONS

Clodius et al., "Validation of the MTI water surface temperature retrieval algorithms", in Geoscience and Remote Sensing Symposium, 2002. IGARSS '02, vol. 1, 2002, pp. 30-32, IEEE International, 2002.

Rodger et al., "The performance of the multispectral thermal imager (MTI) surface temperature retrieval algorithm at three sites", IEEE Transactions on Geoscience and Remote Sensing, vol. 43, No. 3, pp. 658-665, IEEE 2005.

J. M. Vaughan, "The Fabry-Perot Interferometer". Taylor Francis, New York, 1989.

Ebermann et al., "Tiny mid and long-wave infrared spectrometer module with a MEMS dual-band fabry-perot filter," in Sensor+Test Conference, 2011. Proceedings IRS, pp. 94-99, AMA Service GmbH, Germany, 2011.

Meinig et al., "Dual-band mems fabry-perot filter with two movable reflectors for mid- and long-wave infrared microspectrometers", in Solid-State Sensors, Actuators and Microsystems Conference (Transducers), 2011 16th International, pp. 2538-2541, IEEE New York, 2011.

Stupar et al., "MEMS tunable fabry-perot filters with thick, two sided optical coatings", in Solid-State Sensors, Actuators and Microsystems Conference, 2009. Transducers 2009, pp. 1357-1360, IEEE New York, 2009.

G. J. Sloggett, "Fringe broadening in fabry-perot interferometers," Applied Optics, vol. 23, No. 14, pp. 2427-2432, The Optical Society, Washington D.C., 1984.

Wang et al., "Step-wise tunable microbolometer long-wavelength infrared filter," in Transducers 2005-2005 International Solid-State Sensors and Actuators Conference, vol. 1, pp. 1006-1009, IEEE New York, 2005.

Mao et al., "Towards longwave infrared tuneable filters for multispectral thermal imaging applications".12th International conference on quantitative infrared thermography, 2014.

Mao et al., "Ge/ZnS-Based Micromachined Fabry-Perot Filters for Optical MEMS in the Longwave Infrared", IEEE Journal of Microelectromechanical Systems, 24(6), 2109-2116, IEEE, New York, Sep. 10, 2015.

E. Garmire, "Theory of quarter-wave-stack dielectric mirrors used in a thin fabry-perot filter," Applied Optics, vol. 42, No. 27, pp. 5442-5449, The Optical Society, Washington D.C., 2003.

W. Lau, "Infrared characterization for microelectronics", World Scientific Publishing Co. Pte. Ltd, Singapore 1999.

Mao et al., "Preliminary investigation on MEMS-based cooled long-wave infrared Fabry-Perot filters for multi-spectral imaging", vol. 1. International Conference on Nanoscience and Nanotechnology (ICONN 2012), Perth, Western Australia, 2012.

Roychoudhuri et al., "Stable multipass fabry-perot interferometer: design and analysis," Applied Optics, vol. 16, No. 9, pp. 2514-2520, The Optical Society, Washington D.C., 1977.

Keating et al., "Design and characterization of Fabry-Perot MEMS-based short-wave infrared microspectrometers," Journal of Electronic Materials, vol. 37, No. 12, pp. 1811-1820, Springer, Germany, 2008.

* cited by examiner

MICROELECTROMECHANICAL SYSTEMS (MEMS) AND METHODS

FIELD OF THE INVENTION

The present invention relates generally to a method of fabricating a microelectromechanical system (MEMS), or part thereof, and a MEMS or part thereof fabricated by the method.

Although the present invention will be described with particular reference to fabricating reflectors, filters, and actuators for optical MEMS applications, it will be appreciated that it may be used in respect of fabricating other MEMS or parts thereof for other applications.

BACKGROUND ART

Spectroscopic imaging systems, capable of capturing the spectrum and/or the multispectral image of a scene or an object over multiple discrete wavelength bands of interest from the visible (400-700 nm) to longwave infrared (LWIR, 8-12 µm) spectrum range are capable of extracting spectral signatures, to provide enhanced detection and discrimination of targets in clutter over broadband systems.

Infrared spectroscopy has shown great promise in a multitude of applications from the near infrared to the long wave infrared wavelengths. For example, the utility of LWIR multispectral imaging systems is well established in a wide variety of defense and civilian applications ranging from buried landmines detection [31], chemical gas and volatile organic compounds diagnostics [32-34], mineral mapping [35], [6] and global atmospheric temperature profiles monitoring [37], [38].

However, limitations including high cost, size, and vibration sensitivity of bench-top spectrometer instruments has hindered widespread application of the technology [1-3].

Typical multispectral imagers utilize a series of band-pass interference filters, inserted in a rotating wheel, to realize spectral selection, the bulk and cost of which have hindered widespread adoption of the technology. The incorporation of miniaturized Fabry-Perot interferometers with MEMS technology provides a path to the realization of compact and low-cost tunable filters.

Generally speaking, Fabry-Perot interferometers comprise two parallel mirrors (i.e. a "bottom" mirror and a "top" mirror) separated by an optical cavity. The transmission of such an interferometer is maximized at wavelengths of light that interfere constructively within the cavity, and falls off rapidly, creating a spectrally isolated transmission passband. Taking no account of phase changes on mirror reflection, the first-order transmission maximum occurs at a wavelength that is exactly double of the cavity length [39]. By altering the separation between the mirrors, which is done by MEMS actuators in micromachined devices, the transmission pass-band can be swept over a range of wavelengths, realizing a tunable optical filter. Important spectral parameters of the filter include its wavelength tuning range, peak transmission, full-width at half-maximum (FWHM), as well as out-of-band rejection (which is calculated as the ratio of the maximum transmission to the minimum transmission).

A number of MEMS-based tunable LWIR Fabry-Perot filters reported in the literature [40]-[42], with the use of multilayer dielectric mirrors to realize highly resonant structures, have demonstrated suitable spectral features (≥75% peak transmission, ≤200 nm FWHM and 8-10.5 µm tuning range) for use in multispectral imaging applications. A primary technical challenge for successful development of these filters is to balance the stresses in stack layers, as mirror bowing caused by stress gradient degrades optical performance of the filters [39], [43]. While process and material controls are used to modify the stress conditions in the layers for these filters, run-to-run variations may make it difficult to achieve an acceptable yield.

A tunable LWIR coupled-absorption filter has been reported [44], with the top mirror designed to be a single layer of a single material. Despite the fact that the demonstrated bandwidth of 1.5 µm only allows discrimination of coarse spectral features in the LWIR, the filter provides a good solution to minimize stress-induced mirror defects.

Recent advances by the inventors have demonstrated (developed and tested) successful release of a fixed-cavity transmission-type LWIR filter of single-layer top-mirror structure [45]. While this filter is theoretically predicted to have 80% peak transmission and 500 nm FWHM, capable of discriminating most of the spectral features seen in LWIR, the real filter shows a lower peak transmission of 40% and a broader spectral resolution of 1 µm, limited by the mirror bowing due to insufficient gradient stress compensation. Particularly, for the freely suspended single-layer Ge mirror of that filter, a very pronounced warping of approximate 1.5 µm was observed due to layer stress gradient. With the aid of a stress compensation layer, the deformation was alleviated but still far from optimal for achieving desirable optical characteristics.

A novel electromechanical design with two spring-suspended mirrors, has been reported [40], [41], demonstrating a maximum control voltage less than 50 V.

The inventors have also previously demonstrated a miniaturized tunable optical filter 12 technology used in a spectrometer (microspectrometer 10), depicted in FIGS. 1A and 1B, based on surface-micromachined MEMS [4-6]. By the inherent nature of MEMS, this tunable optical filter technology is mechanically robust, very small in size, and can potentially leverage high-volume manufacturing methods to deliver exceedingly low per-unit cost.

The microspectrometer 10 comprises a filter in the form of a tuneable MEMS Fabry-Perot optical filter 12 fabricated directly on an infrared detector 14. In addition to absorbing incident radiation thereon for detection purposes, the detector 14 functions as a material base layer/substrate supporting other components of the microspectrometer 10. The filter 12 has a pair of reflectors, one being a fixed dielectric first (or "bottom") mirror 16 and the other being a moveable dielectric second (or "top") mirror 18 suspended above the fixed bottom mirror 16. The bottom mirror 16 is disposed in fixed relationship with respect to the detector 14, whilst the top mirror 18 is disposed in opposed spaced relationship to the bottom mirror 16 to form a cavity 20 therebetween.

Both the bottom mirror 16 and the top mirror 18 are implemented as distributed Bragg reflectors, and comprise alternating layers of a material or medium of high refractive index, being germanium (Ge) in the implementation, and a material or medium of low refractive index, being silicon monoxide (SiO) in the implementation, each layer being a quarter of a wavelength in optical thickness in the implementation.

The top mirror 18 is formed on a moveable, flexible membrane 22 disposed in spaced relationship to the detector 14. Particularly, the membrane 22 is suspended relative to the detector 14 by a support structure 24, comprising four suspension arms 26 arranged in a square shaped formation about the periphery of the top mirror 18 and disposed in opposing, spaced relationship to the detector 14 by suspension supports in the form of posts 28 extending at one end from the substrate and providing anchors for the suspension arms 26 at the other end thereof.

The suspension arms 26 are flexible, and fabricated from ultra-low stress silicon nitride beams, and tethered to the top mirror 18 via tethers 30. As will be described in further detail, this structure provides a tether-beam based actuation mechanism.

A set of 4 first (or "top") electrodes 32 is provided, each on and supported by a respective one of the suspension arms 26. A set of 4 second (or "bottom") electrodes 34 is fabricated directly below the top electrodes 32, and is similar in size thereto.

The top electrodes 32 and bottom electrodes 34 function as actuators to control movement of the membrane 22 between a first, or unactuated position, and a second, or actuated position, and hence the top mirror 18 formed thereon. Particularly, actuation is achieved by applying a voltage between the top and bottom electrodes, 32 and 34, causing the top electrodes 32 to attract, towards the respective bottom electrodes 34, under electrostatic force.

MEMS actuation in parallel-plate structures is generally limited to one third (⅓) of the initial gap (unactuated or "relaxed" distance or space of the cavity 20 between the top electrodes 32 and the respective bottom electrodes 34) by a phenomenon known as "snap-down" [7].

Typical electrostatic actuators employed to move suspended membranes greater than ⅓ of the initial gap, such as membrane 22, take the form of fixed-fixed beams, or doubly supported beams. Typically, the top electrode 32 is a double clamped beam while the bottom electrode 34 is attached to the substrate. A voltage is applied between the top electrode 32 and the bottom electrode 34. Due to this voltage the top electrode 32 is attracted towards the bottom electrode 34 and shows a tunable motion. FIG. 1D shows how this model is traditionally applied to filter actuation. In FIG. 1D fixed-fixed beam based top electrode 32 is connected to the membrane 22 with the help of tethers 30. On application of voltage between top and bottom electrode 32 and 34 the beam actuates. It is apparent that the beam actuates with a $\cos^2$ beam profile. Tethers, such as tethers 30, attached at the center point of each beam attach to the filter membrane to lower it. This form of actuator reaches the herein described limit at greater than ⅓ actuation, and has been demonstrated to extend to >½ actuation at which point snap down occurs.

Different types of configurations of tethers 30 are disclosed in the prior art, as follows. In cases where the top mirror 18 is square-shaped on a square-shaped membrane 22, four long tethers 30 may be provided, each long tether 30 extending at one end from a respective corner of the membrane 22 to a respective suspension support 28 post functioning as an anchor, at the other end. This is depicted in FIG. 1E of the drawings. Additional tethers 30 may be provided extending at one end from portions of a perimeter of the membrane 22 to a respective suspension arm 26, as depicted in FIG. 1D. In cases where the top mirror 18 is circularly-shaped on a circularly-shaped membrane 22, four tethers 30 may be provided, each tether 30 extending at one end from a respective portion of the membrane 22 to a portion of a respective suspension arm 26, functioning as an anchor, at the other end. This is depicted in FIG. 1F of the drawings. The tethers 30 may be formed from the membrane material or a separate structural material can be chosen for tether material. In either case a deposition step followed by etching can be used for forming tethers 30 and suspension arms 26.

Such prior art suspension techniques have many defects, including that: the tethers are strongly affected by out of plane stress, which will distort the central mirror; the actuation beams typically have a gutter like shape due to materials used/thermal treatment during their fabrication process, resulting in an increased actuation voltage being required; many fabrication steps, meaning more time and more resources needed; structures can't be used with a large area (mm×mm) mirror as the stress in the mirror can actually pull off the posts and beam itself; and the prior art structure has to be modified for the shape and size of tethers and beam to optimize it for a new type of material.

In designs based on the use of long tethers 30 and actuating beams, the top mirror 18 is subjected to warping due to stress gradient in the actuating mechanisms. Particularly, the warping may deform the arms 26 to turn them into "gutters" as a consequence of the stresses, such guttering making them more difficult to move. With the aid of a stress compensation layer in the top mirror 18, or the use of curved tethers 30, the deformation may be reduced, but still the final devices can be far from achieving desirable optical and mechanical characteristics.

By using doubly supported beams as the suspension arms 26, the usual snap-down limitation of such structures can be extended to greater than half of the relaxed separation between the top and bottom electrodes, 32 and 34 [5]. An actuation range greater than 50% is important in achieving the theoretical maximum one-octave tuning range that can be achieved using Fabry-Perot filters in first order.

The separation between the top mirror 18 and the bottom mirror 16, the mirror separation, is directly related to the transmitted wavelength of the Fabry-Perot filter 12. Accordingly, scanning (i.e. moving) the top movable mirror 18 scans ("tunes") the transmitted wavelength. As depicted and evident in FIG. 1C, the spectral characteristics of these optical tunable filter 12 devices include a 50 nm resolution at a centre wavelength of 2 µm, and a tuning range from 1.6 µm to 2.5 µm. This is achieved with a low drive voltage of 25 V. The spectral tuning range can also be shifted to fit anywhere in the short-wave infrared (SWIR) or mid-wave infrared (MWIR) spectral ranges.

The lowest operational wavelength limit of this prior art MEMS tunable optical filter 12 technology is 1.5 µm. This limitation stems from the strong absorption within the germanium layers of the bottom and top mirrors, 14 and 16. As such, MEMS tunable optical filter 12 operation in the visible and complete near infrared (NIR) bands is not possible using the existing mirror technology. However, since important spectroscopic information is available in the visible and NIR bands, there is necessity to extend the operational wavelength range into these bands. For this reason, an alternative material to germanium must be selected for the high refractive-index medium of the mirrors.

Silicon (Si) is commonly the material of choice for many MEMS processes. Others have used silicon on insulator (SOI) bulk micromachining to create in-plane moving Bragg reflectors and reported full width at half maximum (FWHM) of 1.2 nm [8]. Others have also reported bulk micromachined silicon reflectors with over 95% reflectivity in the mid-wavelength infrared (MWIR) band [9]. There are two key advantages of using silicon as the high index medium in the mirror(s). Firstly, the absorption characteristics of silicon allows operation of the mirrors well into the NIR and visible regions of the optical spectrum. Secondly, as silicon is already commonly used as a MEMS structural material, the need for silicon nitride in the support structures is eliminated. The fabrication process is then significantly simplified by the removal of one material system (silicon nitride) from the Fabry-Perot structure. Replacing germanium with silicon, however, comes at a price in that, because the refractive index of silicon is lower than that of germanium, the mirror has lower index-contrast between the high-index and low-index layers. As a result, the mirror reflectivity, in the absence of any other changes to the mirror, will be decreased. The lower mirror reflectivity broadens filter response and, thereby, leads to degraded spectral resolution of the spectrometer.

The advantage of silicon in comparison to germanium, in the visible and NIR spectral regions, is illustrated in FIGS. 2A and 2B of the drawings, which plots the absorption loss, in an isolated quarter-wave layer of the high index medium in the mirror. The high index medium is considered to be either silicon or germanium. The significance of FIGS. 2A and 2B, as opposed to simply examining the extinction coefficient of germanium or silicon, is that the result presented takes into account both (a) the effect of multiple coherent reflections from the two interfaces of the thin-film, and (b) the different physical thickness of a quarter-wave layer of silicon compared to germanium.

It is evident from FIGS. 2A and 2B that as the mirror centre wavelength is shifted to shorter wavelengths, the absorption of the layer increases. However, this increase is very different for the two materials (noting the difference in vertical scale by a factor of 4). In germanium, the absorption cuts on around 1550 nm, and increases almost exponentially towards shorter wavelengths. In silicon, the absorption cuts on around 1000 nm, but increases approximately linearly towards shorter wavelengths. In other words, for silicon, in the spectral region of interest, the thickness reduction required for shorter wavelength operation, sufficiently keeps track with the absorption coefficient increase, preventing any sharp increase in layer absorption.

The explanation for this absorption behavior lies in the band structure of the two materials. The shortest direct band transition in germanium has an energy of 0.8 eV [11], which corresponds to a wavelength of 1550 nm. Thus, germanium will begin to absorb at wavelengths below this. In comparison, the shortest direct band transition in silicon, has an energy of 3.4 eV [12], which corresponds to a wavelength of 365 nm. However, because of the high density of states in silicon, phonon-assisted transitions become significant, albeit with low efficiency. These indirect transitions correspond to an energy of 1.12 eV [12], or wavelengths below 1110 nm. In other words, germanium will be an efficient (strong) absorber below wavelengths of 1550 nm, while silicon will be a weak (inefficient) absorber below wavelengths of 1110 nm and an efficient (strong) absorber below wavelengths of 365 nm [13].

Therefore, a mirror using silicon as the high-index medium will allow operation well into the visible region of the optical spectrum. However, fabricating a surface micromachined silicon based reflector entails a multitude of challenges, including optimization of the mechanical properties of the silicon to allow its use as a support material, and optimization of the optical properties to allow use as an optical material.

The combination of two quarter wavelength thick high-index dielectric layers separated by the quarter wavelength thick air gap has been considered by many research groups—also referred to as an "Air Gap Mirror". One such group designed an indium phosphide (InP) and air gap distributed Bragg reflector (DBR) for realizing a horizontal Fabry-Perot resonant microcavity [14]. Such a DBR has been reported by several other groups [15, 16]. One group used air-spaced InP and indium gallium arsenide (InGaAs) to create a DBR [17]. InP has a high refractive index and filters made with InP give high finesse. Others have proposed gallium arsenide (GaAs) and air DBR and filter fabrication [18]. There has been a great amount of research and development on silicon-based MEMS. Si MEMS are based on low cost standard thin film processes whereas compound semiconductors require high-cost epitaxial processes, also silicon has excellent mechanical and optical properties. Due to all these reasons compound semiconductors are no longer considered for mainstream MEMS technologies. Silicon and silicon-based nitrides and oxides are now an integral part of MEMS research and are dominant in industrial and commercial applications.

Silicon nitride (Si3N4) and air has been proposed as the material for DBRs using silicon as the sacrificial layer [19]. Si3N4 has the advantage of providing good stress tuning and high selectivity of KOH etching over silicon. However, owing to its low refractive index, many layers of Si3N4 are required to achieve a high finesse cavity. Increasing the number of layers then results in a decrease in the operational wavelength range of the mirror as well as increased process complexity.

Bulk micromachining of single crystalline silicon has been used by several others to create optical filters with high finesse. The DBR used in such work consisted of air and silicon [8, 20]. Using chemical vapor deposition (CVD) and annealing the optical and mechanical properties of silicon can be tuned to provide the desired performance. In addition, surface micromachining gives many advantages over bulk micromachining [21], such as small or large feature size, flexibility in choosing sacrificial layers, and tunable properties of deposited materials. Therefore many research groups have reported silicon-based surface micromachined optical MEMS. The inventors have previously used low pressure CVD (LPCVD) silicon to fabricate mirrors and filters for long wave infrared LWIR imaging [22, 23]. Silicon has the required refractive index to achieve high finesse in SWIR wavelengths. However in order to achieve optical devices operating at the SWIR wavelengths, the flatness, surface roughness, and fabrication complexity, have much tighter constraints than for LWIR devices.

SUMMARY OF THE INVENTION

It would be advantageous if an embodiment of the present invention overcomes, or at least ameliorates, one or more of the deficiencies of the prior art mentioned above, or to provide the consumer with a useful or commercial choice.

In accordance with embodiments of the present invention, there is provided a method of fabricating a reflector, the reflector being at least partially reflective and transmissive for at least a wavelength of electromagnetic radiation; the method comprising:

forming a first material layer defining a bottom layer;

forming a sacrificial layer on the bottom layer;

forming a second material layer defining a top layer on the sacrificial layer and a supporting structure connected to the bottom layer; and removing at least part of the sacrificial layer to form a cavity between the bottom layer and the top layer such that the supporting structure supports the top layer relative to the bottom layer and no further supporting structure is provided within the cavity, wherein after the at least part of the sacrificial layer is removed, at least the top layer has residual tensile stress.

Embodiments of the present invention provide significant advantages. In particular, by not providing any supporting structures within the cavity and supporting the top layer only at its periphery, a larger optical area of the reflector can be provided.

The method may comprise changing a mechanical property of at least part of the defined top layer such that compressive stress of the top layer is converted to residual tensile stress. Changing the mechanical property may comprise annealing at least part of the formed top layer such that compressive stress of the top layer is converted to residual tensile stress. Changing the mechanical property, such as by annealing, may be conducted before removing the at least part of the sacrificial layer.

Forming the second material layer may comprise depositing the second material layer on the sacrificial layer such that the top layer has residual tensile stress.

The method may comprise perforating the first material layer and/or the second material layer to form at least one perforation such that the sacrificial layer can be removed via an etching process. The method may further comprise forming a cover layer of material to at least partially cover the at least one perforation after removing the at least part of the sacrificial layer.

The tensile stress of the top layer may be below 200 MPa. For example, the tensile stress may substantially be in the range of 50 MPa to 200 MPa.

The method may be conducted such that the defined cavity provides a substantially uniform distance between the top layer and the bottom layer.

The defined cavity may be an air cavity.

The first and second material layers may comprise the same material or material composition.

The first material layer and/or the second material layer may comprise a dielectric material.

The first material layer and/or the second material layer may comprise a semiconductor material. The first material layer and/or the second material layer may comprise amorphous or polycrystalline silicon. The first material layer and/or the second material layer may comprise germanium.

The first material layer and/or the second material layer typically has an optical thickness of ¼ of the wavelength of the electromagnetic radiation.

Forming the first and second material layers may be conducted by chemical vapour deposition. The ICP power used for the chemical vapour deposition may be in a range between 20 and 26 W.

The reflector may be a distributed Bragg reflector.

The Method m

The method may comprise forming one or more further sacrificial layers and one or more further material layers to fabricate a reflector with a great number of periods. Such a reflector may also be referred to as a higher order reflector.

In accordance with embodiments of the present invention, there is provided a reflector, the reflector being at least partially reflective and at least partially transmissive for at least a wavelength of the electromagnetic radiation, the reflector comprising:
 a first material layer defining a bottom layer;
 a second material layer defining a top layer and a supporting structure, the second material layer being arranged to define a cavity between the top layer and the bottom layer,
 wherein at least the top layer has residual tensile stress, and the reflector is arranged such that the support structure supports the top layer relative to the bottom layer and no further supporting structure is provided within the defined cavity.

In accordance with embodiments of the present invention, there is provided a method of fabricating a microelectromechanical system or part thereof, such as a tunable optical filter, the method comprising:
 providing a base structure comprising a first reflector;
 providing a membrane comprising a second reflector, the membrane being supported relative to the base structure such that a cavity is formed between the first and second reflectors;
 providing an actuator such that at least the second reflector of the membrane is moveable relative to the first reflector between at least a first tuning position and a second tuning position;
 wherein the membrane comprises at least one opening that is arranged to compensate for stress in the second reflector when the second reflector moves between the first tuning position and the second tuning position.

The first reflector and/or the second reflector of the optical filter may be the reflector as described above.

The first reflector and/or the second reflector may be a distributed Bragg reflector.

The membrane may comprise a plurality of openings that are equidistant from one another.

The at least one opening may form a slit. The slit may have a direction towards a central axis of the membrane.

A number of openings in the membrane may be proportional to a number of edges or corners of a shape of the membrane and/or the second reflector. The number of openings may be equal to the number of edges or corners.

The membrane may have a square or rectangular shape. In addition, the second reflector may have a square or rectangular shape.

The membrane and/or the second reflector may comprise a dielectric material. The membrane and/or the second reflector may comprise a semiconductor material.

The membrane typically is flexible.

The cavity may provide a substantially uniform distance between the first reflector and the second reflector.

A distance between the first tuning position and the second tuning position is greater than ⅓ of the formed cavity. In a specific example, the distance may be in the order of 2 μm.

The actuator may comprise at least one pair of electrodes such that a voltage applied to the at least one pair of electrodes results in movement of the second reflector relative to the first reflector. When the second reflector moves between the first tuning position and the second tuning position, a travel distance of the at least one pair of electrodes relative to each other is smaller than a travel distance of the second reflector.

The method may comprise forming an insulating layer between at least one of the electrodes and the membrane and/or the second reflector.

A reflectivity of the first reflector may be higher than or substantially equal to a reflectivity of the second reflector.

Providing the membrane may be conducted such that the membrane is supported relative to the supporting structure only at a periphery of the membrane and no supporting structures are provided within the formed cavity.

The method may comprise forming a sacrificial layer on the supporting structure, and removing part of the sacrificial layer such that a portion of the sacrificial layer remains to support the membrane relative to the supporting structure.

In accordance with embodiments of the present invention, there is provided a microelectromechanical system or part thereof, such as a tunable optical filter comprising:
 a base structure comprising a first reflector;

a membrane comprising a second reflector, the membrane being supported relative to the base structure such that a cavity is formed between the first and second reflectors;

an actuator arranged such that at least the second reflector of the membrane is moveable relative to the first reflector between at least a first tuning position and a tuning second position;

wherein the membrane comprises at least one opening that is arranged to compensate for stress in the second reflector when the second reflector moves between the first tuning position and the second tuning position.

In accordance with embodiments of the present invention, there is provided a microspectrometer comprising:

the microelectromechanical system or part thereof as described above; and a detector for detecting incident electromagnetic radiation.

According to embodiments of the present invention, there is provided a method for fabricating a reflector, comprising:

forming a support;

forming a layer of material, wherein the layer of material is supported by the support such that at least a portion of the layer of material is in contact with the support; and changing a residual compressive stress of the layer of material to a tensile residual stress so as to provide the layer of material with sufficient tensile strength to be supported by the support to at least partially bound a region of space;

wherein no supporting structures are provided within the region of space.

In an embodiment, the changing comprises subjecting the layer of material to thermal annealing.

In an embodiment, the method comprises forming the layer of material on a sacrificial layer of material, and subsequently releasing the layer of material from the sacrificial layer of material by removing at least some of the sacrificial layer of material, wherein the support comprises one or more portions of the layer of material remaining after removal of at least some of the sacrificial layer.

In an embodiment, the method comprises selectively removing at least some of the sacrificial layer of material via an etching process.

In an embodiment, the method comprises perforating the layer of material for enabling selective removal of at least some of the sacrificial layer of material.

The perforating may comprise forming at least one hole in the layer of material.

In an embodiment, the method comprises forming a further layer of material to at least partially cover the perforations following the selective removal of at least some of the layer of material.

The further layer of material may comprise one or more pads positioned to at least partially cover one or more of the perforations.

In an embodiment, the changing comprises subjecting the layer of material to an annealing process pre-release.

In an embodiment, the method comprises fabricating the reflector as part of a tunable optical filter.

In an embodiment, the reflector comprises an air gap mirror.

According to a second broad aspect of the present invention, there is provided a reflector, comprising:

a support; and a layer of material, wherein the layer of material is supported by the support such that at least a portion of the layer of material is in contact with the support;

wherein a residual compressive stress of the layer of material is changed to a tensile residual stress so as to provide the layer of material with sufficient tensile strength to be supported by the support to at least partially bound a region of space;

wherein no supporting structures are provided within the region of space.

In an embodiment, the layer of material is subjected to thermal annealing.

In an embodiment, the support comprises one or more portions of a sacrificial layer remaining after removal of at least some of the sacrificial layer.

In an embodiment, at least some of the sacrificial layer of material is removed via an etching process.

In an embodiment, the layer of material is perforated for enabling selective removal of at least some of the sacrificial layer of material.

In an embodiment, the perforating comprises at least one hole formed in the layer of material.

In an embodiment, the reflector comprises a further layer of material at least partially covering the perforations following the selective removal of at least some of the layer of material.

In an embodiment, the further layer of material comprises one or more pads positioned to at least partially cover one or more of the perforations.

In an embodiment, the reflector comprises part of a tunable optical filter.

In an embodiment, the reflector comprises an air gap mirror.

According to a third broad aspect of the present invention, there is provided a method for fabricating a microelectromechanical system, or a part thereof, comprising:

forming a support;

forming a layer of material, wherein the layer of material is supported by the support, to at least partially bound a region of space, such that at least a portion of the layer of material is in contact with the support; and removing one or more portions of the layer of material.

In an embodiment, the removed portions comprise notches in the layer of material.

In an embodiment, a shape of the layer of material comprises one or more sides, and the number of portions removed from the layer of material is proportional to the number of sides of the shape.

In an embodiment, a shape of the layer of material comprises one or more vertices, and the one or more portions are removed from one or more of the vertices of the shape.

In an embodiment, the microelectromechanical system, or part thereof, fabricated by the method comprises a membrane.

According to a fourth broad aspect of the present invention, there is provided a microelectromechanical system, or a part thereof, comprising:

a support; and a layer of material, wherein the layer of material is supported by the support, to at least partially bound a region of space, such that at least a portion of the layer of material is in contact with the support; and one or more portions of the layer of material are removed.

In an embodiment, the removed portions comprise notches in the layer of material.

In an embodiment, a shape of the layer of material comprises one or more sides, and the number of portions removed from the layer of material is proportional to the number of sides of the shape.

In an embodiment, a shape of the layer of material comprises one or more vertices, and the one or more portions are removed from one or more of the vertices of the shape.

In an embodiment, the microelectromechanical system, or part thereof, comprises a membrane.

According to a fifth broad aspect of the present invention, there is provided a method for fabricating a microelectromechanical system, or a part thereof, comprising:

forming a support; and
forming a layer of material,
wherein the layer of material is supported by the support, to at least partially bound a region of space, such that at least a portion of the layer of material is in contact with the support.

In an embodiment, the method further comprises treating the layer of material. The treating may occur during formation of the layer of material, or post-formation of the layer of material.

Treating the layer of material may comprise forming the layer of material with sufficient tensile strength to be supported by the support to at least partially bound the region of space. To do this, residual compressive stress of the layer may be changed to a tensile residual stress. Such a treatment may be performed prior to release of the layer from any one or more portions of a sacrificial layer of material, and may comprise subjecting the layer to thermal annealing.

Treating the layer of material may comprise removing one or more portions of the layer of material. The removed portions may comprise notches in the layer of material.

Treating the layer of material may comprise operably associating the layer of material with actuating means for moving the layer of material between at least a first position and a second position. The actuating means may comprise an electrostatic actuator comprising one or more pairs of opposed electrodes. Operably associating the layer of material with the electrostatic actuator may comprise: attaching the layer of material and at least one electrode; and/or forming at least one electrode on the layer of material.

A shape of the layer of material may comprise an ellipse or a polygon, and may comprise one or more sides and/or one or more vertices. In an embodiment, the number of attached and/or formed electrodes is proportional to the number of edges or sides of the shape. The number of portions removed from the layer of material may also be proportional to the number of edges or sides of the shape. In embodiments where one or more portions of the layer of material are removed, the one or more portions may be removed from one or more of the vertices of the shape.

In an embodiment, the method comprises forming a hinge at an interface between the layer of material and the at least one attached/formed electrode.

In an embodiment, the method comprises forming the layer of material on a sacrificial layer of material, and subsequently releasing the layer of material from the sacrificial layer of material by removing at least some of the sacrificial layer of material. When performed, the treatment may occur prior to or after release of the layer of material. In an embodiment, the support comprises one or more portions of the sacrificial layer remaining after, preferably selective, removal of at least some of the sacrificial layer.

The method may comprise forming one or more apertures or perforations in the layer of material to facilitate the selective removal of one or more portions of the sacrificial layer of material. The one or more portions of the sacrificial layer of material may be removed via etching. The sacrificial layer of material may comprise a polymer, in which case an oxygen plasma may be used to selectively remove the one or more portions of it.

In an embodiment, the method comprises forming a base layer or substrate of material, which may act as or support the support. At least a portion of the layer of material may be formed on the base layer/substrate of material. One or more further layers of material may be provided between the base layer/substrate of material and the layer of material. The one or more further layers may comprise one or more shields for providing optical blanking of light. The one or more shields may comprise pads of materials.

In an embodiment, the region of space partially bounded by the layer of material comprises a cavity. All or any remaining portion of the cavity may be open, or bounded by one or more of: the support, any base layer of material, and any one or more further layers of material.

In an embodiment, there are no supporting structures within the cavity for supporting the layer of material.

One or more of the layer of material, the base layer of material, and the one or more further layers of material may comprise a mirror.

One or more layers of material of the microelectromechanical system, or the part thereof, may be formed from, for example: silicon, and preferably amorphous silicon; germanium. In embodiments of the invention, the material used may be something other than silicon and germanium. It should be appreciated that the material is not limited in this regard, and in embodiments of the invention any thin film MEMS material may be used. In embodiments of the invention, any semiconductor or any dielectric material may be used.

In an embodiment, the cavity may contain air or vacuum, or something other than air or vacuum In an embodiment, the region of space comprises a gap.

In an embodiment, at least a portion of a periphery of the layer of material is in direct contact with the support.

In an embodiment, the microelectro-mechanical system, or the part thereof, comprises at least one of a reflector, a fixed or tunable filter, and an actuator.

According to a sixth broad aspect of the present invention, there is provided a microelectromechanical system, or a part thereof, comprising:

a support; and
a layer of material,
wherein the layer of material is supported by the support, to at least partially bound a region of space, such that at least a portion of the layer of material is in contact with the support.

In an embodiment, the layer of material is treated, either during the formation thereof, or post-formation thereof. The treatment of the layer of material may be such that at least one of:

the layer of material is provided with sufficient tensile strength to be supported by the support to at least partially bound the region of space;
one or more portions of the layer of material are removed; and
the layer of material is operably associated with actuating means for moving the layer of material between at least a first position and a second position.

In an embodiment, the sufficient tensile strength comprises a low level of tensile strength.

In an embodiment, a residual compressive stress of the layer of material is changed to a low level of tensile residual stress to provide the layer of material with sufficient tensile strength to be supported by the support to at least partially bound the region of space. The layer of material may be subjected to thermal annealing to achieve this. In another embodiment, the residual compressive stress of the layer of material is changed to a moderate level of tensile stress, low enough to not mechanically damage the MEMS structure due to excessive stress, although this may increase actuation voltage unnecessarily.

In an embodiment, when one or more portions of the layer of material are removed, the removed portions comprise notches in the layer of material. In embodiments where a shape of the layer of material comprises one or more sides, the number of portions removed from the layer of material may be proportional to the number of sides of the shape. In cases where a shape of the layer of material comprises one or more vertices, the one or more portions may be removed from one or more of the vertices of the shape.

In an embodiment where the layer of material is operably associated with actuating means, the actuating means comprises an electrostatic actuator comprising one or more pairs of opposed electrodes. The layer of material and at least one electrode may be attached and/or at least one electrode may be formed on the layer of material to operably associate the layer of material with the electrostatic actuator. In an embodiment where a shape of the layer of material comprises one or more sides, the number of attached and/or formed electrodes may be proportional to the number of sides of the shape.

In an embodiment, the system or part comprises a hinge formed at an interface between the layer of material and the at least one attached/formed electrode.

In an embodiment, the support comprises one or more portions of a sacrificial layer remaining after removal of at least some of the sacrificial layer.

In an embodiment, the system or part comprises a base layer or substrate of material which functions as, or supports, the support. In such a case, at least a portion of the layer of material may be formed on the base layer/substrate of material.

In an embodiment, one or more further layers of material are formed between the base layer/substrate of material and the layer of material.

In an embodiment, the region of space bounded by the layer of material comprises a cavity. In such an implementation, all or any remaining portion of the cavity may be open, or bounded by one or more of: the support, any base layer of material, and any one or more further layers of material.

In an embodiment, no supporting structures are provided within the cavity.

In an embodiment, the cavity contains air, vacuum, or something other than air or vacuum.

In an embodiment, one or more layers of material of the system or part are formed from: silicon, amorphous silicon, germanium, or something other than silicon or germanium.

In an embodiment, at least a portion of a periphery of the layer of material is in direct contact with the support.

In embodiments, the system or part comprises at least one of a reflector, a fixed or tunable filter, and an actuator.

Other advantages of the present invention will become apparent from the following description, taken in connection with the accompanying drawings, wherein, by way of illustration and example, a preferred embodiment of the present invention is disclosed.

BRIEF DESCRIPTION OF THE DRAWINGS

In order that the invention may be more fully understood and put into practice, preferred embodiments thereof will now be described with reference to the accompanying drawings, in which.

DESCRIPTION OF EMBODIMENTS

Figures 1A, 1B:
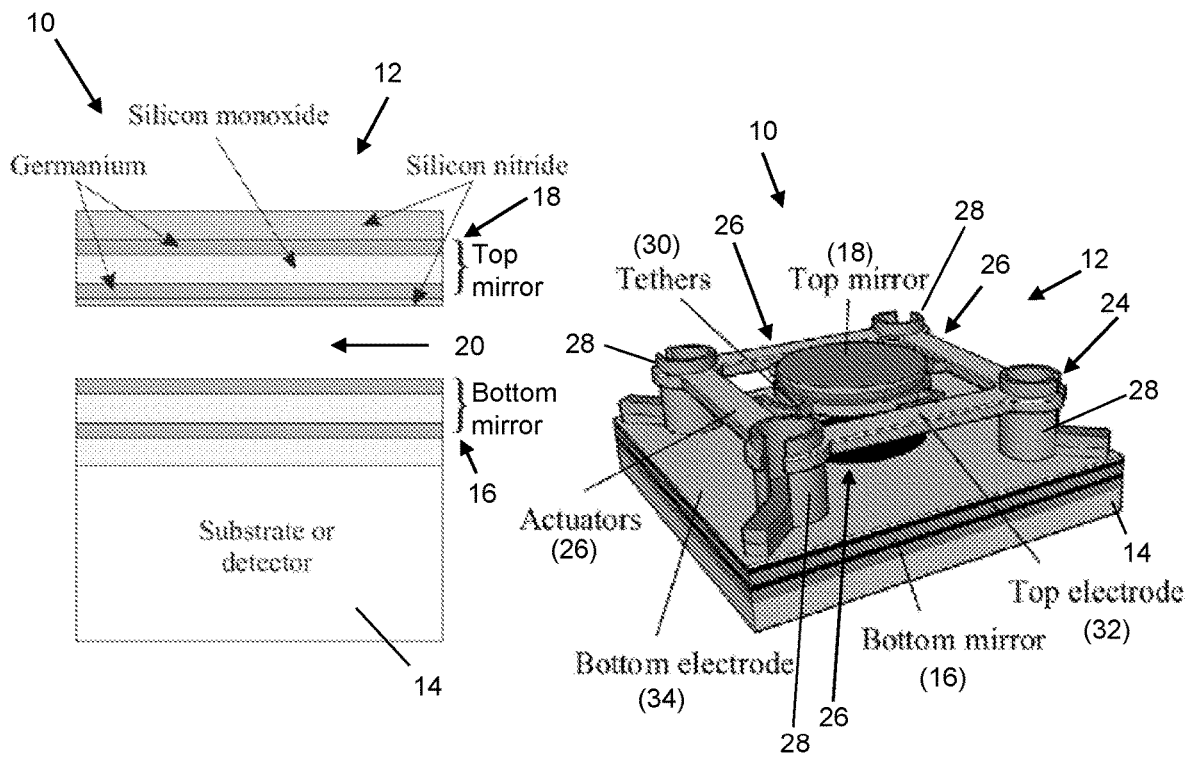
FIG. 1A depicts a schematic cross-sectional view of optical region of a prior art MEMS Fabry-Perot tunable filter device structure.
FIG. 1B depicts a three dimensional (3D) view of the entire MEMS Fabry-Perot tunable filter device of FIG. 1A with a doubly supported beam structure.
Figure 1C:
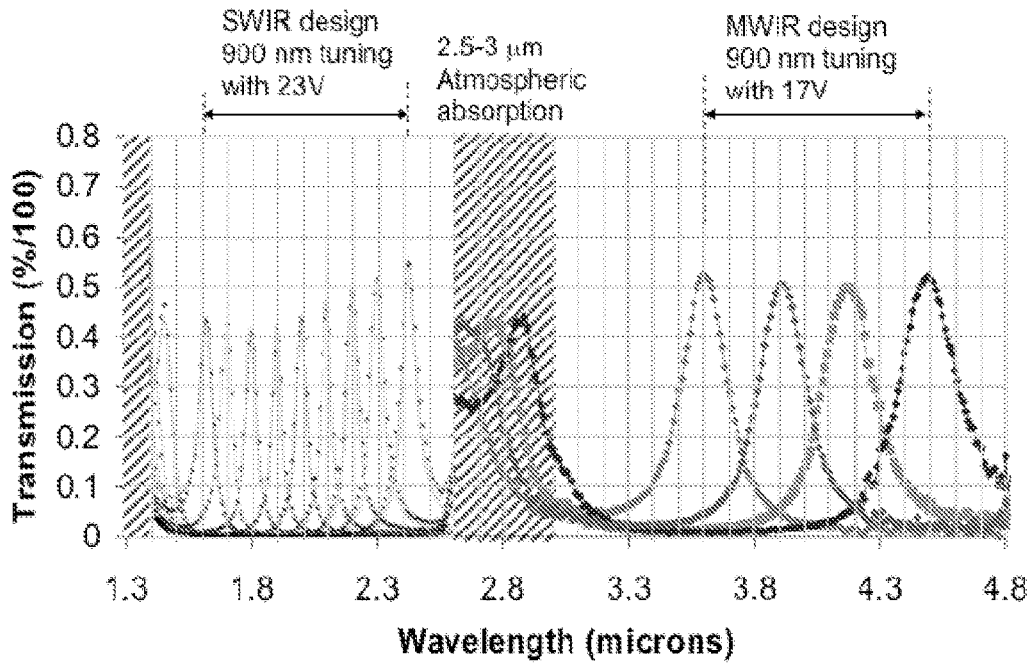
FIG. 1C depicts measurements demonstrating operation of example MEMS Fabry-Perot tunable filter devices of FIG. 1A in the shortwave infrared and midwave infrared spectral regions.
Figure 1D:
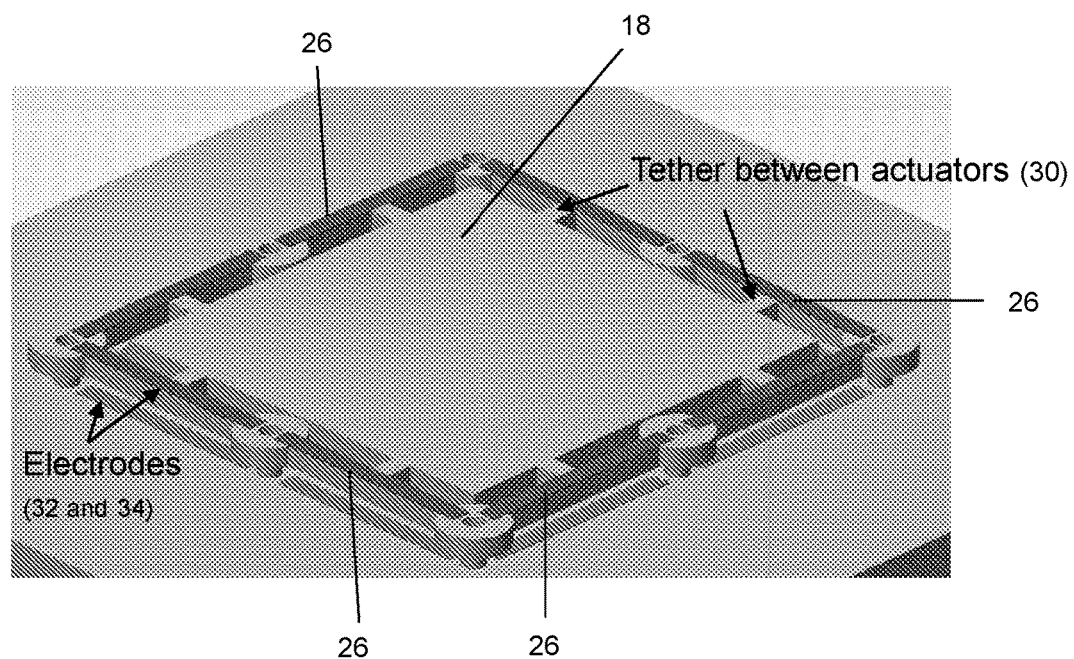
FIG. 1D depicts application of beam structure for membrane actuation.
Figure 1E:
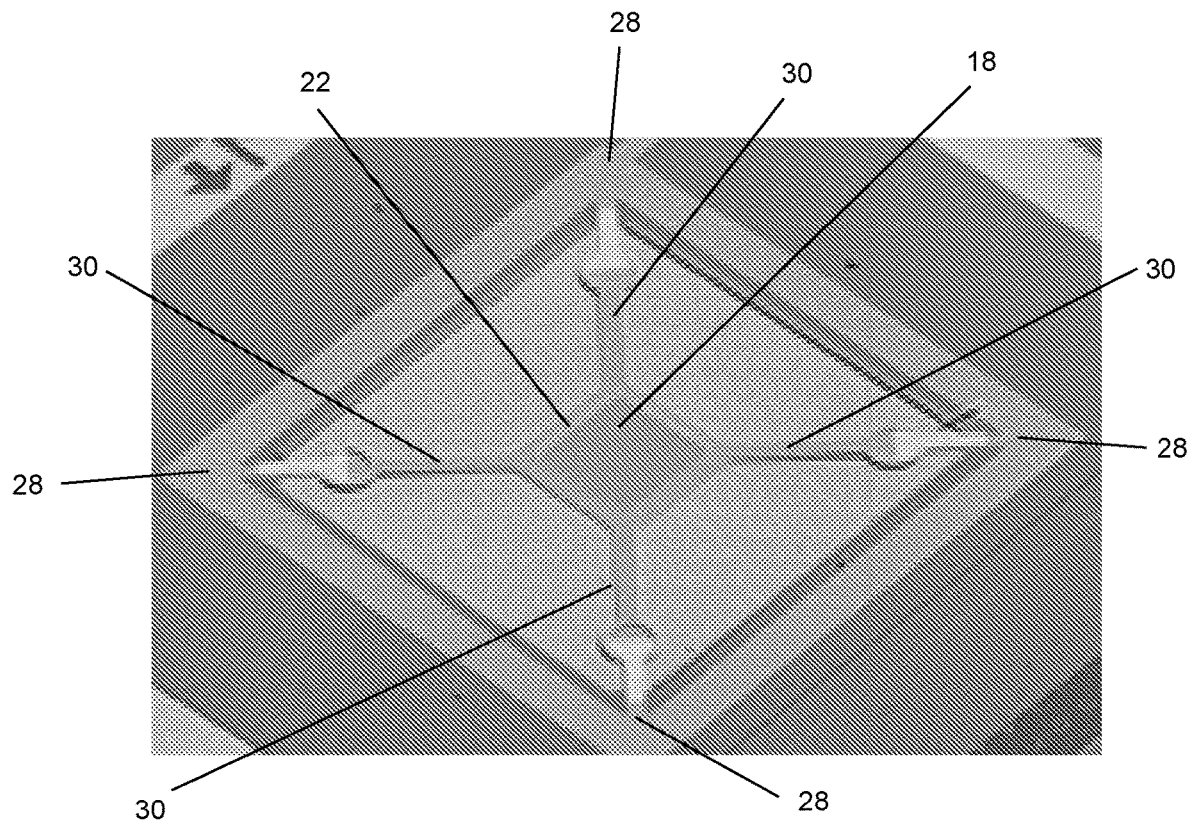
FIG. 1E depicts a prior art parallel-plate MEMS Fabry-Perot tunable filter device structure implemented using long tethers.
Figure 1F:
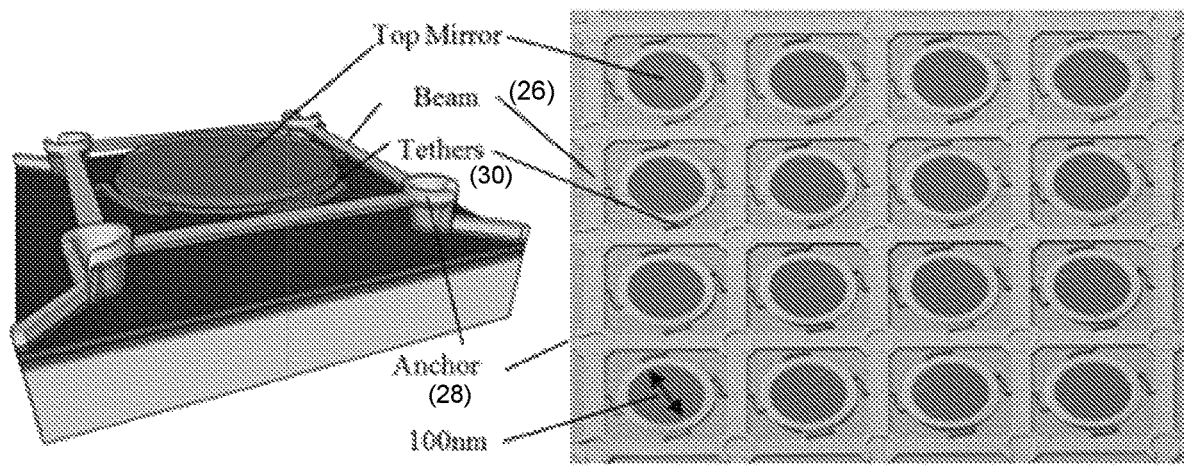
FIG. 1F depicts a prior art doubly supported beam based MEMS Fabry-Perot tunable filter structure implemented using curved tethers and actuating beams.

The present invention is not to be limited in scope by the following specific embodiments. This detailed description is intended for the purpose of exemplification only. Functionally equivalent products, compositions and methods are within the scope of the invention as described herein. Consistent with this position, those skilled in the art will appreciate that the invention described herein is susceptible to variations and modifications other than those specifically described. It is to be understood that the invention includes all such variations and modifications. The invention also includes all of the steps, features, compositions and compounds referred to or indicated in the specification, individually or collectively and any and all combinations or any two or more of the steps or features. The embodiments describe LWIR and SWIR devices but the invention is applicable across wider spectral range, including from UV to terahertz wavelengths.

Further features of the present invention are more fully described in the examples herein. It is to be understood, however, that this detailed description is included solely for the purposes of exemplifying the present invention, and should not be understood in any way as a restriction on the broad description of the invention as set out hereinbefore.

The following presents embodiments of the methods used in the method of the invention. The description of these methods are accompanied by the results obtained in the analysis of the identified and produced structures resulting from application of the methods.

The entire disclosures of all publications (including patents, patent applications, journal articles, laboratory manuals, books, or other documents) cited herein are hereby incorporated by reference. No admission is made that any of the references constitute prior art or are part of the common general knowledge of those working in the field to which this invention relates.

Throughout this specification, unless the context requires otherwise, the word "comprise", or variations such as "comprises" or "comprising", will be understood to imply the inclusion of a stated integer or group of integers but not the exclusion of any other integer or group of integers.

Other definitions for selected terms used herein may be found within the detailed description of the invention and apply throughout. Unless otherwise defined, all other scientific and technical terms used herein have the same meaning as commonly understood to one of ordinary skill in the art to which the invention belongs.

Embodiments of the invention described herein may include one or more range of values (for example, size, displacement and field strength etc.). A range of values will be understood to include all values within the range, including the values defining the range, and values adjacent to the range that lead to the same or substantially the same outcome as the values immediately adjacent to that value which defines the boundary to the range. It is to be appreciated that the invention is not limited in this regard, and other values may be applicable to other embodiments of the invention.

Throughout this specification relative language such as the words 'about' and 'approximately' are used. This language seeks to incorporate at least 10% variability to the specified number or range. That variability may be plus 10% or negative 10% of the particular number specified.

In the drawings, like features have been referenced with like reference numbers.

Figure 3:
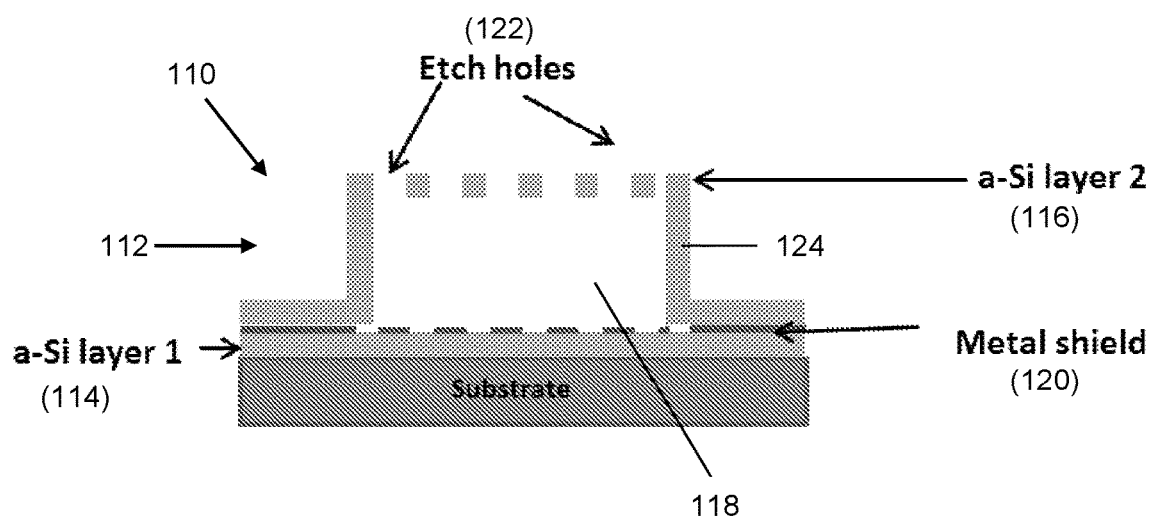
FIG. 3 depicts a schematic cross-sectional view of a-Si based air-gap mirror fabricated in accordance with an embodiment of the present invention.

In FIG. 3, there is depicted a first embodiment of a microelectromechanical system (MEMS), or a part thereof, fabricated using a method in accordance with an aspect of the present invention.

In the first embodiment, the microelectromechanical system, or the part thereof, is a reflector 110. The reflector 110 is suited to MEMS based fixed or tunable optical filters such as a Fabry-Perot filter and more specifically to microspectrometer or tunable light source fabrication, and in embodiments may demonstrate near theoretical reflectance characteristics.

In the embodiment, the reflector 110 is a Distributed Bragg Reflector (DBR) having the form of an ultra flat, amorphous silicon (a-Si) air-gap/space mirror 112, which may also be referred to as a silicon-air-silicon dielectric mirror 112.

The mirror 112 comprises two thin planar membrane film layers of material, being a first (or "bottom") layer 114 of material and a second (or "top") layer 116 of material, separated by a cavity 118. In the embodiment, both the bottom and top layers of material, 114 and 116, comprise the same material—amorphous Si—and the cavity 118 comprises a thin gap/space of air or vacuum. Both the bottom and top layers of material, 114 and 116, are a quarter wavelength in optical thickness in the embodiment. In addition to other functions as herein described, bottom layer 114 functions as a material base layer/substrate for the reflector 110. It serves as a foundation and support for the other elements of the reflector 110. However, it should be noted that the first (or "bottom") layer 114 may not necessarily serve as a foundation and support or have a supporting layer underneath as shown in FIG. 3. Without a substrate or a supporting layer underneath as shown in FIG. 3, the reflector 110 may provide a free-standing mirror 112.

A third (or "intermediate") layer 120 of material is provided on the bottom layer 114. The third layer 120 is of metal which is generally used in MEMS processes such as titanium-gold/chromium-gold, or aluminum, for example, and functions as a shield, providing optical blanking of unwanted stray light that does not impinge on the mirror 112 or is let through via perforations forming release etch holes 122, described in further detail below, in the top layer 116. In embodiments of the invention, the third layer 120 may comprise metal pads for blocking stray-light entering through the etch holes 122.

In other words, the function of the third layer 120 is mainly the blocking of stray-light entering through the etch holes. Thus, placement of this third layer 120 on another optical plane inside a whole MEMS tunable optical filter is envisaged. For example, for a bottom mirror 16 of a MEMS tunable filter, the third layer 120 could be located below the bottom layer 114. In another example, for a top mirror 18 of a MEMS tunable optical filter, the third layer 120 could be located on or inside the bottom mirror 16. It will be appreciated that the material of the third layer 120 is not limited to metals but materials that sufficiently block stray-light entering through the etch holes 122.

Accordingly, it can be seen that the top layer 116 is supported by a support 124 (being part of the top layer 116 extending vertically from the bottom layer 114) to at least partially bound a region of space (defined by the cavity 118) such that at least a portion of the top layer 116 is in contact with the support 124. Advantageously, and as will be described in further detail, whilst the top layer 116 is supported in opposed spaced relation to the bottom layer 114 by the support 124, there are no internal support structures within the cavity 118 in the design of the embodiment. The whole top layer 116 is supported at the periphery thereof only and is freely suspending/suspended. There is no intermediate support (i.e. within the cavity 118) to keep the air gap constant. Amongst other advantages, this allows for increases in optically active area, fill factor (i.e. high optical space filling efficiency), scalability (producing mirrors ranging from a few hundred microns to many mm$^2$ in area), and reflectivity of the mirror 112.

The high refractive index and low optical absorption of the amorphous Si allows strong performance in dielectric mirrors in the optical wavelength range from visible to MWIR.

Accordingly, the mirror 112 has direct application for use in fixed or tunable Fabry-Perot optical filters. In this regard, reflectors 110 formed according to the embodiment of the invention may be used with, and form part of, a detector device for detecting incident radiation at particular wavelengths, replacing one or both of the bottom mirror 16 and the top mirror 18 of the microspectrometer 10 as hereinbefore described, for example. Reflectors 110 formed according to the embodiment of the invention may be used with, and form part of, other optical devices where fixed or tunable filtering of particular wavelengths is required.

It will be appreciated that the invention is not limited in regard to the materials used in constructing the reflector 110, and in alternative embodiments, materials additional and/or alternative to those described may be used. For example, the first and second, and third layers of material may comprise material other than amorphous Si and metal, respectively, including combinations or blends of material in more than one layer.

For example, where non-silicon materials are used for one, more, or all layers of the mirror, it may comprise a germanium-air-silicon mirror. Devices may be constructed using such mirrors. For example, a Fabry Perot filter comprising such an air-spaced not-all silicon mirror, for either or both mirrors of the filter, may be fabricated in an embodiment of the invention. In other embodiments of the invention, higher order mirrors, with more layers, constructed from silicon and/or other materials, may be fabricated, such as a germanium-air-silicon-air-germanium mirror. Devices may be constructed using such higher order mirrors, such as, for example, a Fabry Perot filter comprising a higher order mirror, for either or both mirrors of the filter.

In embodiments, the cavity 118 may contain something other than air or vacuum, as appropriate to the use to which the reflector is to be applied. In embodiments of the invention, it has to be taken care that the cavity 118 must contain material with lower refractive material than the refractive index material of membranes. In embodiments, the thickness of the cavity material should be one quarter wavelength thick to let it work as the reflector.

A prior art design comprises a 3-layer germanium/silicon-monoxide/germanium mirror. Germanium is no good at wavelengths below 1.5 µm. Replacing germanium with silicon allows operating at lower wavelengths, but mirror performance degrades. Particularly, as silicon has a lower refractive index than germanium, it will degrade the reflectivity of the mirror if no other change is made to the mirror design. Despite this degradation, the mirror will then be capable of operating down to a wavelength of 550 nm or less. Air, with a refractive index of 1, is the best choice for use as a low-index mirror medium, since no natural substance has a lower refractive index. Replacing silicon monoxide with air greatly improves the reflectivity of the mirror. Modelling by the inventors indicates that using a 3-layer mirror made of silicon-air-silicon quarter wavelength layers will result in a Fabry Perot filter with a spectral resolution of approximately 20 nm at a center wavelength of 2000 nm, which is an improvement in resolution by a factor of 2 over the germanium/silicon-monoxide design of the prior art.

As will be described in further detail, the method for fabricating the reflector 112 broadly comprises:
   forming the bottom layer 114 of material;
   forming the support 124 for supporting the top layer 116 of material in opposed spaced relation to the bottom layer 114 of material so as to form the cavity 118 between the bottom layer 114 of material and the top layer 116 of material; and
   in some cases treating the top layer 116.

Figure 4:
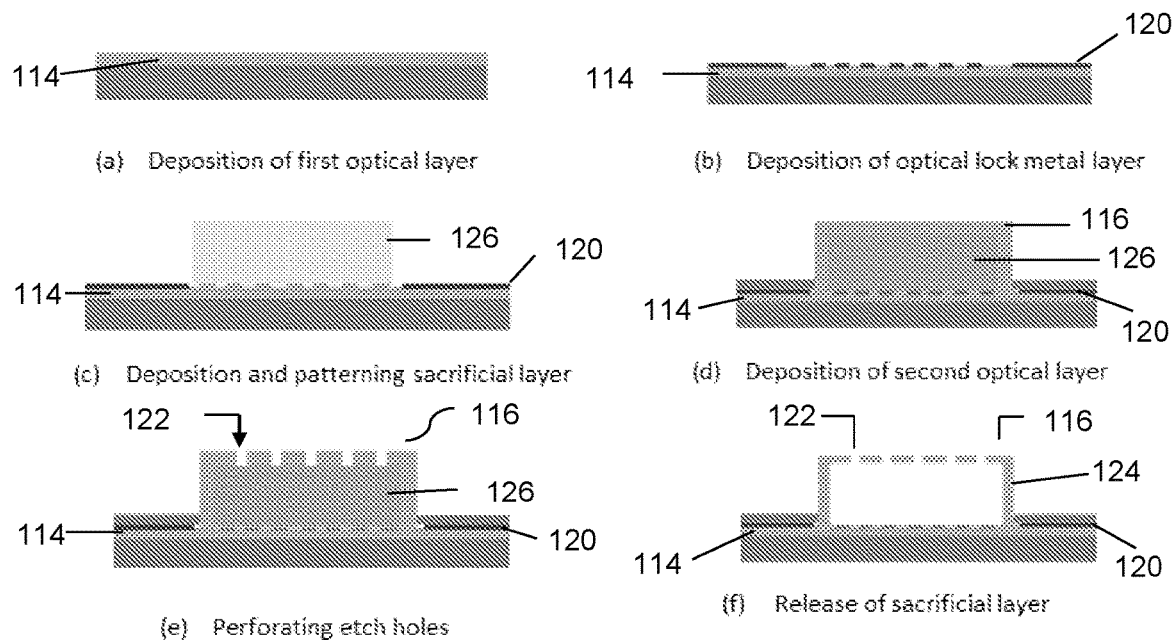
FIG. 4 depicts a fabrication process flow for producing the air-gap mirror of FIG. 3.

These, and other steps of the method for fabricating the mirror 112 are depicted in FIG. 4 of the drawings.

According to the method of the embodiment:
   the bottom layer 114 is formed by deposition of a-Si;
   the intermediate shielding layer 120 is formed by deposition of metal onto the bottom layer 114;
   a fourth (or "sacrificial") layer 126 is formed by deposition of sacrificial material onto the third layer 120;
   the top layer 116 is formed by deposition of a-Si onto the sacrificial layer 126;
   the top layer 116 is perforated with the release etch holes 122 for enabling selective removal of at least some of the sacrificial layer 126 so that there are no supports within the cavity 118;
   if needed, residual compressive stress of the top layer 116 is changed to a tensile residual stress via a pre-release process; and
   the sacrificial layer 126 is released to form the support 124.

It should be noted that in the described embodiment, the support 124 comprises sidewalls of the top layer 116 formed when the sacrificial layer 126 is released.

As deposited, the a-Si can be under residual compressive stress. Just prior to the etch of the sacrificial layer 126, the residual compressive stress of the top layer 116 is changed to a tensile residual stress by the pre-release process, comprising subjecting the top layer 116 to thermal annealing in the embodiment. This tensile stress combined with conformal support around the periphery of the top layer 116 provided by the sidewalls forming the support 124 allows the top layer 116 to be suspended above the bottom layer 114 at a fixed and parallel distance.

As will be described in further detail, in the embodiment the material used to form the sacrificial layer 126 is a polymer, and can be removed using an oxygen (O2) plasma in a release process which etches it away. It is possible to use wet etchants to achieve the same result with this or other types of sacrificial materials that may be used in alternative embodiments of the invention.

It is well known that compressive stress in the membrane film of the top layer 116 will make it buckle once released (i.e. the sacrificial layer 126 is removed—suspending the top layer 116 over the bottom layer 114). This can lead to the top layer 116 contacting and adhering to the bottom layer 114, causing the mirror 112 not to function as designed. Particularly, buckling of the suspended top layer 116 of the mirror 112 results in poor optical properties at best, and total failure of the mirror 112 to function in worst case scenarios.

The pre-release etch anneal treatment converts the residual stress in the top layer 116 from compressive to tensile and as such causes the top layer 116 to stretch tightly, in tension, across the gap of the support 124 formed by the sidewalls remaining after the etch. This provides properties of flatness and parallelism for the desired optical performance of the mirror 112. Furthermore, having the top layer 116 in tension allows large ultra-flat air-spaced mirrors to be made without any supports being within the cavity 118. The annealing process does not attempt to crystallise the material but, instead, only converts the stress state to a low-tensile stress. As the excessive temperatures required to crystallise the material can have detrimental effects on the sacrificial layer, such stress conversion requires the annealing temperature to be managed appropriately.

It should be appreciated that it is important to provide a correct amount of tensile stress to the top layer 116. Once the desired portion of the sacrificial layer 126 is removed and the top layer 116 has the support at the periphery then the top layer 116 can buckle when the stress is compressive. If the stress is just tensile to keep the top layer flat it will not buckle. However if tensile stress is overly increased, then the top layer 116 membrane will break. Hence there is a need for the right amount of tensile stress. Generally, this has been found to be in the order of 50 Mega Pascal. Important considerations in suspending the top layer 116 in the manner described include the structure of the device and the stress. In the described embodiment, the stress is tuned to the right order by pre-annealing.

A stress gradient effect exists, which is a kind of differential stress born due to thermal or deposition history of the film. This can be very easily tackled by the described embodiment. In this regard, the actuating membranes are supported at all sides hence they are only affected by the mean stress variations. Any design, such as those of the prior art, which incorporate long arms to suspend the mirrors is highly likely to be affected by stress gradient in the long arms.

It should be appreciated that, rather than being done as a post-deposition process as in the embodiment, the stress may be tuned to the appropriate level during deposition of the top layer 116 by using a deposition technique that provides the required stress.

As mentioned above, it is important that the suspended membrane of a quarter wave mirror in a Fabry-Perot filter, such as the top layer 116, is under residual tensile stress to maintain flatness. If the residual tensile stress is excessively high it can rupture the membrane. The inventors have found that for a residual stress ranging from 60 MPa to 100 MPa, silicon and germanium thin film based membranes of size less than or equal to 500 $\mu m^2$ could remain flat without rupture. For membranes of size larger than 500 $\mu m^2$ up to a few $mm^2$ a residual tensile stress ranging from 30 MPa to 60 MPa was the most appropriate to provide flatness to membranes. Due to the large size of these membranes a higher residual stress was sufficient to lead to rupture of the membranes. As the device size increases, the tensile stress range decreases in value.

This range of residual tensile stress in the deposited thin films can be obtained by either in-situ optimization of deposition parameters or post-deposition treatments, such as the described annealing process. In typical inductively coupled plasma chemical vapour deposition (ICP-CVD) based deposition, the available control parameters are deposition temperature, deposition pressure, the combination of gases and their flow rates, and RF (radio frequency) power used. For example, the inventors achieved 30 MPa to 100 MPa range of residual tensile stress during deposition ub two way. Firstly, by changing ICP power in the ICP-CVD reactor while keeping other parameters constant and secondly, by changing the deposition temperature while keeping other parameters constant.

The annealing method as for example described above was adopted for the tuning of residual tensile stress in cases where the deposition process resulted in compressive residual stress. For a particular recipe we attained 30 MPa to 100 MPa range by annealing from 280° C. to 320° C.

In the embodiment, the method also comprises optimizing the deposition of at least one of the material layers of the reflector 110.

Optimization of Deposition

The inventors conducted research seeking optimization of mechanical and optical properties of silicon to provide a basis for selection of a silicon recipe to be used for the fabrication of the mirror 112. As will be described in further detail, the film stress, optical properties, and deposition rate were optimized by control of the deposition parameters and thermal annealing conditions of the silicon.

In the described example, the silicon layers were fabricated using an inductively coupled plasma chemical vapor deposition (ICPCVD) reactor. Particularly, silicon deposition for the work was performed by the inventors using a SI500D ICPCVD system from SENTECH Instruments GmbH, in which the maximum allowed deposition temperature is 300° C.

Note that the silicon deposited in the ICPCVD process is amorphous. As such, material parameters in the examples were expected to vary from that of ideal crystalline silicon.

For investigation purposes into optimization of the ICP-CVD deposition, thin films of a-Si were deposited by the inventors on three substrates, as follows: (1) 320 μm thick <100> oriented silicon wafers for thickness measurements; (2) 280 μm thick R-plane sapphire substrate for characterisation of optical properties; and (3) 70 μm thick <100> silicon wafers for stress characterization. A simple benchtop optical transmission measurement system was used to measure optical transmission spectra of the layers on sapphire substrates at room temperature. This system allowed single point optical measurement across the 550 nm-2200 nm spectral range with a beam spot characterized by full width at half maximum (FWHM) of 500 μm. The inventors used general-purpose software for optical characterization of thin films, NKD Matl [24] software, to extract the refractive index and extinction coefficient of the deposited silicon thin films from the measured transmission data. The effect of back-side reflections was also included in the modelling performed by the inventors.

The thickness of the silicon thin films was measured by the inventors using a Veeco Dektak100 surface profiler. A Zygo Newview 3D optical surface profiler was used by the inventors to measure the radius of curvature of the silicon films deposited on the 70 μm thick <100> silicon wafers and surface profile of the membranes. Stress measurements were extracted by the inventors from the radii of curvature of the 70 μm thick <100> silicon wafers, measured before and after deposition and after any thermal annealing process, discussed in further detail below.

Figure 5A:
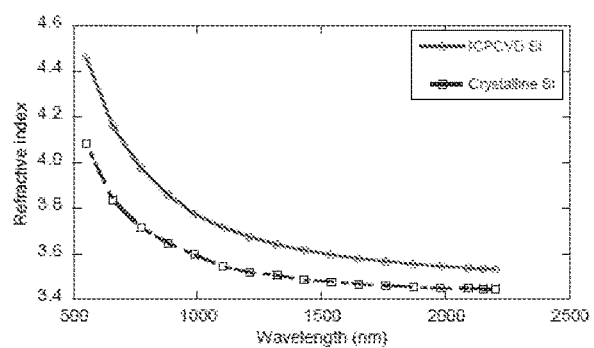
FIGS. 5A and 5B depict the refractive index and extinction coefficient of ICPCVD silicon as compared to crystalline silicon (using the optical constants of crystalline silicon, taken from [10])
Figure 5B:
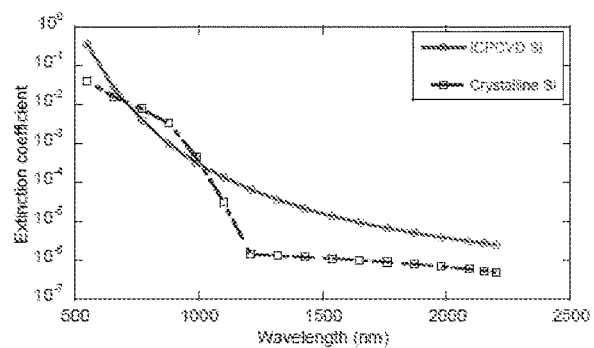

FIG. 5 shows the refractive index and extinction coefficient of the ICPCVD silicon as compared to crystalline silicon. The optical constant of crystalline silicon is taken from [10]. As depicted in FIG. 5, ICPCVD silicon films of the samples demonstrate a better refractive index than crystalline material, in terms of the refractive index being high—this improves the refractive index contrast in the mirror 112 and, thereby, improves reflectivity. However, the ICPCVD amorphous silicon films demonstrate a higher absorption (extinction coefficient) than crystalline silicon, which will increase the absorption within the mirror 112. This increased absorption in the mirror 112, when incorporated into a complete filter device, will result in a slightly degraded performance compared to a device made using crystalline silicon, predominantly at the blue end of the visible wavelengths.

Assuming uniform film and substrate thicknesses, Stoneys formula [25, 26] was used by the inventors to extract the residual stress of the example silicon thin films from the measured radii of curvature. For the ICPCVD recipe used in this study, the stress of the silicon thin film on the 70 μm thick silicon substrate was found as 76 MPa tensile. The low value of tensile stress demonstrated here is ideal for tunable optical filters or microspectrometer fabrication, based on a Fabry-Perot cavity design in which an upper mirror is suspended above a fixed lower mirror. The fact that the membranes are in tension ensures or at least assists the mirrors remain flat, while the low magnitude of stress ensures or at least assists that the top mirror and support structure do not distort or disintegrate upon release.

In the example, ICP power was used as means for optimization of the mechanical and optical properties of ICPCVD silicon.

Figure 6A:
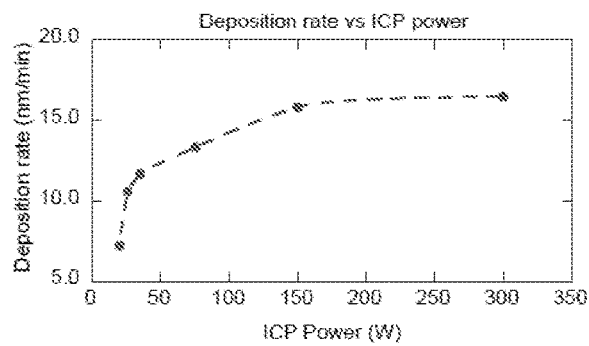
FIG. 6A depicts variation of silicon deposition rate as a function of ICP power.
Figure 6B:
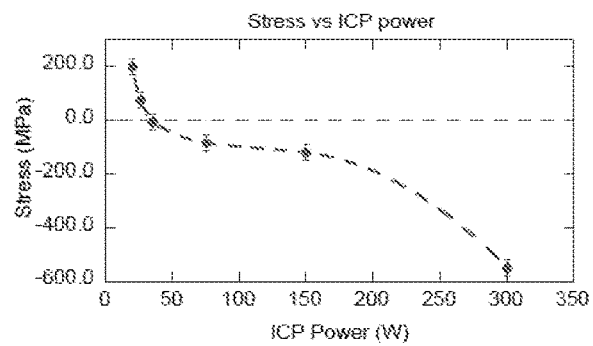
FIG. 6B depicts variation of silicon film stress as a function of ICP power (under the stress convention that tensile strength is considered positive)

FIG. 6A depicts deposition rate as a function of ICP power. It is evident from FIG. 6A that with increasing ICP power, the deposition rate increases monotonically. From FIG. 6A, the deposition rate at 20 W is 7.6 nm min$^{-1}$. The deposition rate steeply rises to 10.6 nm min$^{-1}$ when the ICP power increases to 26 W, and continues to increase to 16.5 nm min$^{-1}$ at 300 W. In FIG. 6B the stress of the example silicon thin film deposited is plotted as a function of IPC power. The stress convention used here is that tensile strength is positive whilst compressive stress is negative. With the reduction in the ICP power, the silicon films tend to be less compressively stressed. At an ICP power of 300 W the films show 550 MPa compressive stress which reduces significantly to 120 MPa at 150 W. Further reduction to 35 W brought films to 5 MPa compressive stress, and the film starts becoming tensile as ICP power was reduced below 35 W. At 25 W silicon was found to have 76 MPa of tensile stress while at 20 W the tensile stress jumped to 200 MPa.

Figure 7A:
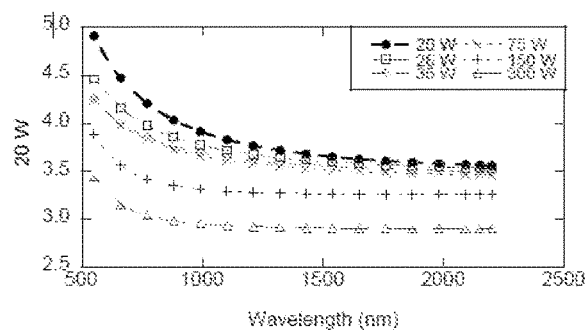
FIG. 7A depicts refractive index optical constant of silicon thin films as a function of ICP power.
Figure 7B:
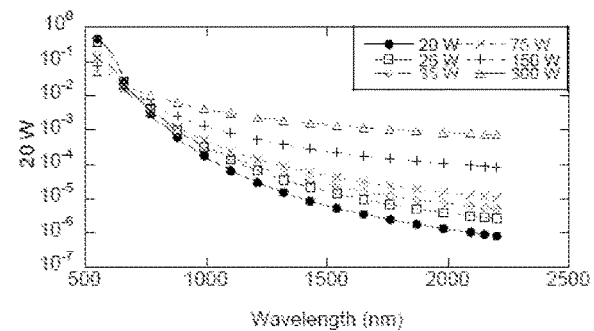
FIG. 7B depicts extinction coefficient optical constant of silicon thin films as a function of ICP power.

FIGS. 7A and 7B depicts the effect of ICP power variation on optical constants of the example silicon thin films. Particularly, FIG. 7A depicts refractive index as a function of ICP power, indicating that at 300 W, the refractive index of a silicon film at a wavelength of 2000 nm was 2.90. With reduction in ICP power, the refractive index of the films keeps increasing and at 20 W ICP power at a wavelength of 2000 nm the refractive index reaches to 3.57. FIG. 7B depicts extinction coefficient as a function of wavelength with variable ICP power. The extinction coefficient of the silicon film at 300 W at 2000 nm was $7:4\times10^{-4}$. With the reduction in the ICP power the extinction coefficient of the films decreases. At 20 W ICP power at 2000 nm it was reduced to $8:24\times10^{-7}$.

The work by the inventors shows that reduction of ICP power leads to progressive increase in tensile stress and refractive index and progressive decrease in the extinction coefficient.

This work relating to the optimization of mechanical and optical properties of silicon was used by the inventors to provide the basis of selection of the silicon recipe to be used for the fabrication of example mirrors 112 according to the embodiment of the invention.

Mirror Fabrication

Using the method, the inventors fabricated a large area mirror array, comprising sets of mirrors 112 circular in shape, with diameters of 270 μm, 320 μm, 370 μm and 420 μm, i.e. ranging in diameter between 270 μm and 420 μm. In the array, example mirrors 112 of each size were fabricated in two rows with each row containing 8 mirrors 112, with center-to-center separation of each mirror being 750 μm. Subsequently each cell consisted of 64 mirrors with a total of 256 mirrors being fabricated in a single process run. The inventors research revealed that both 20 W and 26 W ICP power produces tensile stressed silicon films with good optical properties. Furthermore the inventors research revealed that between 20 W and 26 W ICP power there is sharp increase in the deposition rate. Considering the tradeoff involved in the deposition rate, mechanical and optical properties, the mirrors were fabricated with deposition parameters of silicon shown in Table 1 below.

TABLE 1

| Silicon deposition recipe used for mirrors | | | | |
|---|---|---|---|---|
| ICP power (W) | Pressure (Pa) | Dep. temperature (° C.) | SiH$_4$ flow rate (sccm) | He flow rate (sccm) |
| 26 | 4 | 300 | 5 | 95 |

It is to be appreciated that the invention is not limited to the uses, materials, dimensions, shapes, and deposition technique and parameters of the embodiments and examples described. The fabrication process of the invention achieves a tensile force in the suspended top layer 116 allowing mirrors from a few square micrometers in area up to many square millimetres in area to be constructed without any internal supporting structures. Mirrors formed according to embodiments of the invention can be of any planar shape, including regular shapes such as square, rectangular, circular, and hexagonal, and irregular shapes. The mirror can be any shape and size that suits the application. In cases where a detector array is square shaped it may be best to use a square shaped configuration.

The polymer used as the sacrificial layer 126 to create the cavity 118 was Polyimide, PI 2610, from HD microsystem. Selection of an organic sacrificial layer advantageously allows an O2 plasma be used to dry etch the sacrificial material, and thus avoid stiction issues associated with the wet release of sacrificial layers. As per the manufacturer data sheet, PI 2610 can be spun and hard baked to a thickness less than 1 µm. For fabricating an air spaced SWIR mirror operating in the range of 1600 nm-2000 nm, the inventors have found that thickness of the sacrificial layer 126 needs to be in the range of 400 nm-500 nm. In the example, PI 2610 was 50% diluted by N-Methyl-2-pyrrolidone solvent to attain the thickness required for forming air cavity in SWIR mirror. In the example, the polyimide was soft baked at a temperature of 100° C. for 5 min and hard baked at temperature 300° C. for 20 min. Since all depositions were done at 300° C., the hard baking temperature for the polyimide was selected as 300° C.

Figure 8:
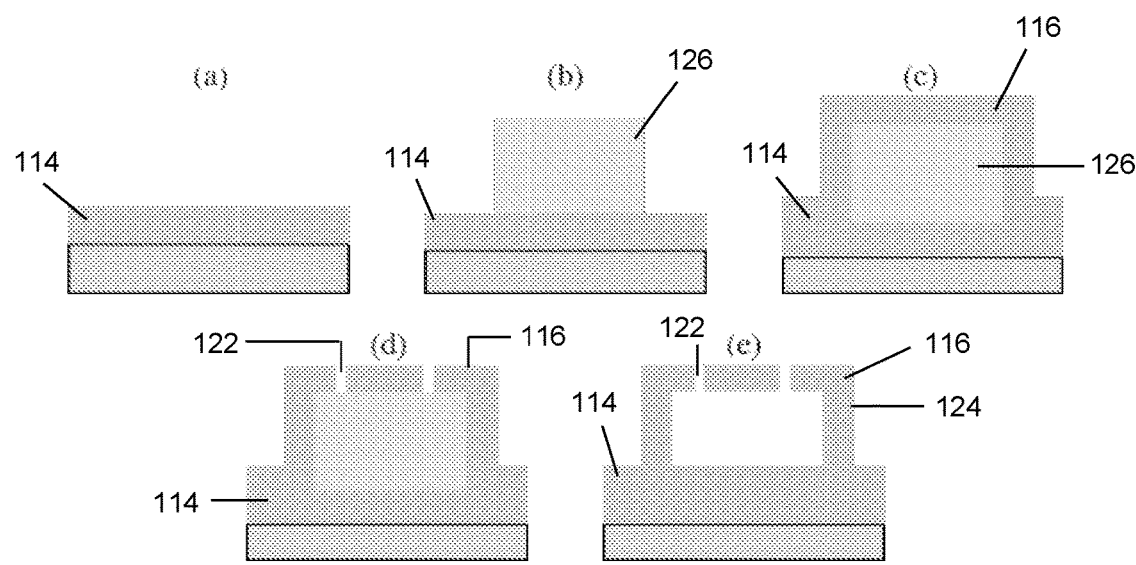
FIGS. 8A-8E depict mirror fabrication design flow diagrams for producing an example of the air-gap mirror of FIG. 3.

An example implementation of the embodiment of the method of the invention as hereinbefore described is depicted in FIGS. 8A to 8E. Initially, as depicted in FIG. 8A (deposition of silicon thin film on sapphire substrate), the bottom layer 114, in the form of a 142 nm silicon layer, was deposited on a base layer of material in the form of a transparent substrate, comprising a 280 µm sapphire substrate. In FIG. 8B (spinning, hard-baking and patterning of polyimide), polyimide was spun at 2300 rpm, soft baked at 100° C. for 5 min and then hard baked at 300° C. for 20 min. Dry etching of polyimide was used to pattern it as the sacrificial layer 126. The thickness of the sacrificial layer 126 was 400 nm. All dry etching steps were completed using an Oxford Instrument Plasmalab 100 reactive ion etcher. The polyimide was etched with etching parameters shown in Table 2, below.

TABLE 2

Recipe for etching PI 2610

| RF power (W) | Pressure (Pa) | Dep. temperature (° C.) | O$_2$ flow rate (sccm) | CF$_4$ flow rate (sccm) |
|---|---|---|---|---|
| 26 | 2.67 | 26 | 30 | 3 |

With the parameters in Table 2 the polyimide etch rate was 200 nm/min. Introducing a small quantity of the CF4 reduces the roughness of the polyimide during the etching. A second 142 nm silicon layer was deposited on top of the sacrificial layer 126 to form the top layer 116 as depicted in FIG. 8C (deposition of the second silicon thin film on top of polyimide). Then, as shown FIG. 8D (patterning the etch holes through the top silicon membrane), the top layer 116 was perforated with 4 µm diameter etch holes 122. The etch recipe for the silicon is shown in Table 3 below. With these parameters etch rate of silicon was 120 nm min$^{-1}$.

TABLE 3

Silicon etch recipe used in fabricating mirrors

| ICP power (W) | RF power (W) | Pressure (Pa) | Temperature ° C. | CF$_4$ flow rate (sccm) |
|---|---|---|---|---|
| 400 | 100 | 4 | 25 | 34 |

For the mirror deposition conditions shown in Table 1, the as-deposited stress of silicon films on a silicon substrate is slightly tensile. To ascertain the stress in a film on a particular sacrificial layer, stress diagnostic structures such as cantilevers, double clamped beams and Guckel rings are commonly used [27-29]. In their research the inventors used similar stress diagnostic structures to find the stress state of silicon on polyimide. Based on these structures the stress of silicon of the top layer 116 on the polyimide sacrificial layer 126 was found to be compressive. The inventors found that performing a treatment comprising post-deposition annealing of the top layer 116 converted this compressive stress to tensile stress. A series of annealing experiments were performed by the inventors in a quartz tube furnace in a nitrogen gas (N2) environment keeping the annealing time fixed at 30 min. The inventors found during their research that at 285° C. the stress diagnostic structures showed that the layers convert to tensile stress. If the stress diagnostic structure are annealed at 285° C., in the N2 environment in a quartz tube furnace for 30 min, before release, the released structures are tensile. Based on the findings of these experiments, the fabricated devices were annealed at 285° C. in a N2 environment in a quartz tube furnace for the 30 min, before removal of the sacrificial layer 126. The sacrificial layer 126 was then etched in an O2 plasma in a Barrel Asher with 160 W, RF power and 133.3 Pa chamber pressure. Removal of the sacrificial layer 126 left the top layer 116 membrane suspended over the bottom layer 114 thus forming the air cavity 118 (of 400 nm in the example) as shown in FIG. 8E (annealing and dry release of mirror in the O2 plasma).

Quality of the fabricated SWIR mirrors was quantified by the inventors through optical characterization (of the mirror array). As will be described, the optical characterization of mirrors demonstrated a near theoretical distributed Bragg reflector for the SWIR wavelengths.

Figure 9:
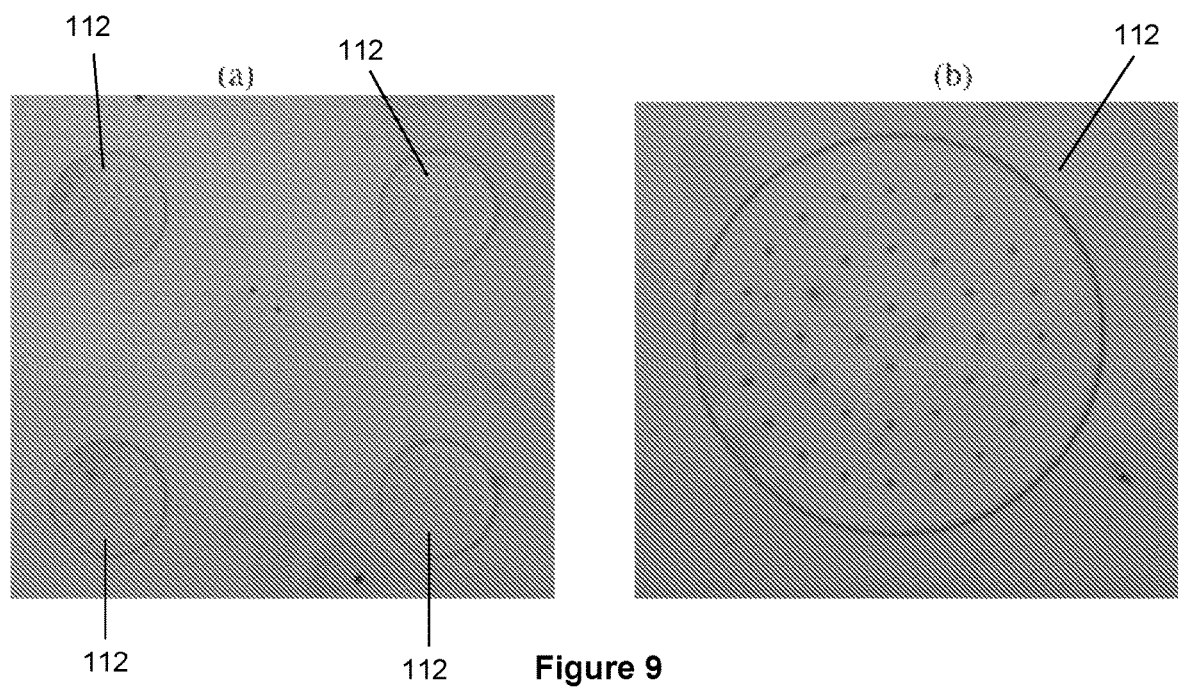
FIGS. 9A and 9B depict micrographs of a fabricated array of four mirrors and a close look at a single mirror of the array, respectively.

In the example, the characterization comprised (1) optical microscopy, (2) white-light surface profilometry, and (3) measurement of optical reflectance. Microscope images relating to a group of four of the example released mirrors 112 are shown in FIGS. 9A and 9B. Particularly, FIG. 9A shows an array of four, 270 µm diameter mirrors 112 and FIG. 9B shows a close-up image of a single mirror 112 (at the top right of the mirror array).

Figure 10:
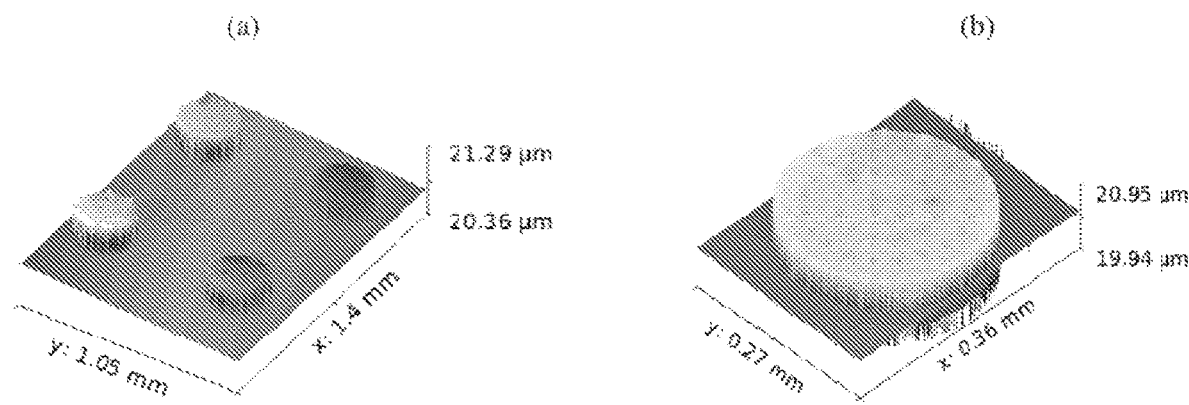
FIGS. 10A and 10B depict 3D surface profiles of the fabricated array of four mirrors of FIG. 9A and the single mirror of the array of FIG. 9B, respectively.
Figure 11:
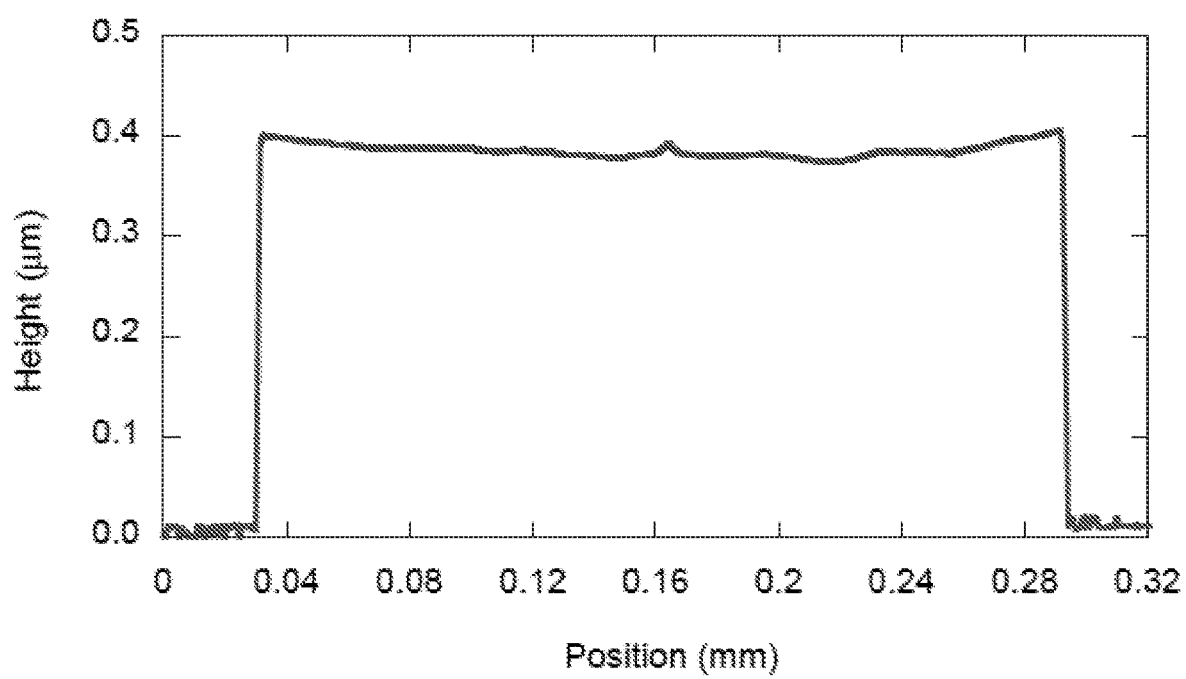
FIG. 11 depicts a cross-sectional surface profile of the mirror depicted in FIG. 10B.

A 3D surface profile of the mirror array depicted in FIG. 9A is shown in FIG. 10A and that corresponding to FIG. 9B is shown in FIG. 10B. A line scan across a diameter of the mirror 112 is shown in FIG. 11, from which the flatness variations, across the surface of the 270 µm mirror 112, was found to be in the range of 20 nm. The low bowing in the top membrane 116 highlights the efficacy of the described fabrication process in producing ultra-flat mirrors. Accordingly, this spatially resolved optical transmission map of the 2D mirror array demonstrates a high degree of mirror-to-mirror uniformity across the entire array.

Figure 12:
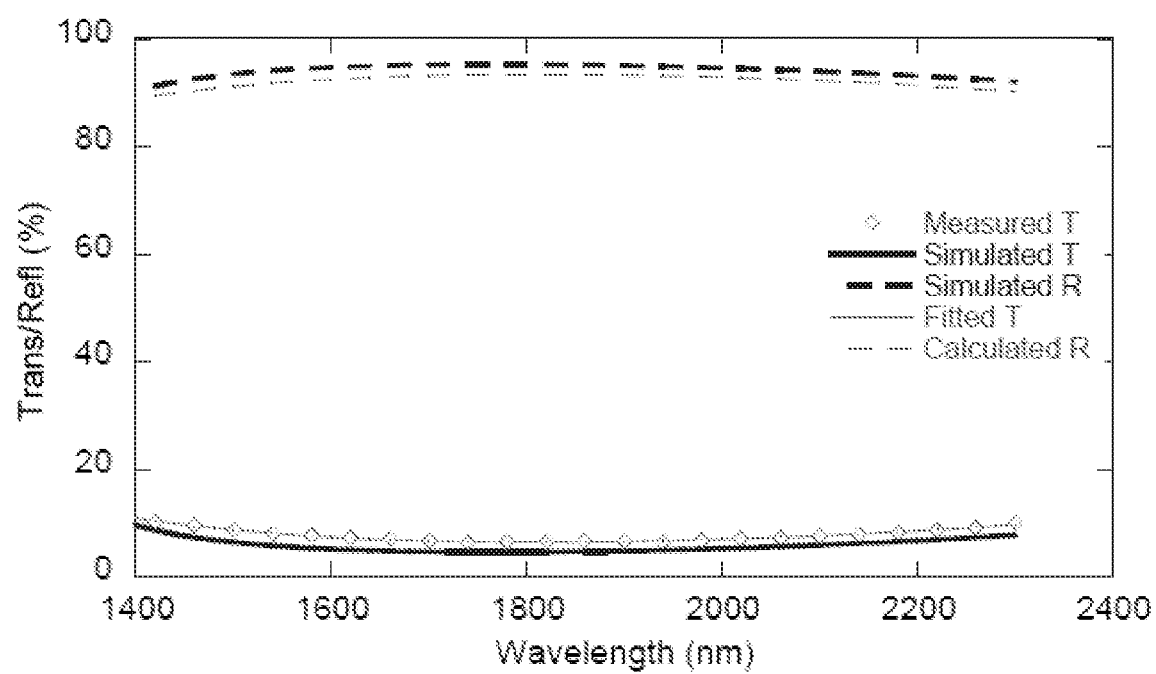
FIG. 12 depicts mirror transmission and reflection.

The optical transmission of a fabricated quarter-wave mirror 112 was investigated by the inventors using an in-house developed optical metrology system. This system enabled measurement of calibrated spectral transmission, in the 1400 nm to 2600 nm spectral range. A light beam of the system was focused to a spot size of 25 µm on the surface of the mirror 112. FIG. 12 of the drawings shows the calibrated single point transmittance measurement through the mirror 112 and fitting to extract the reflectance. The simulated transmission profile was obtained by the optical transfer matrix method [30] assuming an ideal flat mirror profile with no back reflections from the substrate 111, using material optical data measured during initial characterisation of the silicon deposition recipes as hereinbefore described. This example simulation also used layer thicknesses measured during mirror fabrication, and predicts a best-case reflectivity of 95%.

The inventors also used the optical transfer matrix model to fit the measured transmission data ("Fitted T" in FIG. 12)

based on the structure of the mirror 112. This fit provides a better estimate of the actual thicknesses and optical material parameters of the layers and, as a result, provides a better measurement of the actual reflectivity ("Calculated R") of the mirror 112.

Based on this fit, a transmission minimum of 6.4% was measured in the wavelength range of 1400 nm to 2300 nm by the inventors in the example. It can be concluded that the fabricated distributed Bragg reflector yields a reflectivity of approximately 93%. This compares very well to the best-case reflectivity of 95%.

By their work in relation to the first described embodiment of the invention and examples thereof, the inventors showed that by dilution of PI 2610 polyimide, sacrificial layers of desired thickness can be achieved, and with pre-released annealing, stress on the top membrane can be made tensile. Thereby, ultra-flat mirrors can be fabricated. The optical characterization of the fabricated example mirrors demonstrated effective optimization of the fabrication process with only 20 nm variation of flatness across the mirrors. The calibrated optical transmission measurements of the mirrors yielded a 93% reflectivity, as compared to 95% ideal reflectivity. Spatially resolved spectral transmission measurements of the mirror array showed very little variation in the minimum transmission across a 6.0 mm×2.0 mm physical grid.

The inventors expect that replacing both of the bottom mirror 16 and the top mirror 18 of the prior art MEMS tuneable optical filter 12 as hereinbefore described with mirrors 112 will significantly increase the bandwidth of operation of the MEMS tunable optical filter 12 from being limited to wavelengths of 1.5µ to 5.0µ to operating in the range of 0.5µ to 5.0µ. Furthermore, the inventors anticipate that the suspension of the mirror 112 will increase the resolution of the MEMS tunable optical filter 12 from 50 nm at 2.0µ centre wavelength to 25 nm.

Mirrors operating from 0.54µ to 5.0µ have been fabricated and optically characterized. They all give near theoretical performance.

By an appropriate choice of sacrificial material, deposition parameters, and, if needed, annealing conditions, embodiments of the invention make it possible to fabricate silicon-air-silicon DBRs, of hundreds of microns in lateral dimension, that satisfy most if not all requirements for operation in the SWIR wavelength band.

Figure 13A:
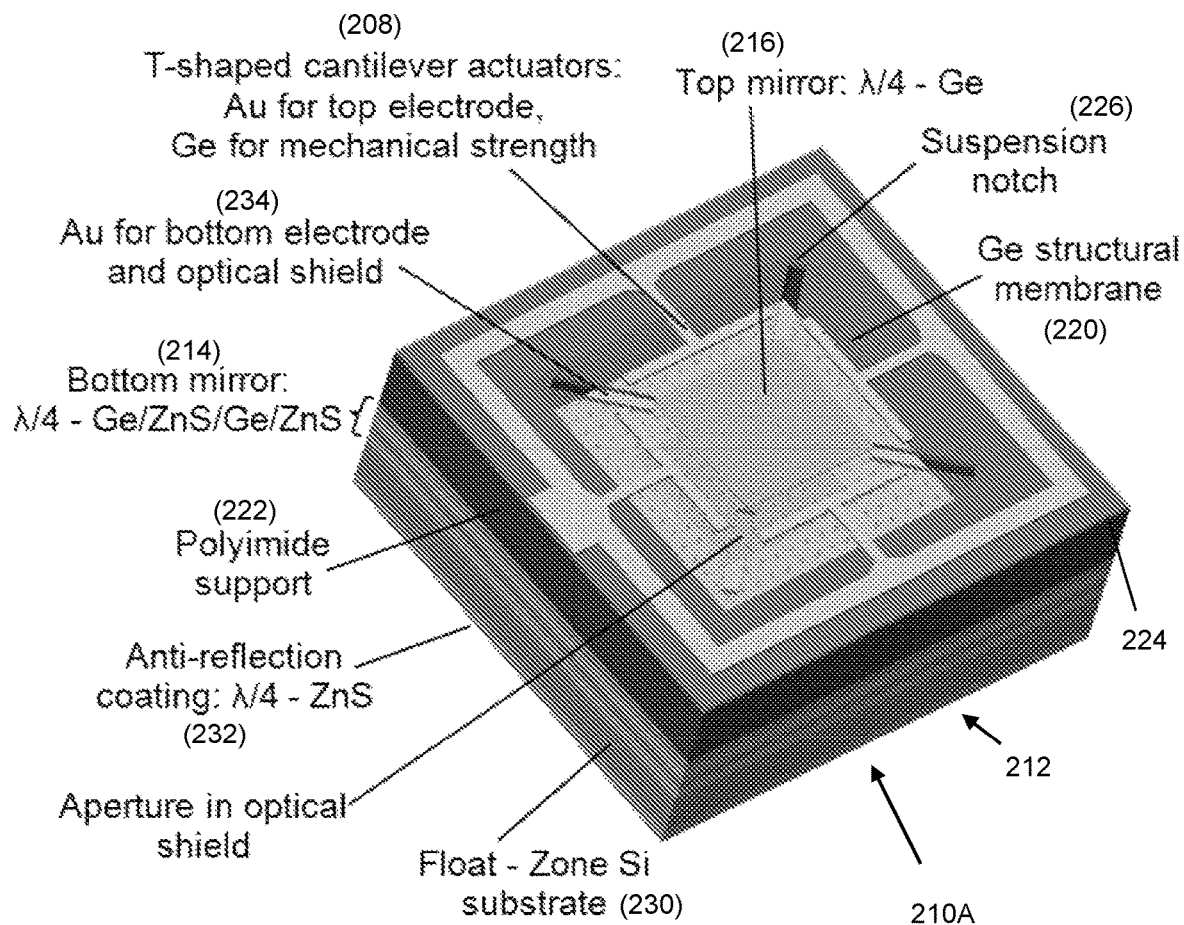
FIG. 13A depicts a schematic view of a filter fabricated in accordance with an embodiment of the present invention.
Figure 14:
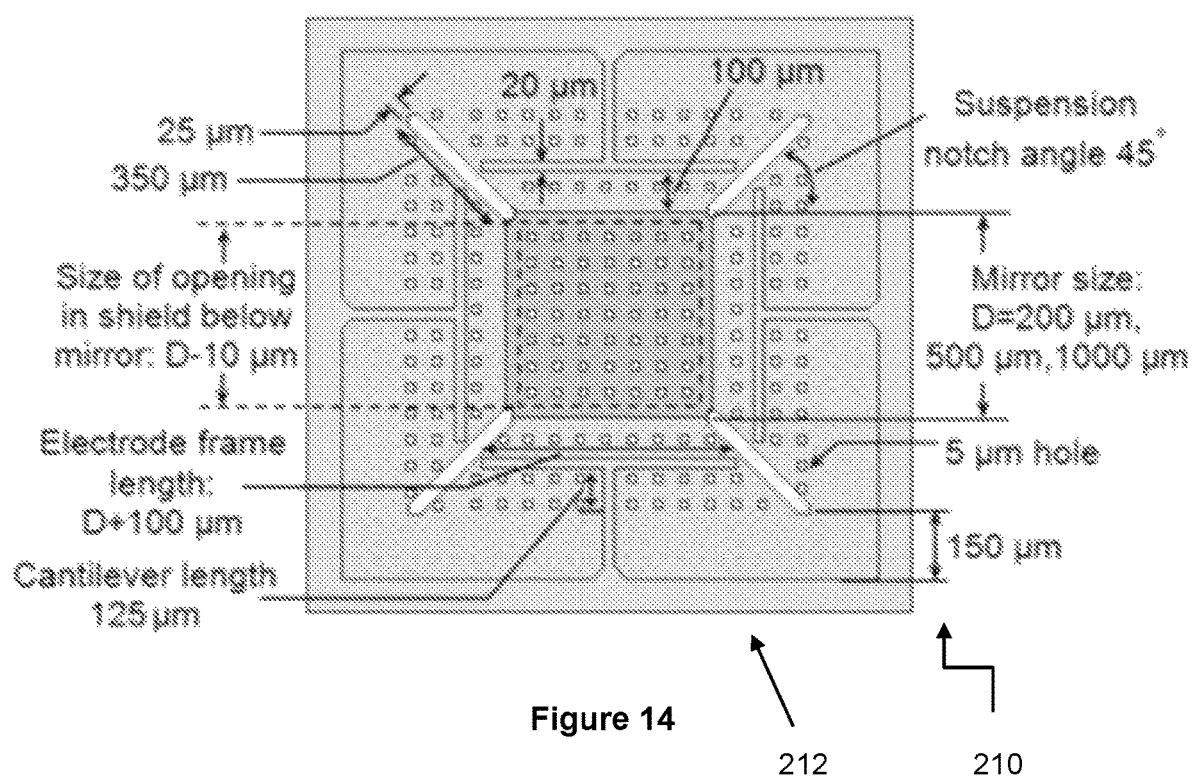
FIG. 14 depicts a structural layout of the filter of FIG. 13A.

In FIGS. 13A and 14, there is depicted a second embodiment of a microelectromechanical system, or a part thereof, fabricated using a method in accordance with an aspect of the present invention. In the second embodiment, the microelectromechanical system, or the part thereof, is an actuator 208 and device 210A.

The actuator 208 has direct application for use in tunable Fabry-Perot optical filters. In this regard, an actuator 208 formed according to the embodiment of the invention may be used with, and form part of, a detector device for detecting incident radiation at particular wavelengths, replacing the actuator assembly of the microspectrometer 10 as hereinbefore described, for example.

Embodiments of the method significantly improve the yield and performance of such prior art devices. The prior art actuation mechanism is based on the beam, tether, and mirror combination as herein described. Such a mechanism is very susceptible to the stress induced deformation specifically due to the presence of stress gradient in the tethers. As will be described in further detail below, embodiments of the method provide a very different way of holding/suspending the moveable membrane that can significantly reduce the fabrication steps and provide the resulting structure with increased immunity to gradient stress induced deformations.

In the embodiment, the device 210A comprises a filter in the form of a tuneable MEMS Fabry-Perot filter 212. The filter 212 has a pair of reflectors, one being a fixed first (or "bottom") mirror 214 and the other being a moveable second (or "top") mirror 216 suspended/held above the fixed bottom mirror 214.

The top mirror 216 is disposed in opposed spaced relationship to the bottom mirror 214 to form a cavity 218 therebetween.

As will be described in further detail, the device 210A has been adapted from the previously developed prototype [15], with a number of significant changes in structure design aimed at achieving flat mirrors without the need of sophisticated stress management, thereby producing spectral characteristics required by herein described LWIR multispectral imaging applications (≥50% peak transmission and 0.5-1 µm FWHM). The issue of bowing in the top mirror 216 is addressed by means of a single-layer tensile-strained membrane structure, as will be described in further detail.

To realize full-range tuning (8-12 µm) for a first-order filter of the embodiment described, the cavity gap has to be controlled over a large distance from initially 6 µm to 4 µm. As will be described in further detail, with electrostatic beam actuators, such as shown in FIG. 13A, excessively high control voltage will arise, due to considerable gap length between electrodes and large displacement range. Rather than using complicated MEMS structures to minimize the actuation voltage as in the prior art, the inventors have examined the design parameters associated with electrostatic actuators, with an ideal actuator model and corresponding analytical forms described to guide the design. The described approach promisingly drives the filter 212 towards the low voltage target in examples of the embodiment.

Filters designed in accordance with embodiments of the invention release the restrictions of stress gradient to fabricate flat mirrors, significantly improving the process yield. Compared to other devices reported in the literature, filters of embodiments of the invention exhibit wider tuning range, higher transmission and moderate bandwidth, all of which better meet the performance requirements of a tunable filter for herein described multispectral imaging applications as summarized in Table 4 below. As will be described in further detail, excellent agreement has been demonstrated by work of the inventors between optical modelling, measured transmission and measured displacement data, confirming the validity of modelling approach and the measurement methods of the embodiment. In Table 4, SNR is defined as Signal to Noise Ratio and ROIC is defined as read out integrated circuit.

TABLE 4

PERFORMANCE REQUIREMENTS OF TUNABLE FILTERS FOR LWIR MULTISPECTRAL IMAGING APPLICATIONS

| Parameter | Value | Reason |
| --- | --- | --- |
| Tuning range | 8-12 µm | Complete thermal band |
| Peak transmission | ≥50% | For low light conditions |
| FWHM | 0.5-1 µm | Wavelength discrimination |
| Out-of-band rejection | ≥10:1 | Optimization of SNR |
| Tuning voltage | ≤30 V | Compatibility with ROIC |

Optical Modelling

The top mirror 216 comprises a single layer of germanium (Ge). The bottom mirror 214 comprises a fixed silicon substrate comprising alternating layers of Ge/ZnS/Ge/ZnS. The Ge and ZnS layers of the bottom mirror 214 layers are designed to be of quarter-wave thickness at a design wavelength of 10 μm the embodiment. Using experimental values of refractive indices [46] previously determined by the inventors, that is, 4.0 for Ge and 2.0 for ZnS, the inventors determined the quarter-wave thickness of Ge and ZnS to be 625 nm and 1250 nm, respectively. Because refractive index of ZnS (2.0) approximates the square root of that (3.4) of silicon substrate, a backside quarter-wave ZnS layer is also coupled as an anti-reflection coating in the embodiment, with the aim of eliminating multiple reflections at the substrate-air interface.

Figure 15:
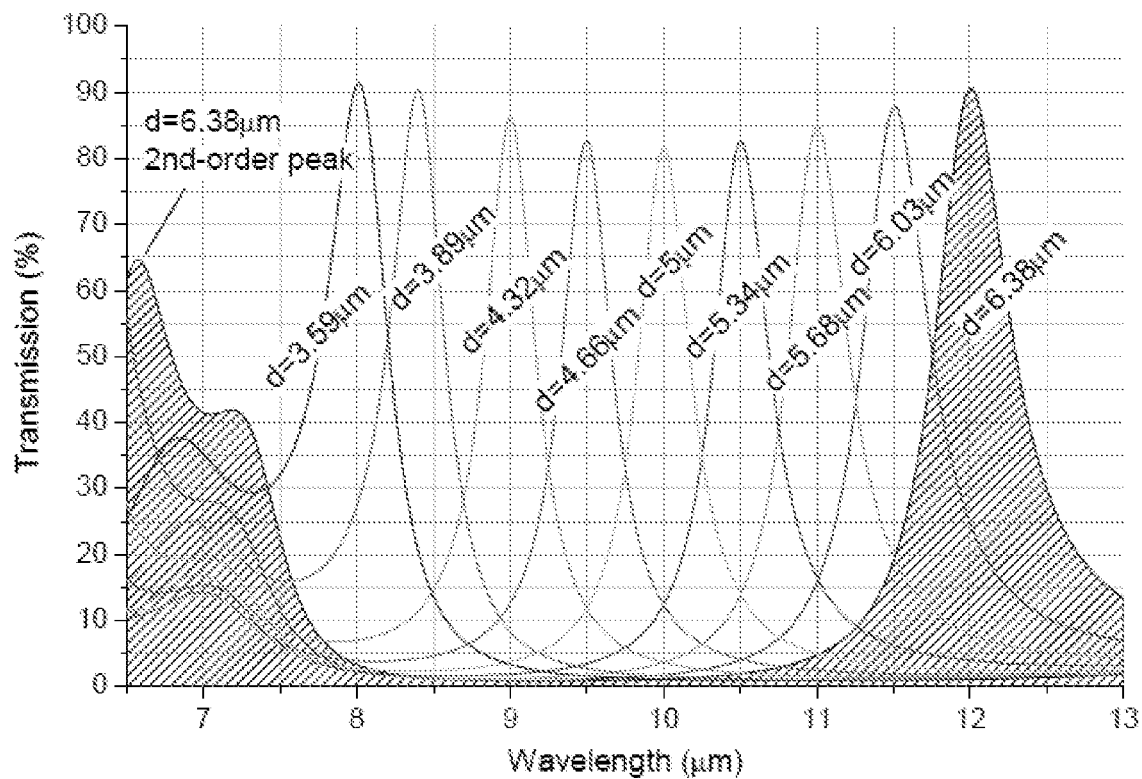
FIG. 15 depicts modelled tuning spectra of the filter of FIG. 13A.

To design an asymmetric filter as such, with the top mirror 216 having less periods and being much less reflective than the bottom mirror 214, despite providing a superior solution to minimise spectral broadening caused by mirror bowing, a relatively wide spectral bandwidth resulting from a less resonant cavity would still be expected. FIG. 15 shows the ideal transmission, which is calculated using the optical matrix model [47]. FIG. 15 depicts modelled tuning spectra of the filter 212, neglecting mirror defects such as tilt or bowing. The wavelength can be tuned from 12 μm down to 8 μm by changing the mirror separation (between the bottom mirror 114 and the top mirror 116) from 6.38 μm down to 3.59 μm. These calculated spectra indicate that the filter 212 of the embodiment is capable of achieving peak transmission higher than 80%, bandwidths of about 0.5 μm and out-of-band rejection better than 40:1 across the entire 8-12 μm tuning range. These figures optimally meet the optical values listed in Table 4, proving the filter an application-wise design, providing that the suspended top mirror 216 of the real filter 212 is free of any defects. It is also evident that in order to tune the first-order wavelength from 12 μm to 8 μm, the mirror separation must change from 6.38 μm to 3.59 μm. This increase in the required distance is a result of optical phase changes on the reflection from the mirror surface [48].

Structural Layout and Fabrication

Fabrication including treatment of the top mirror 216 will now be described. The top mirror 216 is formed on a moveable, flexible membrane 220 disposed in spaced relationship to the bottom mirror 214. Accordingly, in the described embodiment, a single-layer tensile-strained Ge membrane advantageously functions as both the structural support and the top mirror 216. The perimeter of the membrane 220 of the top mirror 216 is anchored at a support structure 222 comprising a portion of a below polyimide sacrificial layer 224 remaining after fabrication of the device 210A, as depicted in FIG. 13A, and described in further detail below. An advantage of this structure design is that tensile stress inherent in membrane material will tend to apply stretching to the layer, and thereby the whole membrane stays flat, eliminating the need of stress management.

Suspension of the top mirror 216 includes one or more portions of the membrane 220 being removed. In the embodiment, these one or more portions comprise openings in the form of diagonally arranged notches or slits 226 in the membrane 220, providing an actuating area. The role of the notches or slits 226 is to relieve the convergence of two directions of stress thereby preventing buckling of the membrane 220 at the corners, as well as reducing spring stiffness of the membrane 220, thereby facilitating the actuation of the filter 212.

An array of holes 228 (of dimensions 5 μm×5 μm in the embodiment) perforated in the membrane 220 aims to facilitate a sacrificial layer etching process during fabrication of the device 210A, allowing the filter 212 to be fully released within a short time and, therefore, preventing cracks forming in the Ge membrane 220 due to overheating from over-exposure to reactive gas plasma of the etching stage. It is to be noted that, in embodiments of the invention, one can use etch slots distributed around the perimeter to etch the sacrificial layer through plasma release or wet etching. Alternatively one can use silicon oxide as sacrificial layer and dry or wet release in HF vapour or HF solution.

Figure 13B:
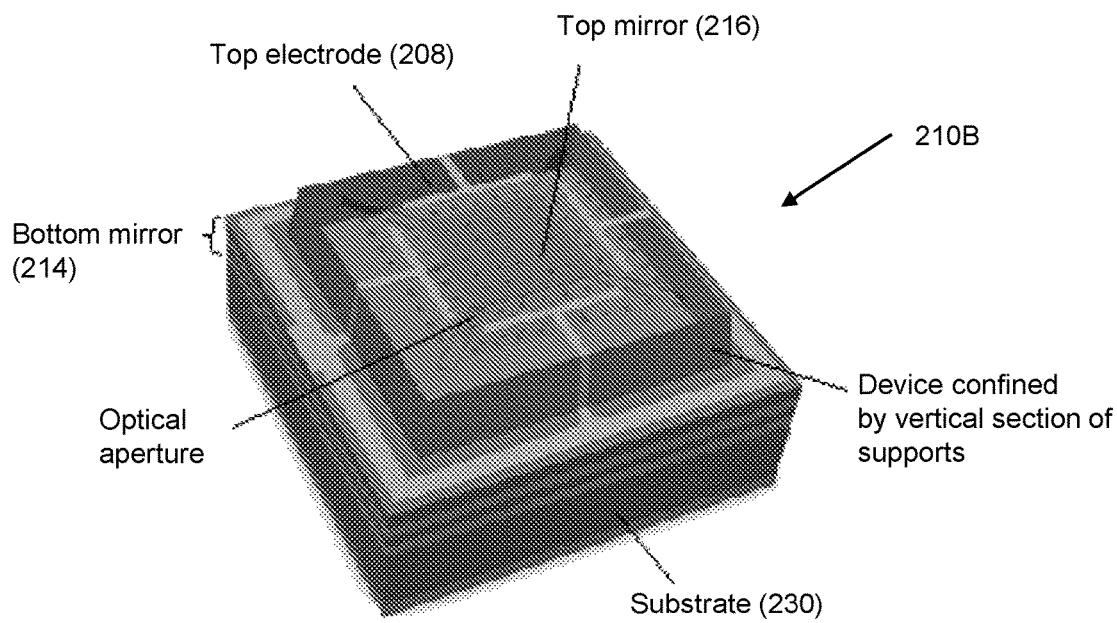
FIG. 13B depicts a schematic view of an alternative filter fabricated in accordance with an embodiment of the present invention.

FIG. 13B shows a device 210B which illustrates an alternative design of the device 210A shown in FIG. 13A. In this particular example of the device 210B, the polymide support 222 of the filter 212 is omitted. As a consequence, the optical and actuation region of the device 210B is confined by vertical supports around the periphery of the device 210B.

FIG. 14 provides the structure layout as well as critical dimensions of the device 210A of the embodiment, where central mirror region of the top mirror 216 is highlighted and holes 228 are exaggerated for illustration purposes.

The layout of the filter 212 of the second embodiment is applicable, at least, to filters of size 200 μm times 200 μm, 500 μm times 500 μm, 1000 μm times 1000 μm. The scaling of the electrode and membrane sizes can be done for even larger areas.

As in the case of the first embodiment of the invention herein described, it will be appreciated that the invention is not limited in regard to the materials used in constructing the filter 212 nor its layout, and in alternative embodiments, materials additional and/or alternative to those described may be used, as may other layouts.

For example, the top mirror 216 can comprise a silicon-air-silicon distributed Bragg reflector (DBR), such as was described in the first embodiment of the invention, single layer mirror or multi-layer DBR. The actuating area can be made from the materials making the top mirror 216 (i.e. DBR in implementations where such is provided).

For example, where non-silicon materials are used for one, more, or all layers of the mirror, it may comprise a germanium-air-silicon mirror. Devices may be constructed using such mirrors. For example, a Fabry Perot filter comprising such an air-spaced not-all silicon mirror, for either or both mirrors of the filter, may be fabricated in an embodiment of the invention. In other embodiments of the invention, higher order mirrors, with more layers, constructed from silicon and/or other materials, may be fabricated, such as a germanium-air-silicon-air-germanium mirror. Devices may be constructed using such higher order mirrors, such as, for example, a Fabry Perot filter comprising a higher order mirror, for either or both mirrors of the filter.

Also as in the case of the first embodiment, filters 212 formed according to embodiments of the invention can be of any planar shape, including regular shapes such as circular, regular polygonal shapes such as square, rectangular, and hexagonal, and irregular shapes.

Prior to experimental realization of the filters, all optical materials involved were carefully researched by the inventors in terms of wavelength range of operation and microfabrication process compatibility. For the visible to short wave infrared wavelength range sapphire was selected as the substrate due to its very low absorption in these wavelength ranges. The strong absorption band at 9 μm makes standard Czochralski (CZ) silicon substrates unsuitable for LWIR applications [49]. As such, a Float-Zone (FZ) silicon substrate was chosen by the inventors as the alternative for fabricating LWIR filters. For the filters operating from visible to midwave infrared wavelength the optimal deposition condition of ICPCVD silicon was identified. For example filter 212 optimal deposition conditions of Ge and ZnS were established and optical properties of these materials were also well characterized [46], [50]. Based on previous research, quality Ge films were deposited via electron beam evaporation at room temperature, and durable ZnS films were deposited via thermal evaporation with the substrate held at 150° C., with Ge and ZnS films deposited a quarter-wave thickness of 625 nm and 1250 nm, respectively.

Example filters 212 were fabricated by the inventors using the surface micromachining technique. According to the fabrication method, first, a quarter-wave Ge/ZnS/Ge/ZnS bottom mirror 214 was deposited on a substrate in the form of a FZ silicon wafer 230, followed by the evaporation of another quarter-wave ZnS layer on the backside of the wafer 230 substrate as an anti-reflection coating 232. Following thermal deposition of a thin 5-nm chromium (Cr) adhesion layer, a 100-nm gold (Au) layer was then deposited by thermal evaporation and patterned using lift-off process to provide a set of four first (or "bottom") electrodes 234 for actuating the device 112. In addition to acting as the bottom electrodes 234, the Au layer functions as an optical shield to block any stray light from leaking around the filter 212. An opening in the Au layer defines the optical aperture of the filter 212, with aperture size 10 µm laterally smaller than the top mirror 216, avoiding stray light due to any misalignment error. Accordingly, a 10 µm smaller optical path is opened through the backside optical signal blocking metal shield. Next, to achieve a thick sacrificial layer required by the LWIR resonance, the sacrificial layer 224 comprising polyimide was spun on the wafer 230 using a multiple coating technique, forming 5.93-µm, 5.89-µm and 5.72-µm thickness for 200-µm, 500-µm and 1000-µm example filters 212, respectively.

The sample was then coated with a quarter-wave Ge membrane layer, forming the top mirror 218 and membrane 222. Subsequently, a 5-nm/30-nm Cr/Au layer was deposited and patterned via a lift-off process, forming a set of four second (or "top") electrodes 236 for actuating the device 210A. Patterning of the notches 226 and the hole 228 array was accomplished by dry etching the samples in CF4/O2 plasma.

The array of holes 228 defines the suspended membrane area. Any unwanted optical signal or stray light transmitted through the hole array 228 is blocked by a corresponding Au square array of 8 µm times 8 µm size metallic optical blocking pads 229 included in the bottom electrode 234 layer.

Figure 16:
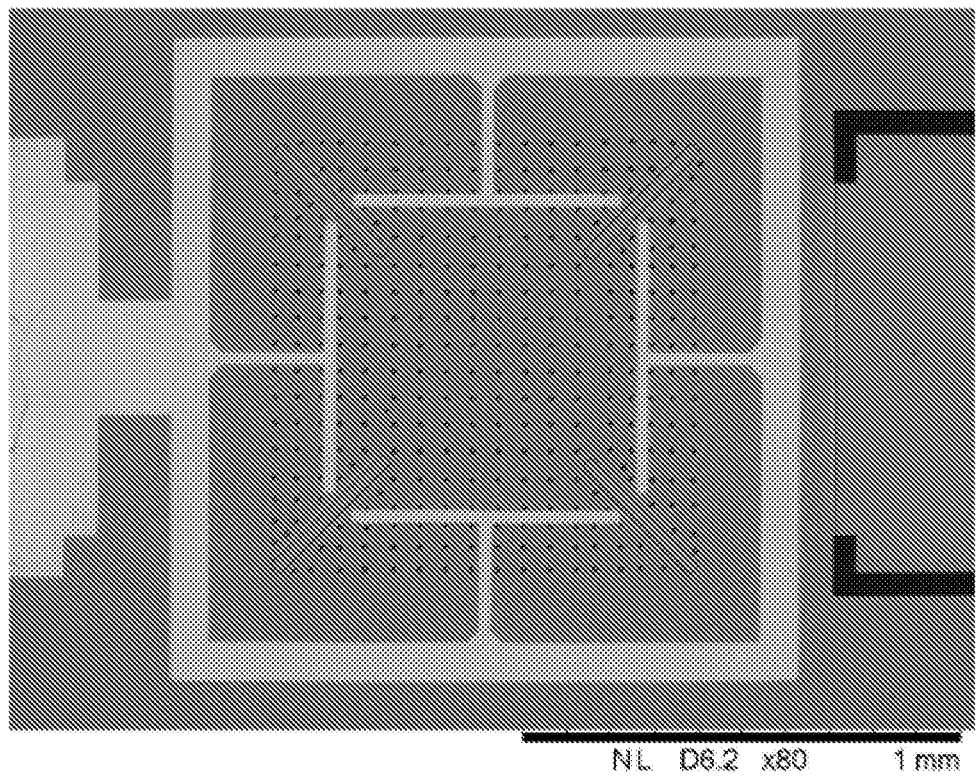
FIG. 16 depicts a scanning electron microscope (SEM) image of a 500-μm example of the filter of FIG. 13A.

The membrane 220 and top mirror 216 were released by sacrificial etching polyimide of the sacrificial layer 224 defined by the hole array 228 using O2 plasma, leaving the rest of the polyimide sacrificial layer (i.e. remaining after the etching) as structural support. Example filters 212 with different mirror 214, 216 sizes of 200 µm, 500 µm and 1000 µm, but with identical membrane 220 thickness of 625 nm were fabricated. They are labelled as D200 µmMT625 nm, D500 µmMT625 nm and D1000 µmMT625 nm, respectively, in the pertinent drawings. A scanning electron microscope (SEM) image of filter D500 µmMT625 nm is provided in FIG. 16.

Figure 25:
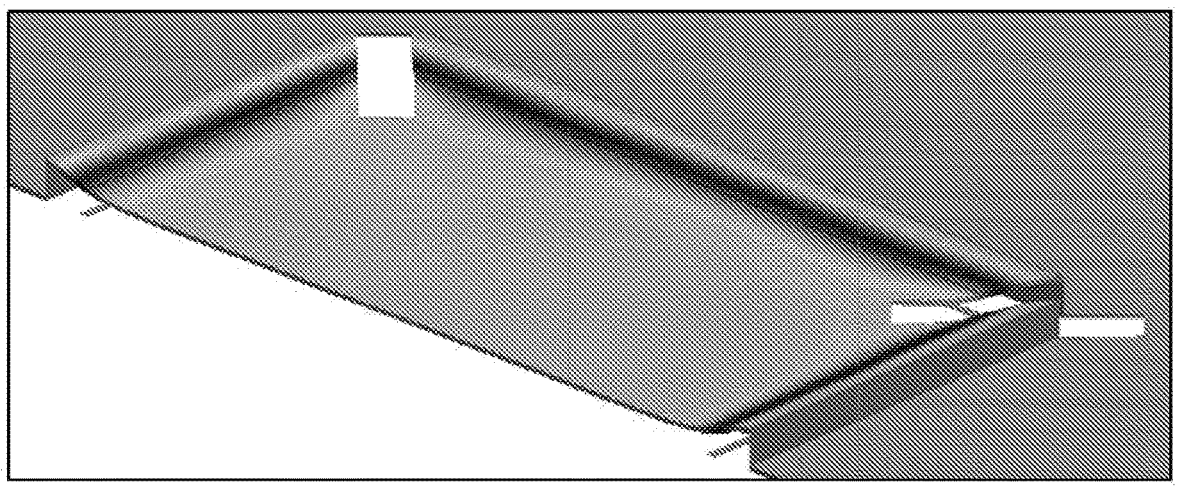
FIG. 25 depicts a perspective view of the membrane of the filter of FIG. 20 in the actuated state.

It can be seen that the four top electrodes 236 and four bottom electrodes 234 provide symmetric actuation movement to the top mirror 216 between a first state comprising an "unactuated" position and at least a second state comprising an "actuated" position to tune the filter 212. A specific feature of the top mirror 216 in the embodiment are the notches 226 at the four corners of the top mirror 216. These notches 226 free the top membrane 220 to actuate and move from the first position to at least the second position without causing distortion of the membrane 220 and the top mirror 216. Such distortion may take the form of "bed sheet like" buckling. FIG. 25 shows a 3D perspective view of actuated membrane 220.

Determination of where the notches 226 are to be put is made on the basis of where the distortion of the membrane 220 while it is actuating can be reduced or actually removed (by a portion of the membrane 220 being excised). For the square shaped membrane 220 of the embodiment, since the four top electrodes 236 are used along the edges of the top mirror 216, the vertices or corners are the most likely to buckle due to motion. Hence a notch 226 is created on each corner. In the same way, for a triangular arrangement of electrodes, with a triangular shaped mirror/membrane in the center thereof, the notches will be at the three corners of the mirror/membrane, for a pentagon shaped mirror/membrane with five electrodes at the five edges, the notches will be at the five corners of the pentagon, and so on. Essentially, the notch at each corner preserves the shape of the mirror in the center.

It is to be appreciated that, whilst having the number of electrodes and notches proportional to the number of edges/sides of the shape of the mirror/membrane may provide better performance, the invention is not limited in this regard. Alternative embodiments of the invention may vary in the number, shape, and/or positioning of the electrode(s) and portion(s) removed from the mirror/membrane.

Embodiments of the invention may comprise a heterogeneous combination of mirror/membrane shape, electrodes, and notches. For example, a pentagon air-gap mirror may be provided with 4 electrodes and 4 notches (as in the case of the described second embodiment) but this will have less actuation range of operation without any mirror distortion, compared with the described case where the mirror/membrane is square shaped. It is anticipated that whilst such configurations may work, eventually the mirror/membrane of such a configuration will get distorted.

In another embodiment using a circular mirror/membrane, actuating electrode(s) may be preferably positioned in a circular manner. If straight actuation electrodes as present in the described second embodiment configuration are used, then 4 notches may be required to let the mirror/membrane actuate without distortion.

For improved performance, the inventors have found that it is best to use a homogeneous configuration, where the number of notches is equal to the number of corners of the mirror/membrane shape and the number of electrodes is equal to the number of edges/sides of the mirror/membrane shape.

Whilst in the described embodiment the notches are formed by removing portions of the membrane material, it will be appreciated that in alternative embodiments of the invention, the membrane may be appropriately shaped whilst being formed such that the notches are created as part of the formation process. It should also be appreciated that, in embodiments of the invention, the notches may extend into the top mirror 216, and may take the place of the etch holes of the array 228. Etching through the notches or additional slots outside of the optical area, rather than the etch holes, however, may be more time consuming.

It is to be appreciated that improved performance may be achieved by having as much of a periphery of the membrane about the mirror attached and in contact with the electrode(s) as possible, with portions of the membrane removed only at locations where, if such attachment and contact was to be made, it would result in distortion of the membrane 220 and the top mirror 216 during actuating movement. In such embodiments, contact between the periphery of the membrane about the mirror and the electrode(s) is sought to be maximised to the extent possible, allowing for removal of the portions of membrane required to prevent distortion of the membrane 220 and the top mirror 216 during actuating movement.

Characterisation

Figure 17A:
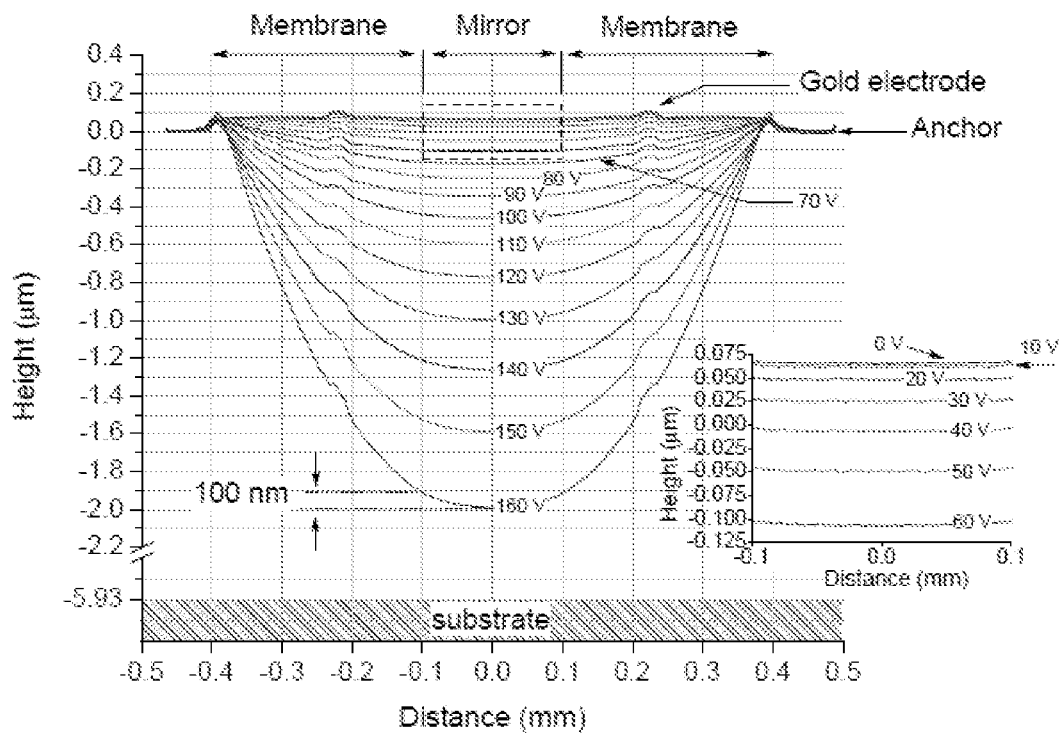
FIGS. 17A, 17B, and 17C depict membrane deflection measured by optical profilometer during actuation of examples of the filter of FIG. 13A.
Figure 17B:
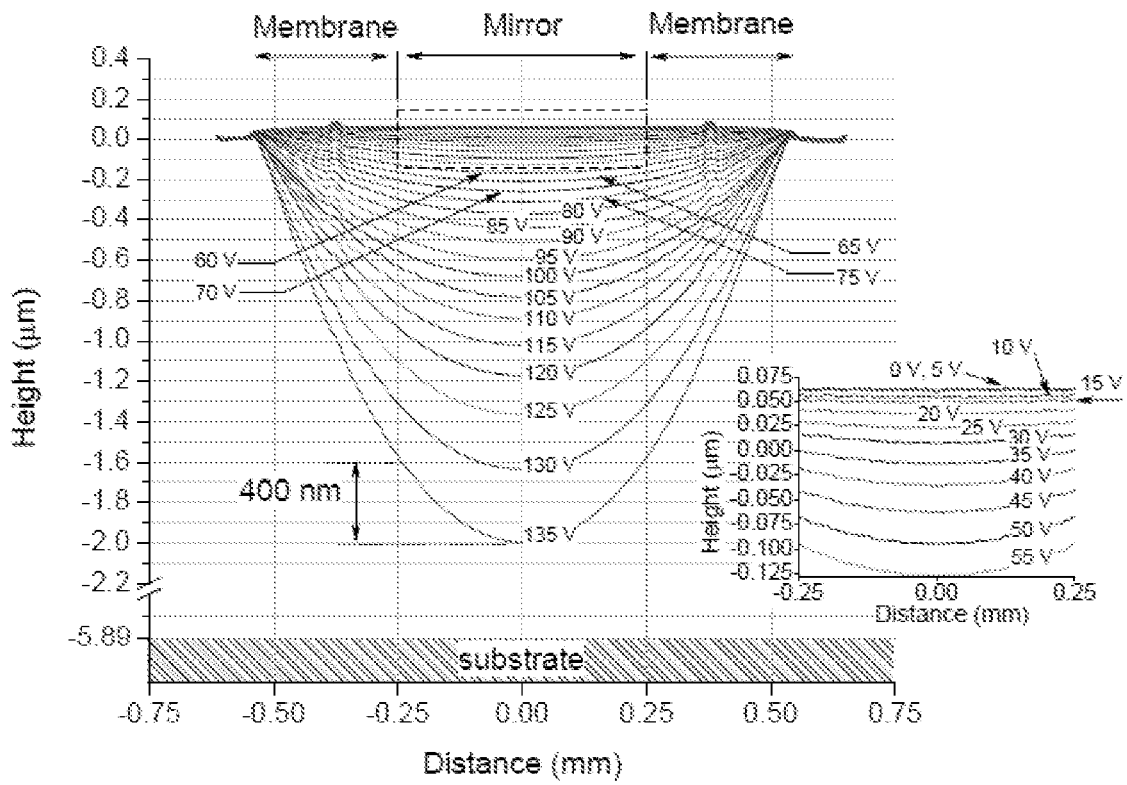
Figure 17C:
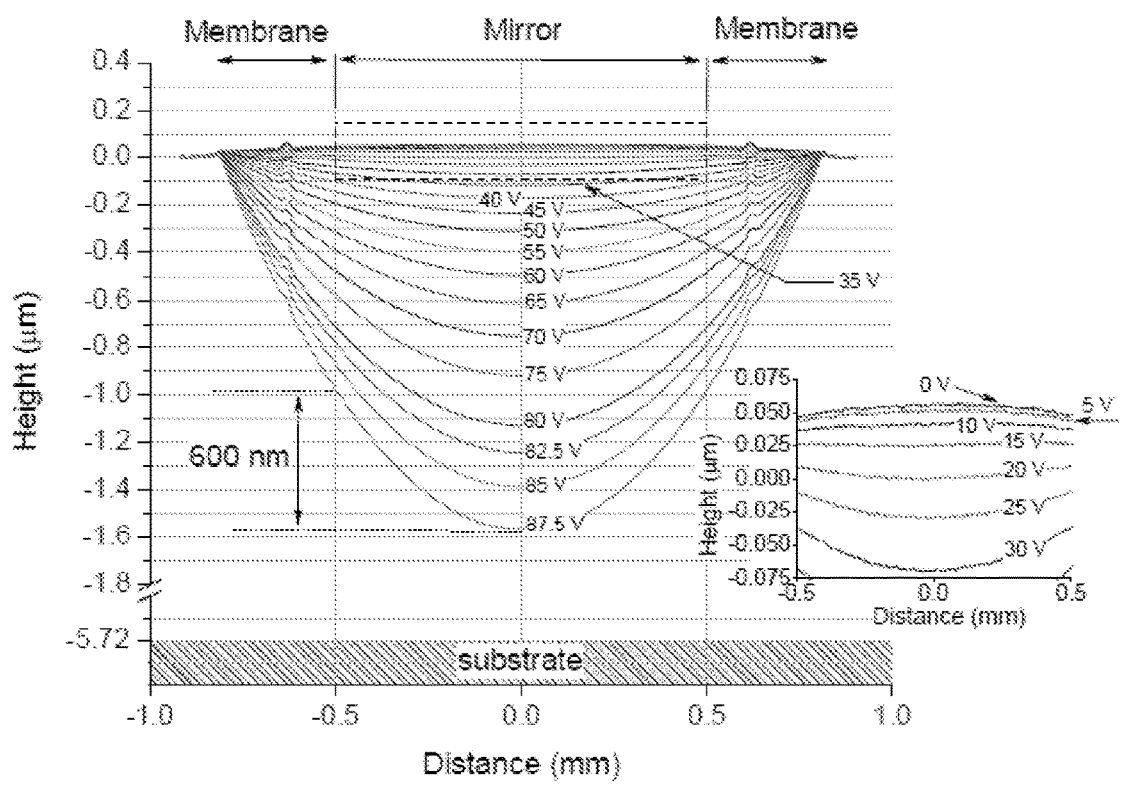

To completely characterize the fabricated filters and assist in validating the developed optical model of the filter transmission, 3D topographical images (height maps) of the fabricated example filters 212 during actuation were first measured by the inventors using an optical profilometer. FIGS. 17A, 17B, and 17C show a set of membrane deflection traces extracted from these images. Particularly, FIG. 17A shows membrane 220 deflection measured by optical profilometer during actuation of filter D200 µm MT625 nm, FIG. 17B shows membrane 220 deflection measured by optical profilometer during actuation of filter D500 µmMT625 nm, and FIG. 17C shows membrane 220 deflection measured by optical profilometer during actuation of filter D1000 µmMT625 nm.

This data reveals information on the top electrode 236 profile, the deflection of the support membrane 220 and bowing amplitude of the central mirror region of the top mirror 216. The central mirror region consists of a single-layer of Ge whereas the outer structural membrane 220 is covered with Au electrode stripes of the top electrode 236, as a result there is a 50-70 nm uplift for as-released membrane 220 relative to the anchor plane, due to the tensile stress gradient of Au/Ge. As evident in insets of FIGS. 17A, 17B, and 17C, central mirrors of three example filters 212 in a rest state exhibited superior flatness at nanometer scale. This is believed by the inventors to be attributed to the particular structural design of the filters 212. Ignoring the outer membrane region, in the early stage of actuation with applied voltages less than a critical value of 110 V, 55 V and 30 V for individual filter 212, the bowing of the central mirror is less than 25 nm. As the actuation voltages for these filters 212 reached beyond these critical points, significant increase in bowing occurred, with the largest mirror bowing of 100 nm, 400 nm and 600 nm being measured at 160 V, 135 V and 87.5 V for 200-µm, 500-µm and 1000-µm filter 212, respectively. Further increasing the actuation voltages resulted in mechanical breaking-down of the membrane 220 and damage of the devices 210A, before electrical snap-down happens, limiting optical tuning range. The inventors believe that this phenomenon is most likely due to severe deformation of the fragile membrane material Ge, although further investigation is required to clarify the issue. Moreover, as indicated in FIGS. 17A, 17B, and 17C, all example filters 212 exhibited negligible mirror tilt over the entire tuning range.

The optical transmission of example filters 212 during actuation was measured by the inventors using Fourier Transform Infrared Spectroscopy (FTIR). According to this method, first, a reference sample consisting of 190-µm, 490-µm and 990-µm through-silicon square holes (identical to the optical aperture of the filter 212) was fabricated using deep reactive-ion etching method with a 200 nm aluminium (Al) as the etching mask. This Al layer also acted as the light shield in a later optical reference measurement, described in further detail below.

Figure 18A:
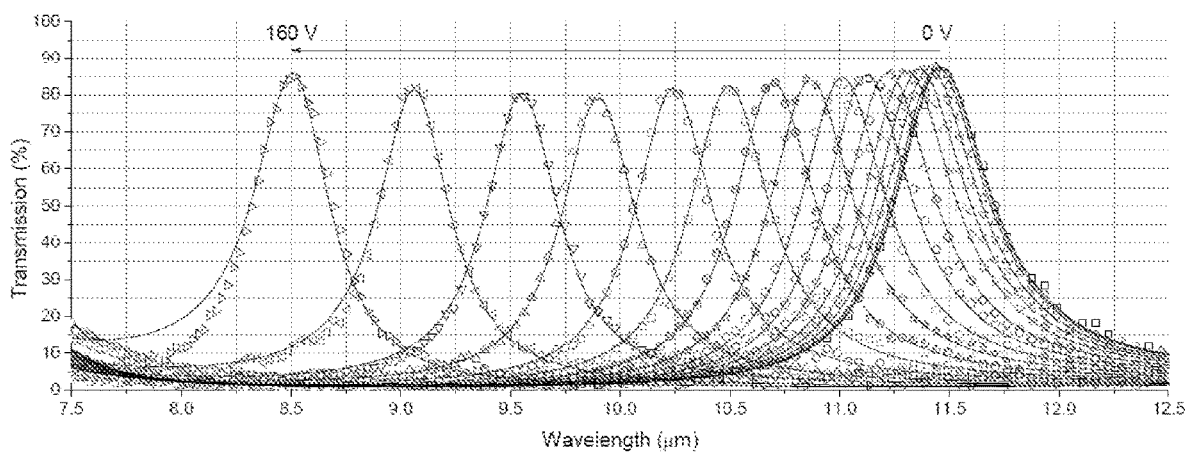
FIGS. 18A, 18B, and 18C depict transmission measured by FTIR (points) during actuation of examples of the filter of FIG. 13A, compared with transmission calculated from optical modelling (solid lines)
Figure 18B:
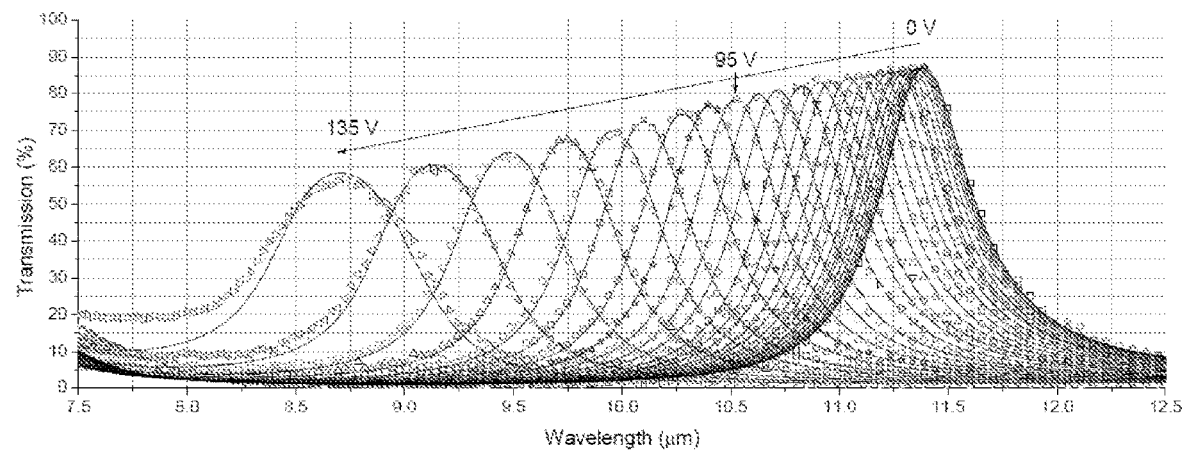
Figure 18C:
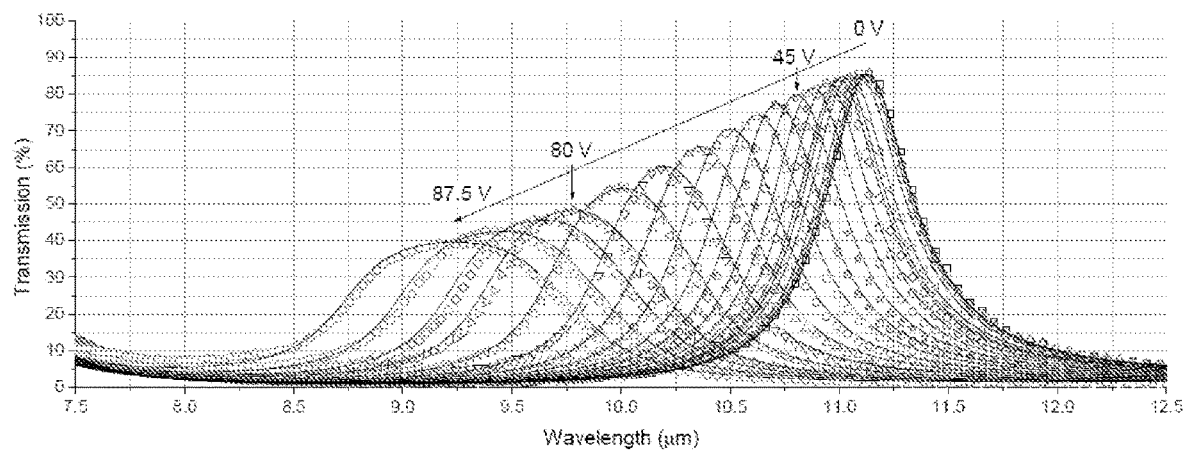

Intensity of incident light falling on the hole opening was then measured, and this intensity was divided by an area correction factor accounting for hole array perforated in the top mirror 216 to obtain a reference spectrum. The transmitted intensity through filters 212 was then recorded while the same set of actuation voltages used for membrane deflection characterization was applied, and these measurements were normalized by the reference spectrum to yield the filter transmission. The measured tuning spectra for three example filters are presented as points in FIGS. 18A, 18B, and 18C. Particularly, FIG. 18A shows transmission measured by FTIR (points) during actuation of filter D200 µmMT625 nm, FIG. 18B shows transmission measured by FTIR (points) during actuation of filter D500 µmMT625 nm, and FIG. 18C shows transmission measured by FTIR (points) during actuation of filter D1000 µmMT625 nm, compared with transmission calculated from optical modelling (solid lines) as described herein. Overall, the fabricated filters exhibited low wavelength tuning efficiency during initial actuation. This is consistent with the low mechanical tuning efficiency observed in FIGS. 17A, 17B, and 17C. The discrepancy in the zero-voltage wavelength for the three example filters 212 is due to the different sacrificial layer thickness. FIG. 18A presents the tuning results for the 200-µm example filter 212. The measured tuning range was 11.44-8.5 µm using a maximum voltage of 160V, which is approximately 1 µm less than the target range of 12-8 µm, limited by the thinner sacrificial layer 224 deposited and the mechanical breaking-down of the top Ge membrane 220. The peak transmission of the example filter 212 was measured to be greater than 80% over the entire tuning range, and the filter 212 also exhibited a consistent FWHM value of approximate 500 nm and an out-of-band rejection of 40:1. Exact match of these measured spectral figures to the design values (in FIG. 15) is in accordance with the noticeable mirror flatness of the filter 212 over tuning, suggesting the 200-µm filter 212 as an optimal tunable filter for use in LWIR multispectral imaging applications.

The variation of transmission peak and FWHM due to mirror bowing is a clear trend in tuning spectra of the 500-µm and 1000-µm example filters as seen in FIGS. 18B and 18C, respectively. For both of these example filters 212, design spectral characteristics (namely, transmission peak of 80%, FWHM of 500 nm and out-of-band rejection of 40:1) were only obtained over a small wavelength range (namely, 11.39-10.5 µm for 500-µm filter 212 and 11.13-10.8 µm for 1000-µm filter 212), accounting for less than one third of the entire tuning band of each filter 212. The actuation voltages that produced this tuning were 95 V for 500-µm filter 212 and 45 V for 1000-µm filter 212, respectively. Interpreting these results with filter deflection measurements in FIGS. 17B and 17C, the inventors conclude that mirror bowing less than 100 nm is a must requirement for filters to achieve the design spectral behavior of the embodiment in the LWIR wavelengths. Beyond the critical voltage that produces this 100 nm bowing, the bow in the central mirror developed considerably, leading to the broader bandwidth, lower peak transmission and degraded out-of-band rejection.

It is apparent that for the 500-µm filter 212, as the applied voltage increased to 135 V while the mirror bowing was measured to be 400 nm, the peak transmission dropped significantly to 60%, out-of-band rejection decreased to 30:1 (much less in the shorter wavelength tail) and the FWHM widened to 870 nm. Overall, the 500-µm filter 212 produced non-optimal but adequate spectral features, showing promise for use in multispectral imaging applications.

The spectral degradation caused by mirror bowing for 1000-µm filter 212 is more pronounced in comparison with the 500-µm filter 212. Measured peak transmission lower than 50% and FWHM larger than 875 nm at voltages higher than 80 V indicated excessive bowing in the mirror, as demonstrated in FIG. 17C. Interestingly, insight into the spectrum of the 500-µm filter 212, given a 3.89-µm mirror separation at 135 V (as seen in FIG. 17B), central wavelength of approximate 8.75 µm was measured in contrast to the theoretical value of 8.4 µm (as seen in FIG. 15), indicating that mirror bowing could also red-shift the position of the peak wavelength due to the mean cavity length change [51], and hence limit the filter tuning range. The inventors believe that mirror bowing in the larger devices is likely a result of the excessive conductivity in the germanium leading to partial actuation at membrane locations outside just the electrodes. In order to ameliorate this effect to at least some extent, in embodiments of the invention, the electrodes can be isolated with a thin insulating film placed between the germanium layer and the top electrodes. This would fully de-couple actuation from the optical region of the membrane, advantageously leading to improved flatness during actuation.

The modelled transmission in FIGS. 18A, 18B, and 18C was calculated by the inventors via the following method. First, the 3D topographical images of fabricated filters 212 measured from the optical profilometer were approximated as a set of closely spaced pixel-wise ideal filters. The optical transfer matrix method [47] was used to determine the transmission of each ideal filter, the contribution of which was then weighted by its area relative to the total mirror area. Finally, the overall transmission was obtained by summing all contributions. Because of the extremely high imaging resolution of the profilometer used, this modelling approach is excellent for the example described. As clearly shown in FIGS. 18A, 18B, and 18C, the modelled and the measured transmission spectra demonstrate a strong agreement, although slight mismatch occurs in the shorter wavelength tail region.

Reducing Actuation Voltage

An ideal parallel-plate actuator model and associated analytical forms to guide the filter design, aiming to minimize the voltage required to achieve 2-µm mirror displacement for 200-µm and 500-µm filters 212 will now be described.

The metal layer on the top flexible membrane 220 and the metal layer on the bottom mirror 214 of the filter 212 form the electrodes 236 and 234, respectively, of the MEMS actuator. The actuator can be ideally treated as two parallel conductive plates initially separated by an air gap d, with one fixed and the other suspended by an elastic restoring force. Assuming negligible fringing electrical fields and an ideal linear spring, the relationship between the applied voltage V and the displacement y can be expressed as [52]:

$$V = (d-y)\sqrt{\frac{2\kappa y}{\varepsilon_0 A}} \quad (1)$$

In Equation (1), A is the electrode area, $\kappa$ is the spring constant, and $\varepsilon_0$ is the electrical permittivity of air. For the described filter design, A actually includes the area of the metal frame surrounding the central mirror and the area of the radial metal arms. The spring constant $\kappa$ in this case can be approximated by considering the top electrode 136 actuators as four T-shaped cantilevers and is given by [52]:

$$\kappa = \frac{E^* w t^3}{L^3} \quad (2)$$

In Equation (2), E*, w, t, L are the plane strain Young's modulus, width, thickness and length of the cantilever beam, respectively. Equation 1 and Equation 2 indicate that the voltage required to obtain a certain displacement is determined by the structural parameters of the cantilever actuator (namely, gap distance, electrode area, width, thickness and length), together with mechanical properties of the actuator materials (namely, Young's modulus). In reality, the increase in spring constant due to the film stress has to be taken into account [52].

As process conditions in the deposition facilities available to the inventors were tightly constrained, the degree of control of material properties was limited, and therefore only structural parameters (mainly the electrode area and the thickness) were engineered by the inventors to reduce, and seek to minimize the actuation voltage in the examples described. In alternative embodiments of the invention, not subject to such limited process conditions, additional and/or alternative parameters may be varied to influence the actuation voltage and/or other characteristics of the device 210A.

Figure 19:
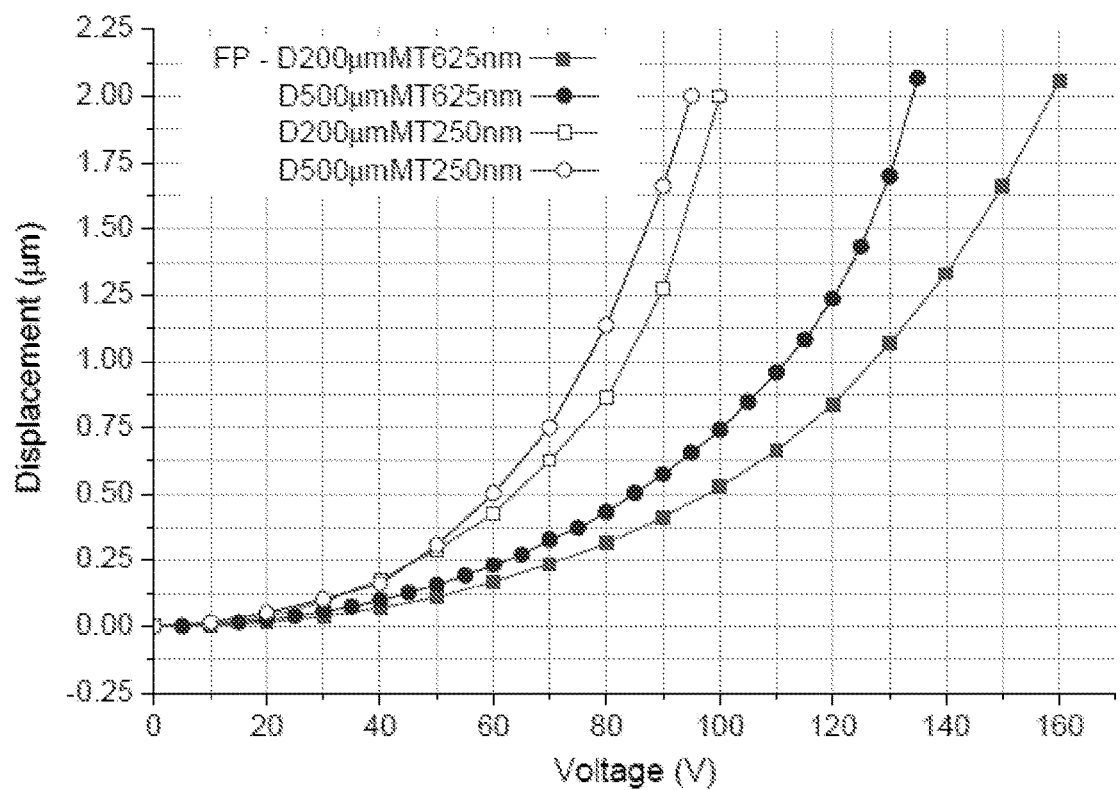
FIG. 19 depicts voltage-displacement data (at the centre of the mirror) of different example filter designs.

Based on the mechanical characterization in FIGS. 17A and 17B, voltage displacement behavior of example filters D200 µmMT625 nm and D500 µmMT625 nm were extracted and plotted in FIG. 19 (solid points). Particularly, FIG. 19 depicts voltage-displacement data (at the centre of the mirror) of the different example filter designs, measured using an optical profilometer until mechanical breakingdown of the upper Ge membrane 220. While the minimum actuation voltage necessary to fully actuate the 200-µm filter over a 2.0 µm travel distance is 160 V, only 135 V is required for 500-µm filter. The larger filter requires a lower actuation voltage, this observation agrees with Equation 1, as the larger filter has the longer metal strips deposited around the upper mirror, which correspond to a larger effective electrode area. Actuator beam thickness is another design variation that was examined by the inventors to reduce the actuation voltage. Fabrication process for sample filters was quite similar to that previously described except for the change in the deposition thickness of Ge structural membrane to 250 nm and the addition of a subsequent Ge lift-off process performed on the central mirror region to accomplish the optical design thickness of 625 nm. Two example filters were fabricated and labelled as D200 µmMT250 nm and D500 µmMT250 nm, respectively. Voltage-displacement behavior was measured for these filters and plotted in FIG. 19 (void points). There is a dramatic decrease in actuation voltage as the structural layer thickness is decreased. For instance, for 200 µm-sized filters, in comparison to the filter with 625-nm structural membrane that requires 160 V to achieve a 2 µm mirror displacement, the one with 250-nm membrane only requires 100 V to obtain the same travel distance. This is due to thinner actuator beams having a smaller spring constant as indicated in Equation 2, thereby generating less mechanical restoring force to counterbalance the attractive electrostatic force. FIG. 19 also reveals that reducing actuator beam thickness is a much more effective approach than by increasing actuator electrode area to minimize actuation voltage, since voltage V relies on $t^{2/3}$, while on $A^{-1/2}$, as indicated in Equations 1 and 2.

Overall, increasing filter size (namely, increasing the actuator electrode area) or depositing thinner structural layer (namely, decreasing actuator beam thickness) are appealing strategies for minimizing the actuation voltage.

Decreasing actuator stiffness by thinning the structural membrane thickness below 250 nm can also result in decreased mechanical strength of the support structure. The minimum reported voltage arising from the inventors work to date required to achieve a 2-µm mirror displacement is at about 100 V. As indicated in Equation 1, further reduction is expected if the cavity gap distance d is reduced, but simply adopting this approach might not be consistent with obtaining a LWIR optical resonance cavity.

Figure 1G:
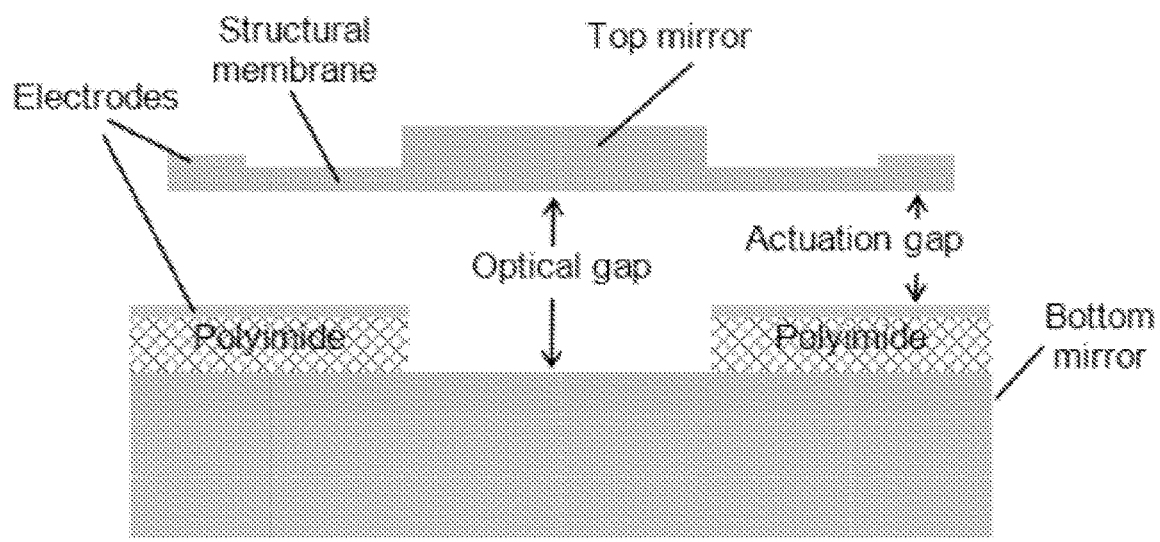
FIG. 1G depicts a structural design used to realize a shorter actuation gap while maintaining a certain optical resonant gap.
Figure 2A:
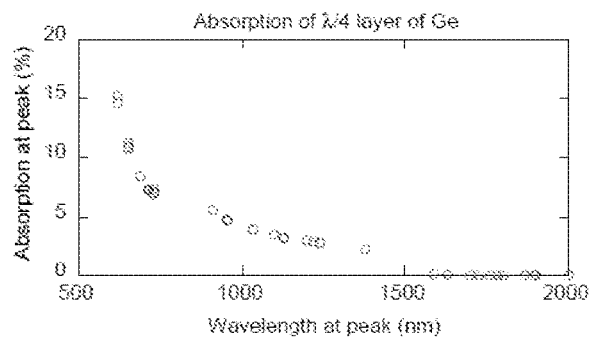
FIG. 2A depicts modelled absorption from a quarter-wave thick layer of germanium (model using refractive index and absorption data for crystalline materials, from [10])
Figure 2B:
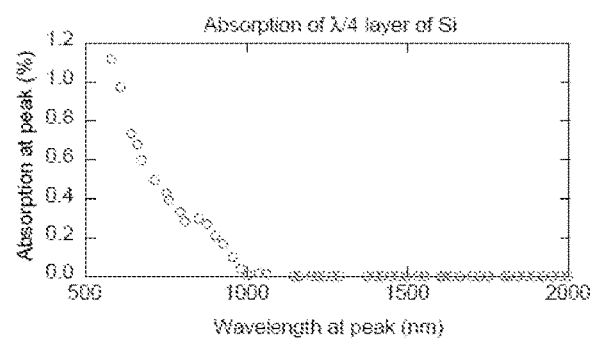
FIG. 2B depicts modelled absorption from a quarter-wave thick layer of silicon (model using refractive index and absorption data for crystalline materials, from [10])

Instead, the inventors have previously proposed a structure designed to overcome this limitation [45], as depicted in FIG. 1G. In this case, another polyimide layer is spun prior to bottom electrode coating, the central portion of which is etched during the final release process, using the bottom electrode layer as mask, leaving the rest of the polyimide as the support for the bottom electrode. This configuration allows one to bring the bottom electrode closer to the top electrode, hence producing a shorter actuation gap while maintaining the target optical gap. Integrating this structure design into a MEMS filter with fixed-fixed beam actuator and its effectiveness in reducing the actuation voltage have been demonstrated [45], there, 50% reduction was achieved, limited by unexpected electrical breaking-down of the actuator. As indicated in Equation 1, the voltage V required for a certain displacement y is proportional to d−y. Based on this relationship, for filters with the 250-nm structural membrane, while the voltage required to obtain a 2-µm mirror displacement out of a 6-µm gap is measured to be 100 V, the voltage to obtain the same mirror displacement out of a 3-µm gap is predicted to be only 25 V. This suggests that by realizing a 3-µm polyimide underneath the bottom electrode with the proposed approach in filters with thin structural layer, the actuation voltage can be promisingly optimized to less than 30 V.

The LWIR Fabry-Perot tunable filter of the described second embodiment of the invention employs a single-layer tensile Ge membrane as the top mirror 216 and requires no additional stress management to achieve a superior mirror flatness. The measured results indicated that the 200-µm filter featured a continuous tuning range of 8.5-11.44 µm using a maximum actuation voltage of 160 V and exhibited consistent spectral characteristics that closely match the design criteria, that is, peak transmission higher than 80%, approximate FWHM of 500 nm and an out-of-band rejection better than 40:1, optimally fulfilling the optical requirements of LWIR multispectral imaging activities. Larger filters, while initially showing design spectral features, exhibited spectral degradations with actuation due to mirror bowing. Taking account of the mirror bowing effect, a strong agreement was obtained between optical modelling of the tuning spectra and the measured results.

To realize tuning operation using lower voltages, embodiments of the invention exploit the use of larger filter design and thinner structural membrane to reduce the minimum actuation voltage required by a 2-µm travel distance. By integrating a 250-µm rather than a 625-µm structural layer in the filter, a significantly lower control voltage of 100 V was achieved. A method of gap control, which enables the shorter actuation gap while maintaining the certain optical cavity gap, has been described and can be included in conjunction with thin membrane design in embodiments of the invention, showing considerable promise to realize ≤30 V tuning operation.

Prototype models across different semiconductors have been fabricated extending the operational wavelength range from near infrared to LWIR (1 µm to 11.5 µm).

The tunable filter 210A of the second embodiment takes advantage of a single-layer or multilayer tensile-strained membrane as both the structural support and the top mirror, the perimeter of which is anchored on the sacrificial layer below (which is not removed during the release process). Advantages of this construction is that tensile stress inherent in membrane material will tend to apply stretching to the layer, and thereby the whole membrane stays flat, eliminating the need of stress management. Suspension of the upper mirror is realized by diagonally arranged notches.

The role of the notches is to reduce the spring stiffness of the membrane, thereby facilitating the actuation. The use of notches at the four corners of the membrane, in the embodiment, freely actuate the suspended mirror. Since this method eliminates the need to have actuating beams it reduces the number of fabrication steps and time involved.

Furthermore, suspensions formed in accordance with the second embodiment of the invention have an improved chance of recovery from snap down, actuate over a longer distance, and have an increased tuning range compared with the prior art. High, or at least increased, immunity to stress induced deformations is provided in embodiments of the invention.

Application of the actuation method of the second embodiment results in the filter having high, or at least increased, immunity to stress induced deformation of the suspended tuneable mirror (i.e. the top mirror). Furthermore, it results in an ultra-flat tuneable cavity for the filter.

The method allows for the suspension of tunable filters ranging from a size of a few square micrometres in area up to many square millimeters without any internal supporting structures. A suspended membrane with lower mean tensile stress allows this to be achieved.

Furthermore, in embodiments, a filter containing air-spaced mirrors can yield narrow FWHM.

Figure 20:
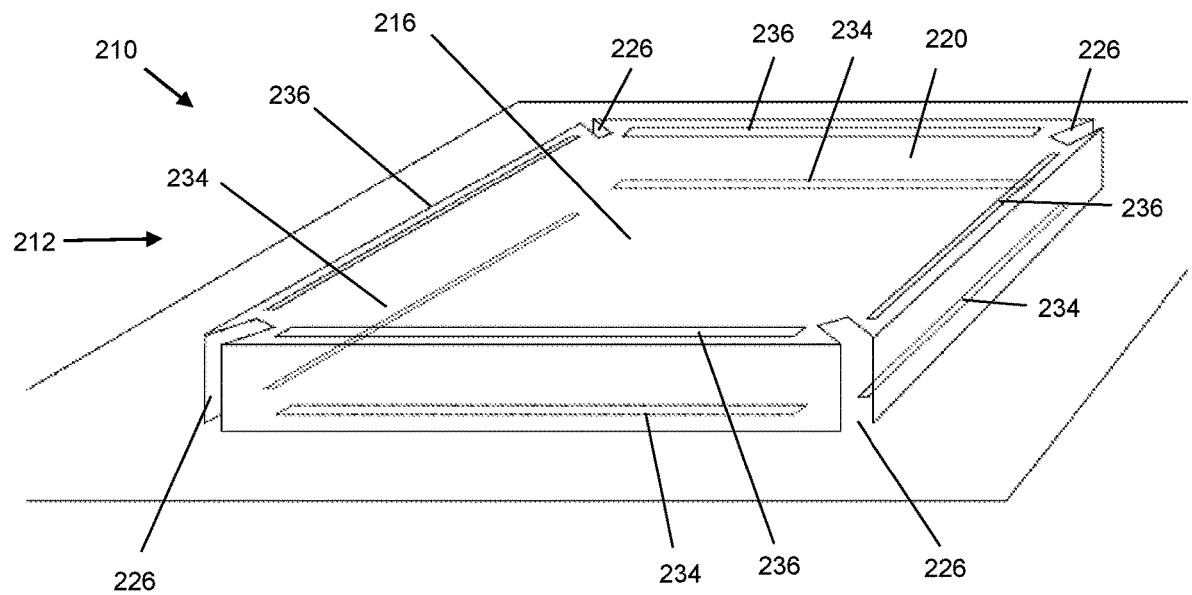
FIG. 20 depicts a schematic view of a filter having an actuator fabricated in accordance with an embodiment of the present invention.

Advantages provided by embodiments of the method include: a resulting structure providing freedom from the effect of out of plane stress; being usable with many kinds of material without changing the structure; being expandable to large area filters without changes of the design; a resulting structure operable to tune for a larger tuning range compared with the prior art; producing flatter mirrors which implies that spectral width of the output can be narrow; usable with solid and air gap based mirrors; simple to fabricate, requiring less number of steps compared with the prior art and providing a saving of time and resources; and better ability to recover from snap down In FIG. 20, there is depicted a third embodiment of a microelectromechanical system, or a part thereof, fabricated using a method in accordance with an aspect of the present invention. The third embodiment is directed toward a modification of the actuator 208 of the second embodiment.

Moving away from the beam and optical active membranes as two separate entities in the prior art, in the third embodiment they are merged into one. As pictured in FIGS. 20, 21A, 21B, 21C, and 21D the actuator 208 of the resulting filter can be viewed as a very wide beam with split electrodes.

Particularly, the four top electrodes 236 in the third embodiment are formed on an upper surface of the membrane 220 of the top mirror 216, a respective one of each of the four top electrodes 236 located inwardly and parallel to a respective one of four sides of the membrane 220.

Furthermore, portions of each corner of the membrane 220 are removed, via etching in the embodiment. These "cut outs" or notches 226 relieve stress build up and allow the mirror region of the membrane to remain flat, particularly during tuning processes (i.e. operation of the actuator). In embodiments of the invention, the membrane may comprise multiple layers of material, or a single layer of material. In embodiments, cut outs are made to all layers of the membrane, but not to any other part of the MEMS structure.

Figure 21A:
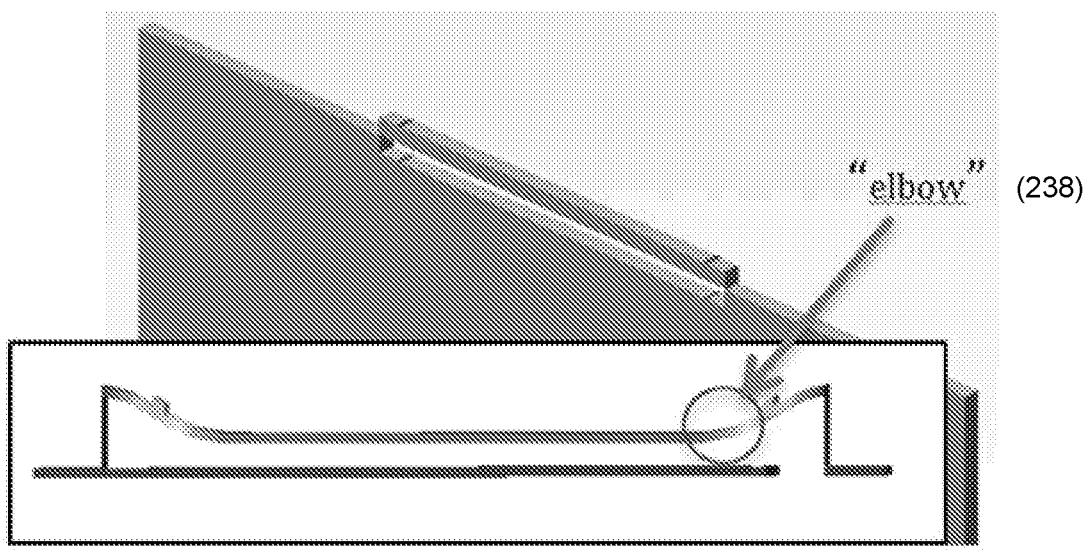
FIG. 21A depicts a cross-sectional view of the filter of FIG. 20, highlighting the doubly supported beam with split electrode style configuration thereof. The inset shows a cross-sectional view of a finite element model simulation of a full filter being actuated.
Figure 21B:
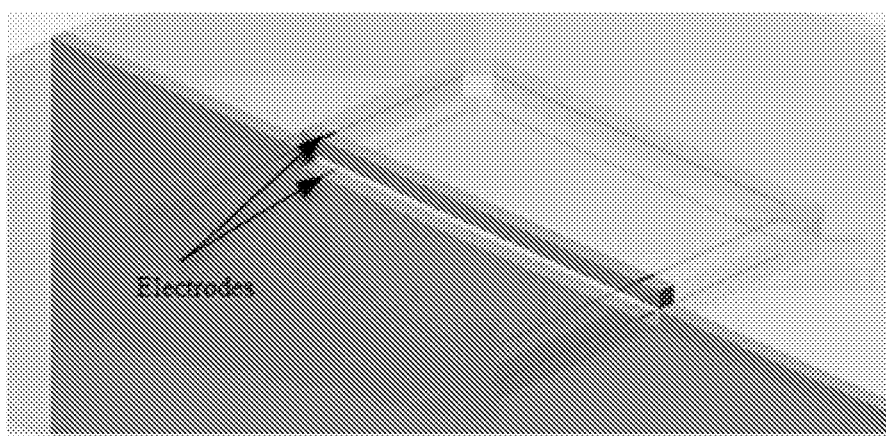
FIGS. 21B, 21C, and 21D show how this is extended to create the filter.
Figure 21C:
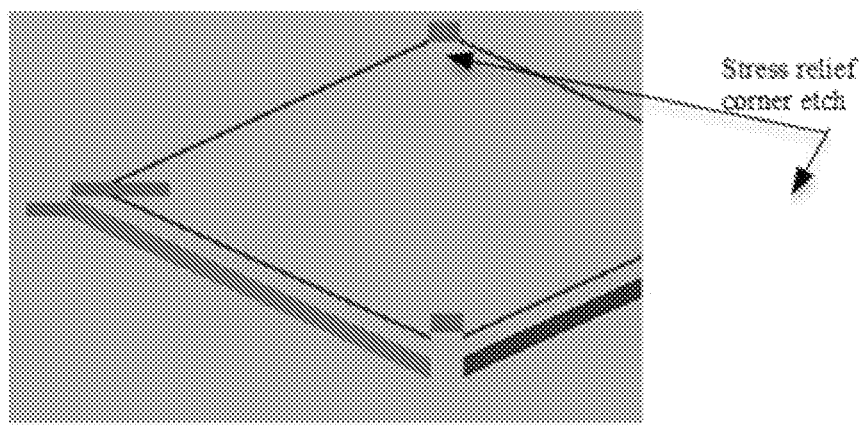
Figure 21D:
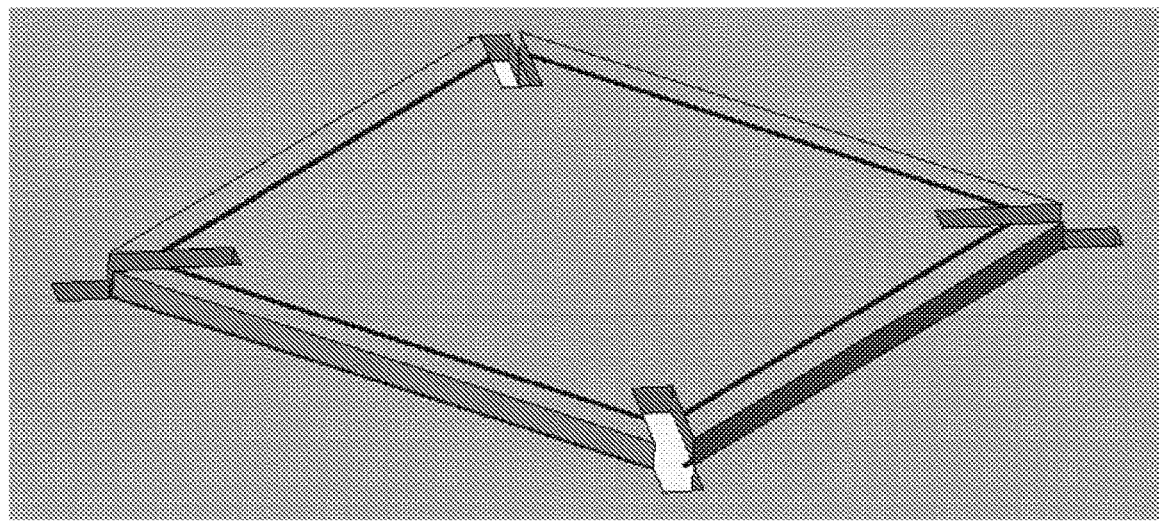

As depicted in FIGS. 21A (inset), 22, 23, and 24, application of a voltage between the top and bottom electrodes, 236 and 234, causes the top electrodes 236 to attract to the bottom electrodes 234 under electrostatic force.

Figures 22, 23:
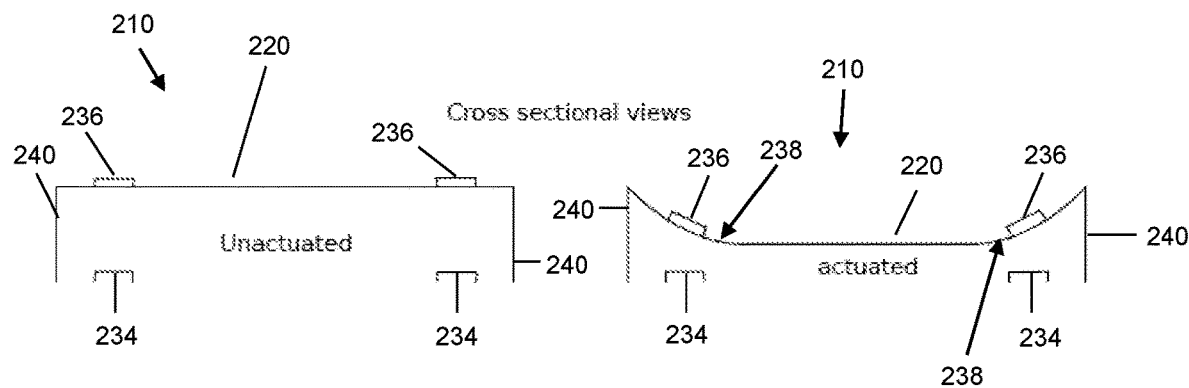
FIG. 22 depicts a cross-sectional view of the filter of FIG. 20 in an unactuated state.
FIG. 23 depicts a cross-sectional view of the filter of FIG. 20 in an actuated state.
Figure 24:
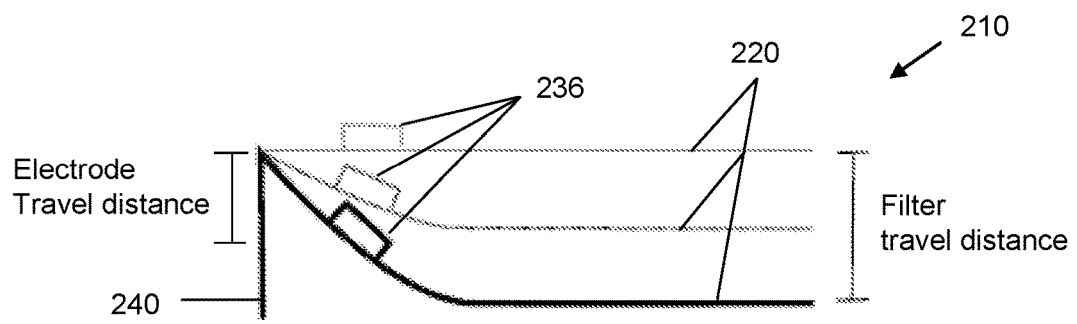
FIG. 24 depicts a cross-sectional view showing electrode travel distance and mirror travel distance during movement between the unactuated state and actuated state.

This attraction results in the membrane 220 being moved from the unactuated position, depicted in FIG. 22, to the actuated position, depicted in FIG. 23. In moving between the unactuated and actuated positions, the top electrodes 236 will move an electrode travel distance, whilst the membrane 220 will move a membrane travel distance (which may also be referred to as a filter travel distance, and a hinge in the form of a bend or "elbow" 238 will form at an interface in the form of a junction between each of the top electrodes 236 and the surface of the membrane 220. It is to be appreciated that, in the embodiment described, the elbow 238 is just a bent section of the membrane 220. That is to say, a bend like an elbow will form, but it is not literally a hinged joint. This movement of the top electrodes 236 and the membrane 220 describes an actuation profile for the embodiment depicted in FIGS. 13A and 14.

The placement of each of the top electrodes 236 is important to achieve the actuation profile pictured in FIG. 21A (inset).

If the electrodes 236 are too close to a sidewall 240 of the cavity 218 (formed by the remaining portion of the sacrificial layer 224), there will be an increase in force and hence voltage requirements to actuate the filter 212. If the top electrodes 236 are placed too far from the sidewall 238, the elbow 238 will occur between the top electrode 236 and the sidewall 238 allowing for snap down to occur without full range of motion in the filter 212.

When each top electrode 236 is properly distanced from the corresponding sidewall 240, 100% travel distance of the filter membrane can be achieved at the lowest possible voltage without electrode snap down occurring. There is a trade off. The further out the electrode 236 from the corresponding sidewall 240, the lower the actuation voltage, balanced against seeking to ensure snap down is not possible, or is mitigated, with an adequate safety margin.

The inventors have found, through fabrication and simulation, that a placement distance of approximately 100 um from sidewall 240 to top electrode 236 works well.

As evident from FIGS. 20, 21A, 21B, 21C, and 21D anchor footing for the membrane 220 can effectively be the size of the entire substrate, reducing delamination from large film stress, and producing a very robust device. This method of actuation does require increased voltages. However, with the addition of release holes patterned along the edge (between the top electrodes 236 and sidewalls 240) the local membrane stiffness is reduced and hence the voltage requirement drops significantly.

The structure of the described third embodiment has many advantages, including the following:
it has an extended tuning range, capable of reaching 100% of the gap without snap down;
the use of upper and lower split electrodes, works to pull the filter region of the device flat, eliminating any peak broadening at large tuning (as evident in FIG. 21A (inset));
moving away from a post and beam design allows the size limits of the device to be extended with much more rigid anchor points; and
structural stability allows for increased tensile stress in films without delamination of anchors, which leads to increased stability across large temperature ranges (i.e. no buckling at cryogenic temperatures).

The herein described, and other, embodiments of a microelectromechanical system, or a part thereof, fabricated using a method in accordance with an aspect of the present invention may be operably combined and/or associated with a detector, such as an infrared detector, to perform optical measurements. The compact design of the MEMS device of embodiments of the invention allows for convenient packaging with the detector as a single unit. This is of particular relevance and advantage in applications where the detector is cooled for optimum performance. Such applications include, for example, LWIR IR detectors that require cryogenic cooling.

Cooled detectors are typically contained in a vacuumsealed case or Dewar and cryogenically cooled. The cooling is necessary for the operation of the semiconductor materials used in the detector. Typical operating temperatures range from 4 K to just below room temperature, depending on the detector technology. Most modern cooled detectors operate in the 60 K to 100 K range, depending on type and performance level.

The single unit may be formed by bonding the MEMS device of embodiments of the invention and the detector together and packing them in an assembly. The assembly may be cooled down to cryo temperatures using a standard cooling method known to persons skilled in the art, such as a Dewar based method, and used for LWIR wavelength range operation. In the LWIR range cooled detectors give the best performance.

It will be appreciated by those skilled in the art that variations and modifications to the invention described herein will be apparent without departing from the spirit and scope thereof. The variations and modifications as would be apparent to persons skilled in the art are deemed to fall within the broad scope and ambit of the invention as herein set forth.

Also, future patent applications may be filed in Australia or overseas on the basis of, or claiming priority from, the present application. It is to be understood that the following provisional claims are provided by way of example only, and are not intended to limit the scope of what may be claimed in any such future application. Features may be added to or omitted from the provisional claims at a later date so as to further define or re-define the invention or inventions.

REFERENCES

[1] P. Hauff. An overview of VIS-NIR-SWIR field spectroscopy as applied to precious metals exploration. Pages 1-71, 2002.
[2] R. Kinoshita, B. N. Moebius-Clune, H. M. van Es, W. Dean Hively, and A. V. Bilgilis. trategies for soil quality assessment using visible and near-infrared reflectance spectroscopy in a western kenya chronosequence. Soil Sci. Soc. Am. J., 76:1776-1788, 2012.

[3] R. A. Crocombe. Miniature optical spectrometers: There's plenty of room at the bottom. Spectroscopy, 23, 2008.

[4] J. M. Dell, A. J. Keating, J. Antoszewski, C. A. Musca, L. Faraone, D. Murphy, and O. Samardzic. Microelectromechancial systems-based microspectrometers covering wavelengths from 1500 nm to 5000 nm. Pages 6765OL-1-6765OL-9. SPIE, 2007.

[5] J. S. Milne, J. M. Dell, A. J. Keating, and L. Faraone. Widely tunable MEMS-based Fabry-P'erot filter. IEEE J. MEMS, 18:905-913, 2009.

[6] A. J. Keating, J. Antoszewski, K. K. M. B. D. Silva, K. J. Winchester, T. Nguyen, J. M. Dell, C. A. Musca, L. Faraone, P. Mitra, J. D. Beck, M. R. Skokan, and J. E. Robinson. Design and characterization of Fabry-P'erot MEMS-based shortwave infrared microspectrometers. IEEE J. Electron. Mat, 37(12):1811-1820, 2008.

[7] M. Maheswaran, M. Nambirajan, Uppari Chaitanya Cha Yadav, and Har Narayan Upadhyay. Analysis of pullin behavior of electrostatic MEMS actuators for optical switching applications. Journal of Applied Sciences, 12(16):1730-1733, December 2012.

[8] B. Saadany, M. Malak, F. Marty, Y. Mita, D. Khalil, and T. Bourouina. Electrostatically-tuned optical filter based on silicon bragg reflectors. pages 1811-1820. IEEE, 2006.

[9] M. Ebermann, K. Hiller, S. Kurth, and N. Neumann. Design, operation and performance of a Fabry-p'erot based mwir microspectrometer. IEEE, 2006.

[10] E. D. Palik, editor. Handbook of optical constants of solids. Academic Press, 1998.

[11] Germanium: Band structure and carrier concentration. http://www.ioffe.ru/SVA/NSM/Semicond/Ge/bandstr.html.

[12] Silicon: Band structure and carrier concentration. http://www.ioffe.rssi.ru/SVA/NSM/Semicond/Si/bandstr.html.

[13] C. Hamaguchi. Energy band structures of semiconductors. In Basic Semiconductor Physics, pages 1-27. Springer Berlin Heidelberg, January 2010.

[14] Madhumita Datta, Marcel W. Pruessner, Daniel P. Kelly, and Reza Ghodssi. Design of MEMS-tunable novel monolithic optical filters in inp with horizontal bragg mirrors. Solid-State Electronics, 48(10-11):1959-1963, 2004.

[15] A. Spisser, R. Ledantec, C. Seassal, J. L. Leclercq, T. Benyattou, D. Rondi, R. Blondeau, G. Guillot, and P. Viktorovitch. Highly selective and widely tunable 1.55-#x03bc;m InP/air-gap micromachined fabry-perot filter for optical communications. IEEE Photonics Technology Letters, 10(9):1259-1261, September 1998.

[16] J. Daleiden, N. Chitica, M. Strassner, A. Spisser, J-L Leclercq, P. Viktorovitch, D. Rondi, E. Goutin, J. Peerlings, J. Pfeiffer, R. Riemenschneider, and K. Hjort. Tunable InP/air gap fabry perot filter for wavelength division multiplex fiber optical transmission. In 1999 Eleventh International Conference on Indium Phosphide and Related Materials, 1999. IPRM, pages 285-287, 1999.

[17] T. Kusserow, S. Ferwana, T. Nakamura, T. Hayakawa, N. Dharmarasu, B. Vengatesan, and H. Hillmer. Micromachining of InP/InGaAs multiple membrane/airgap structures for tunable optical devices. In Proc. SPIE 6993, MEMS, MOEMS, and Micromachining III, volume 6993, pages 69930B-69930B-11. SPIE, 2008.

[18] F. Riemenschneider, M. Aziz, H. Halbritter, I. Sagnes, and P. Meissner. Low-cost electrothermally tunable optical microcavities based on GaAs. IEEE Photonics Technology Letters, 14(11):1566-1568, November 2002.

[19] S. Irmer, K. Alex, J. Daleiden, I. Kommallein, M. Oliveira, F. Rmer, A. Tarraf, and H. Hillmer. Surface micromachined optical low-cost all-air-gap filters based on stress-optimized Si3N4 layers. Journal of Micromechanics and Microengineering, 15(4):867, April 2005.

[20] A. Lipson and E. M. Yeatman. A 1-d photonic band gap tunable optical filter in (110) silicon. Journal of Microelectromechanical Systems, 16(3):521-527, June 2007.

[21] P. J. French and P. M. Sarro. Surface versus bulk micromachining: the contest for suitable applications. Journal of Micromechanics and Microengineering, 8(2): 45, June 1998.

[22] M Tuohiniemi and M Blomberg. Surface-micromachined silicon air-gap bragg reflector for thermal infrared. Journal of Micromechanics and Microengineering, 21(7): 075014, July 2011.

[23] M. Tuohiniemi, M. Blomberg, A. Akujrvi, J. Antila, and H. Saari. Optical transmission performance of a surface-micromachined FabryProt interferometer for thermal infrared. Journal of Micromechanics and Microengineering, 22(11):115004, November 2012.

[24] S. Bosch, J. Ferre-Borrull, and J. Sancho-Parramon. A general-purpose software for optical characterization of thin films: specific features for microelectronic applications. Solid-State Electronics, 45:703-709, 2001.

[25] H. Guckel, D. Burnst, C. Rutigliano, E. Lovell, and B. Choi. Diagnostic microstructures for the measurement of intrinsic strain in thin films. J. Micromech. and Microeng., 2:86-95, 1992.

[26] X. Feng, Y. Huang, and A. J. Rosakis. On the stoney formula for a thin film/substrate system with non-uniform substrate thickness. J. Appl. Mech., 74:1276-81, 2007.

[27] H. Guckel, D. Burns, C. Rutigliano, E. Lovell, and B. Choi. Diagnostic microstructures for the measurement of intrinsic strain in thin films. Journal of Micromechanics and Microengineering, 2(2):86, June 1992.

[28] M. Martyniuk, J. Antoszewski, C. A. Musca, J. M. Dell, and L. Faraone. Stress in low-temperature plasma enhanced chemical vapour deposited silicon nitride thin film. Smart Materials and Structures, 15:529-538, 2006.

[29] H. Guckel, D. W. Burns, C. C. G. Visser, H. A. C. Tilmans, and D. Deroo. Fine-grained polysilicon films with built-in tensile strain. IEEE Transactions on Electron Devices, 35(6):800-801, June 1988.

[30] H. A. Macleod. Thin-Film Optical Filters. McGraw-Hill, 1989.

[31] A. C. Goldberg, K.-K. Choi, M. Jhabvala, A. La, P. N. Uppal, and M. L. Winn, "Large-format and multispectral qwip infrared focal plane arrays," pp. 83-94, 2003.

[32] L. Zhang and G. W. Small, "Automated detection of chemical vapors by pattern recognition analysis of passive multispectral infrared remote sensing imaging data," Appl. Spectrosc., vol. 56, no. 8, pp. 1082-1093, August 2002. [Online]. Available: http://as.osa.org/abstract.cfm?URI=as-56-8-1082

[33] S. Teggi, M. P. Bogliolo, M. F. Buongiorno, S. Pugnaghi, and A. Sterni, "Evaluation of so2 emission from mount etna using diurnal and nocturnal multispectral ir and visible imaging spectrometer thermal ir remote sensing images and radiative transfer models," Journal of Geophysical Research: Solid Earth, vol. 104, no. B9, pp. 20 069-20 079, 1999. [Online]. Available: http://dx-.doi.org/10.1029/1999JB900099

[34] M. J. Wabomba, Y. Sulub, and G. W. Small, "Remote detection of volatile organic compounds by passive multispectral infrared imaging measurements," Appl. Spectrosc., vol. 61, no. 4, pp. 349-358, April 2007. [Online]. Available: http://as.osa.org/abstract.cfm?URI=as-61-4-349

[35] A. B. Kahle and A. F. H. Goetz, "Mineralogic information from a new airborne thermal infrared multispectral scanner," Science, vol. 222, no. 4619, pp. 24-27, 1983. [Online]. Available: http://www.sciencemag.org/content/222/4619/24.abstract

[36] R. G. Vaughan, S. J. Hook, W. M. Calvin, and J. V. Taranik, "Surface mineral mapping at steamboat springs, nevada, usa, with multi-wavelength thermal infrared images," Remote Sensing of Environment, vol. 99, no. 12, pp. 140-158, 2005, scientific Results from fASTERg. [Online]. Available: http://www.sciencedirect.com/science/article/pii/S0034425705001720

[37] W. Clodius, C. Borel, L. Balick, and S. Hook, "Validation of the mti water surface temperature retrieval algorithms," in Geoscience and Remote Sensing Symposium, 2002. IGARSS '02. 2002 IEEE International, vol. 1, 2002, pp. 30-32 vol. 1.

[38] A. Rodger, L. K. Balick, and W. Clodius, "The performance of the multispectral thermal imager (mti) surface temperature retrieval algorithm at three sites," Geoscience and Remote Sensing, IEEE Transactions on, vol. 43, no. 3, pp. 658-665, March 2005.

[39] J. M. Vaughan, The Fabry-Perot Interferometer. Bristol: Hilger, 1989.

[40] S. H. K. H. M. M. S. K. E. G. M. Ebermann, N. Neumann, "Tiny mid and long-wave infrared spectrometer module with a mems dual-band fabry-perot filter," in Sensor+Test Conference, 2011. Proceedings IRS, June 2011, pp. 94-99.

[41] M. Meinig, M. Ebermann, N. Neumann, S. Kurth, K. Hiller, and T. Gessner, "Dual-band mems fabry-perot filter with two movable reflectors for mid- and long-wave infrared microspectrometers," in Solid-State Sensors, Actuators and Microsystems Conference (TRANSDUCERS), 2011 16th International, June 2011, pp. 2538-2541.

[42] P. Stupar, R. Borwick, J. DeNatale, P. Kobrin, and W. J. Gunning, "Mems tunable fabry-perot filters with thick, two sided optical coatings," in Solid-State Sensors, Actuators and Microsystems Conference, 2009. TRANSDUCERS 2009. International, June 2009, pp. 1357-1360.

[43] G. J. Sloggett, "Fringe broadening in fabry-perot interferometers," Appl. Opt., vol. 23, no. 14, pp. 2427-2432, July 1984. [Online]. Available: http://ao.osa.org/abstract.cfm?URI=ao-23-14-2427

[44] Y. Wang, B. Potter, M. Sutton, R. Supino, and J. Talghader, "Step-wise tunable microbolometer long-wavelength infrared filter," in Solid-State Sensors, Actuators and Microsystems, 2005. Digest of Technical Papers. TRANSDUCERS '05. The 13th International Conference on, vol. 1, June 2005, pp. 1006-1009 Vol. 1.

[45] M. M. J. A. J. B. L. F. H. Mao, K. K. M. B. D. Silva. (2014, July) Towards longwave infrared tuneable filters for multispectral thermal imaging applications. presented at the 12th international conference on quantitative infrared thermography.

[46] M. M. J. A. J. B. Haifeng Mao, K. K. M. B. Dilusha Silva and L. Faraone, "Micromachined longwave infrared fabry-perot filters fabricated from thermally-evaporated germanium and zinc sulphide."

[47] H. Macleod, Thin-film optical filters. New York:Graw-Hill, 1989.

[48] E. Garmire, "Theory of quarter-wave-stack dielectric mirrors used in a thin fabry-perot filter," Appl. Opt., vol. 42, no. 27, pp. 5442-5449, September 2003. [Online]. Available: http://ao.osa.org/abstract.cfm?URI=ao-42-27-5442

[49] W. Lau, Infrared characterization for microelectronics, 1999.

[50] H. Mao, A. Keating, J. Antoszewski, M. Martyniuk, J. Dell, and L. Faraone, Eds., Preliminary investigation on MEMS-based cooled long-wave infrared Fabry-Perot filters for multi-spectral imaging, vol. 1.

[51] C. Roychoudhuri and M. Hercher, "Stable multipass fabryperot interferometer: design and analysis," Appl. Opt., vol. 16, no. 9, pp. 2514-2520, September 1977. [Online]. Available: http://ao.osa.org/abstract.cfm?URI=ao-16-9-2514

[52] A. Keating, J. Antoszewski, K. Silva, K. Winchester, T. Nguyen, J. Dell, C. Musca, L. Faraone, P. Mitra, J. Beck, M. Skokan, and J. Robinson, "Design and characterization of fabryprot memsbased short-wave infrared microspectrometers," Journal of Electronic Materials, vol. 37, no. 12, pp. 1811-1820, 2008. [Online]. Available: http://dx.doi.org/10.1007/s 11664-008-0526-0

The invention claimed is:

1. A method of fabricating a distributed Bragg reflector, the reflector being at least partially reflective and at least partially transmissive for at least a wavelength of electromagnetic radiation; the method comprising:

forming a first layer of a first material or material composition defining a bottom layer;

forming a sacrificial layer on the bottom layer;

forming a second layer of a second material or material composition defining a top layer on the sacrificial layer and a supporting structure connected to the bottom layer, the top layer comprising a membrane and an optical area of the same second material or material composition; and removing at least part of the sacrificial layer to form a cavity between the bottom layer and the top layer such that the supporting structure supports the top layer relative to the bottom layer and no further supporting structure is provided within the cavity, wherein after the at least part of the sacrificial layer is removed, at least the top layer comprising the membrane and the optical area has residual tensile stress, wherein the bottom and top layers of material, and the cavity, are a quarter of said wavelength in optical thickness.

2. The method of claim 1, comprising changing a mechanical property of at least part of the defined top layer, wherein changing the mechanical property comprises annealing at least part of the defined top layer, without crystallizing the second material or material composition, such that compressive stress of the top layer is converted to residual tensile stress.

3. The method of claim 2, wherein changing the mechanical property of the at least part of the top layer is conducted before removing the at least part of the sacrificial layer.

4. The method of claim 1, wherein forming the second layer comprises depositing the second material or material composition on the sacrificial layer such that the top layer has residual tensile stress.

5. The method of claim 1, comprising perforating the first layer and/or the second layer to form at least one perforation such that the sacrificial layer can be removed via an etching process.

6. The method of claim 5, comprises forming a shield layer of material to be located in an optical path defined by the at least one perforation.

7. The method of claim 1, wherein the defined cavity is an air cavity.

8. The method of claim 1, comprising forming one or more further sacrificial layers and one or more further layers to fabricate a reflector with a greater number of periods.

9. A distributed Bragg reflector, the reflector being at least partially reflective and at least partially transmissive for at least a wavelength of electromagnetic radiation, the reflector comprising:
- a first layer of a first material or material composition defining a bottom layer;
- a second layer of a second material or material composition defining a top layer and a supporting structure, the top layer comprising a membrane and an optical area of the same second material or material composition, and the second layer being arranged to define a cavity between the top layer and the bottom layer,
- wherein at least the top layer has residual tensile stress, and the reflector is arranged such that the support structure supports the top layer relative to the bottom layer and no further supporting structure is provided within the defined cavity, and
- wherein the bottom and top layers of material, and the cavity, are a quarter of said wavelength in optical thickness.

10. The method of claim 1, wherein the tensile stress of the top layer is below 200 MPa.

11. The method of claim 1, wherein the method is conducted such that the defined cavity provides a substantially uniform distance between the top layer and the bottom layer.

12. The method of claim 1, wherein the first and second material layers comprise the same material or material composition.

13. The method of claim 1, wherein the first material layer and/or the second material layer comprises amorphous or polycrystalline silicon.

14. The method of claim 1, wherein the first material layer and/or the second material layer comprises germanium.

* * * * *